US008187791B2

(12) United States Patent
Sonokawa et al.

(10) Patent No.: US 8,187,791 B2
(45) Date of Patent: May 29, 2012

(54) LITHOGRAPHIC PRINTING PLATE PRECURSOR AND PLATE MAKING METHOD THEREOF

(75) Inventors: Koji Sonokawa, Shizuoka (JP); Takanori Mori, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 267 days.

(21) Appl. No.: 12/563,564

(22) Filed: Sep. 21, 2009

(65) Prior Publication Data

US 2010/0075252 A1 Mar. 25, 2010

(30) Foreign Application Priority Data

Sep. 22, 2008 (JP) ................................ P2008-243378

(51) Int. Cl.
*G03F 7/029* (2006.01)
*B41C 1/055* (2006.01)

(52) U.S. Cl. ...................... 430/280.1; 430/302; 430/944

(58) Field of Classification Search ........................ None
See application file for complete search history.

(56) References Cited

U.S. PATENT DOCUMENTS

| | | | | |
|---|---|---|---|---|
| 6,030,750 | A | 2/2000 | Vermeersch et al. | |
| 7,172,851 | B2 * | 2/2007 | Hirabayashi et al. | 430/280.1 |
| 2001/0018159 | A1 | 8/2001 | Maemoto | |
| 2002/0177074 | A1 | 11/2002 | Hoshi et al. | |
| 2003/0143488 | A1 * | 7/2003 | Teng | 430/303 |
| 2005/0266349 | A1 * | 12/2005 | Van Damme et al. | 430/300 |

FOREIGN PATENT DOCUMENTS

| | | | |
|---|---|---|---|
| EP | 0 897 795 | A1 | 2/1999 |
| JP | 2938397 | B2 | 8/1999 |
| JP | 2001-277740 | A | 10/2001 |
| JP | 2001-277742 | A | 10/2001 |
| JP | 2002-287334 | A | 10/2002 |
| JP | 2005-351979 | | 12/2005 |

OTHER PUBLICATIONS

RN 82428-3, one page 0-6, Cylcomer M 100, CN, Registry file , ACS on STN printed out Aug. 7, 2011.*

* cited by examiner

*Primary Examiner* — Cynthia Hamilton
(74) *Attorney, Agent, or Firm* — Birch, Stewart, Kolasch & Birch, LLP

(57) ABSTRACT

A lithographic printing plate precursor includes: a support; and an image-recording layer containing (A) an infrared absorbing agent, (B) a radical polymerization initiator, (C) a polymerizable compound and (D) an epoxy compound having a molecular weight of 1,000 or less.

5 Claims, No Drawings

LITHOGRAPHIC PRINTING PLATE PRECURSOR AND PLATE MAKING METHOD THEREOF

FIELD OF THE INVENTION

The present invention relates to a lithographic printing plate precursor and a plate making method thereof. More particularly, it relates to a lithographic printing plate precursor capable of being subjected to image recording with laser and capable of being subjected to on-press development, and a plate making method thereof.

BACKGROUND OF THE INVENTION

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) has heretofore been broadly used. Ordinarily, the lithographic printing plate is obtained by conducting plate making according to a method of exposing the lithographic printing plate precursor through an original, for example, a lith film, and then while leaving the image-recording layer corresponding to the image area, removing the unnecessary image-recording layer corresponding to the non-image area by dissolving with an alkaline developer or a developer containing an organic solvent thereby revealing the hydrophilic surface of support.

In the hitherto known plate making process of lithographic printing plate precursor, after exposure, the step of removing the unnecessary image-recording layer by dissolving, for example, with a developer is required. However, it is one of the subjects to save or simplify such an additional wet treatment described above. Particularly, since disposal of liquid wastes discharged accompanying the wet treatment has become a great concern throughout the field of industry in view of the consideration for global environment in recent years, the demand for the solution of the above-described subject has been increased more and more.

As one of simple plate making methods in response to the above-described requirement, a method referred to as on-press development has been proposed wherein a lithographic printing plate precursor having an image-recording layer capable of being removed in its unnecessary areas during a conventional printing process is used and after exposure, the unnecessary area of the image-recording layer is removed on a printing machine to prepare a lithographic printing plate.

Specific methods of the on-press development include, for example, a method of using a lithographic printing plate precursor having an image-recording layer that can be dissolved or dispersed in dampening water, an ink solvent or an emulsion of dampening water and ink, a method of mechanically removing an image-recording layer by contact with rollers or a blanket cylinder of a printing machine, and a method of lowering cohesion of an image-recording layer or adhesion between an image-recording layer and a support upon penetration of dampening water, ink solvent or the like and then mechanically removing the image-recording layer by contact with rollers or a blanket cylinder of a printing machine.

In the specification, unless otherwise indicated particularly, the term "development processing step" means a step of using an apparatus (ordinarily, an automatic developing machine) other than a printing machine and removing an unexposed area in an image-recording layer of a lithographic printing plate precursor upon contact with liquid (ordinarily, an alkaline developer) thereby revealing a hydrophilic surface of support. The term "on-press development" means a method or a step of removing an unexposed area in an image-recording layer of a lithographic printing plate precursor upon contact with liquid (ordinarily, printing ink and/or dampening water) by using a printing machine thereby revealing a hydrophilic surface of support.

On the other hand, digitalized technique of electronically processing, accumulating and outputting image information using a computer has been popularized in recent years, and various new image-outputting systems responding to the digitalized technique have been put into practical use. Correspondingly, attention has been drawn to a computer-to-plate technique of carrying digitalized image information on highly converging radiation, for example, a laser beam and conducting scanning exposure of a lithographic printing plate precursor with the radiation thereby directly preparing a lithographic printing plate without using a lith film. Thus, it is one of the important technical subjects to obtain a lithographic printing plate precursor adaptable to the technique described above.

In the simplification of plate making operation as described above, a system using an image-recording layer capable of being handled in a bright room or under a yellow lump and a light source is preferable from the standpoint of workability.

As such a laser light source, a semiconductor laser emitting an infrared ray having a wavelength of 760 to 1,200 and a solid laser, for example, YAG laser, are extremely useful because these lasers having a large output and a small size are inexpensively available. An UV laser can also be used.

As the lithographic printing plate precursor of on-press development type capable of conducting image-recording with an infrared laser, for example, a lithographic printing plate precursor having provided on a hydrophilic support, an image-forming layer (image-recording layer) in which hydrophobic thermoplastic polymer particles are dispersed in a hydrophilic binder is described in Japanese Patent 2,938,397. It is described in Japanese Patent 2,938,397 that the lithographic printing plate precursor is exposed to an infrared laser to agglomerate the hydrophobic thermoplastic polymer particles by heat thereby forming an image and mounted on a plate cylinder of a printing machine to be able to carry out on-press development by supplying dampening water and/or ink.

Although the method of forming image by the agglomeration of fine particles only upon thermal fusion shows good on-press development property, it has a problem in that the image strength is extremely weak and printing durability is insufficient.

Further, a lithographic printing plate precursor having provided on a hydrophilic support, microcapsules containing a polymerizable compound encapsulated therein is described in JP-A-2001-277740 (the term "JP-A" as used herein means an "unexamined published Japanese patent application") and JP-A-2001-277742.

Moreover, a lithographic printing plate precursor having provided on a support, an image-recording layer containing an infrared absorbing agent, a radical polymerization initiator and a polymerizable compound is described in JP-A-2002-287334.

The methods using the polymerization reaction as described above have the feature that since the chemical bond density in the image area is high, the image strength is relatively good in comparison with the image area formed by the thermal fusion of fine polymer particles. However, there is a problem of degradation of on-press development property due to lapse of time in which the on-press development property decreases and becomes insufficient with the lapse of time during preservation of the lithographic printing plate precursor after the production thereof until the plate making thereof.

SUMMARY OF THE INVENTION

Therefore, an object of the present invention is to provide a lithographic printing plate precursor which exhibits sufficient printing durability and has good on-press development property even when preserved after the production thereof. Another object of the invention is to provide a plate making method of the lithographic printing plate precursor.

As a result of the intensive investigations, the inventor has found that the above-described objects can be achieved by the measures described below. The invention includes the following items.

(1) A lithographic printing plate precursor comprising a support and an image-recording layer containing (A) an infrared absorbing agent, (B) a radical polymerization initiator, (C) a polymerizable compound and (D) an epoxy compound having a molecular weight of 1,000 or less.

(2) The lithographic printing plate precursor as described in (1) above, wherein the epoxy compound having a molecular weight of 1,000 or less (D) contains an isocyanuric acid skeleton.

(3) The lithographic printing plate precursor as described in (1) or (2) above, wherein the radical polymerization initiator (B) is a sulfonium salt or an iodonium salt.

(4) The lithographic printing plate precursor as described in any one of (1) to (3) above, wherein the image-recording layer further contains (E) a binder polymer having an acid value of 0.3 meq/g or less.

(5) The lithographic printing plate precursor as described in any one of (1) to (4) above, wherein the image-recording layer further contains a microcapsule or a microgel.

(6) The lithographic printing plate precursor as described in any one of (1) to (5) above, wherein the image-recording layer is capable of being removed in an unexposed area by supplying printing ink and dampening water (fountain solution).

(7) A plate making method of a lithographic printing plate precursor comprising a step of exposing imagewise the lithographic printing plate precursor as described in any one of (1) to (6) above and a step of removing an unexposed area of the image-recording layer of the lithographic printing plate precursor by supplying printing ink and dampening water to the exposed lithographic printing plate precursor on a printing machine to initiate printing without subjecting the exposed lithographic printing plate precursor to development processing.

According to the invention, a lithographic printing plate precursor which exhibits sufficient printing durability and has good on-press development property even when it is used for plate making after the lapse of time from the production thereof can be obtained by incorporating an epoxy compound having a molecular weight of 1,000 or less into an image-recording layer utilizing radical polymerization.

Although the function mechanism according to the invention is not quite clear, it is presumed as follows.

As described above, though the problem of insufficient printing durability in the lithographic printing plate precursor of on-press development type utilizing the thermal fusion for the formation of image can be improved by using a radical polymerization type image-recording layer, the problem still remains in that the on-press development property deteriorates with the lapse of time when the lithographic printing plate precursor is preserved after the production.

The degradation of on-press development property due to lapse of time after the production of lithographic printing plate precursor is believed to be caused by a phenomenon where during the preservation of lithographic printing plate precursor, polymerization slightly proceeds due to gradual decomposition of the radical polymerization initiator to reduce dampening water permeability necessary for on-press development or a phenomenon where a low-molecular weight hydrophilic compound for imparting the on-press development property incorporated into the image-recording layer migrates in other layers or an interleaf inserted between the lithographic printing plate precursors when they are stacked to render the image-recording layer hydrophobic, thereby reducing dampening water permeability necessary for on-press development.

Due to the addition of an epoxy compound having a molecular weight of 1,000 or less to the radical polymerization type image-recording layer, which is the feature of the invention, during the preservation of lithographic printing plate precursor, the epoxy group gradually undergoes ring-opening to generate a hydroxy group, whereby the hydrophilicity of image-recording layer is gradually increased or the hydrophilicity is well kept while compensating the hydrophobilization of image-recording layer due to the gradual migration of low-molecular weight hydrophilic compound. Thus, decrease in the dampening water permeability at the on-press development is restrained and the degradation of on-press development property can be prevented.

According to the present invention, a lithographic printing plate precursor which exhibits sufficient printing durability and has good on-press development property even when preserved after the production thereof and a plate making method of the lithographic printing plate precursor can be provided.

DETAILED DESCRIPTION OF THE INVENTION

[Lithographic Printing Plate Precursor]

The lithographic printing plate precursor according to the invention comprising a support and an image-recording layer containing (A) an infrared absorbing agent, (B) a radical polymerization initiator and (C) a polymerizable compound, wherein the image-recording layer further contains (D) an epoxy compound having a molecular weight of 1,000 or less. It is preferred that the lithographic printing plate precursor according to the invention is capable of undergoing on-press development by supplying at least any one of printing ink and dampening water.

(Image-Recording Layer)

First, the constituting components of the image-recording layer, which is the feature of the invention, are described in detail below.

The image-recording layer for use in the invention contains (A) an infrared absorbing agent (B) a radical polymerization initiator, (C) a polymerizable compound and (D) an epoxy compound having a molecular weight of 1,000 or less and the unexposed area of which can be preferably removed with at least any of printing ink and dampening water.

Now, the epoxy compound having a molecular weight of 1,000 or less (D), which is the feature of the invention, is described below.

<(D) Epoxy Compound Having Molecular Weight of 1,000 or Less>

The epoxy compound having a molecular weight of 1,000 or less (hereinafter, also referred to as a low molecular weight epoxy compound) which can be used in the invention is any epoxy compound having an epoxy group and a molecular weight of 1,000 or less. Since the epoxy compound has a molecular weight of 1,000 or less, the effect of preventing the degradation of on-press development property due to the lapse of time becomes large. The molecular weight thereof is preferably 750 or less, and more preferably 500 or less.

The term "epoxy group" as used herein means a group containing a cyclic structure formed by directly connecting one oxygen atom to two carbon atoms in its molecule. The ring is preferably a saturated ring. The ring is also preferably a 3-membered ring.

The epoxy group is preferably represented by the following formula (1):

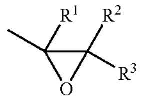

(1)

In formula (1), $R^1$, $R^2$ and $R^3$ each independently represents a hydrogen atom, an aliphatic group or an aromatic group.

The aliphatic group includes an alkyl group, an alkenyl group and an alkynyl group. A number of carbon atoms included in the aliphatic group is preferably from 1 to 20. The aliphatic group may have a branched structure or a cyclic structure. The aliphatic group may have a substituent. Examples of the substituent include a halogen atom (for example, F, Cl, Br or I), a nitro group, a cyano group, a hydroxy group, a carboxyl group, a carbamoyl group, a sulfamoyl group, an aromatic group, —O—R, —CO—O—R, —CO—NH—R, —CO—N(—R)$_2$, —NH—CO—R, —SO—R, —SO$_2$—R, —SO$_2$—NH—R and —SO$_2$—N(R)$_2$, wherein R represents an aliphatic group or an aromatic group.

The aromatic group includes an aromatic hydrocarbon group and an aromatic heterocyclic group. The aromatic hydrocarbon group is preferably a phenyl group or a naphthyl group. The aromatic heterocyclic group preferably has a 5-membered ring, a 6-membered ring or a condensed ring thereof. The hetero atom of the hetero ring is preferably a nitrogen atom, an oxygen atom or a sulfur atom. The aromatic group may have a substituent. Examples of the substituent include a halogen atom (for example, F, Cl, Br or I), a nitro group, a cyano group, a hydroxy group, a carboxyl group, a carbamoyl group, a sulfamoyl group, an aliphatic group, an aromatic group, —O—R, —CO—O—R, —CO—NH—R, —CO—N(—R)$_2$, —NH—CO—R, —SO—R, —SO$_2$—R, —SO$_2$—NH—R and —SO$_2$—N(R)$_2$, wherein R represents an aliphatic group or an aromatic group.

In formula (1), $R^1$ and $R^2$ or $R^2$ and $R^3$ may be combined with each other to form a ring.

It is particularly preferred that $R^1$, $R^2$ and $R^3$ in formula (1) each represents a hydrogen atom. In other wards, the epoxy group is particularly preferably a 1,2-epoxyethyl group.

The low molecular weight epoxy compound according to the invention preferably has two or more epoxy group.

Specific examples of the low molecular weight epoxy compound according to the invention include propylene glycol monoglycidyl ether, propylene glycol diglycidyl ether, tripropylene glycol monoglycidyl ether, tripropylene glycol diglycidyl ether, polypropylene glycol monoglycidyl ether, polypropylene glycol diglycidyl ether, neopentylene glycol diglycidyl ether, trimethylolpropane triglycidyl ether, hydrogenated bisphenol A diglycidyl ether, hydroquinone diglycidyl ether, resorcinol diglycidyl ether, diglycidyl ether or epichlorohydrin polyadduct of bisphenol A, diglycidyl ether or epichlorohydrin polyadduct of bisphenol F, diglycidyl ether or epichlorohydrin polyadduct of halogenated bisphenol A and diglycidyl ether or epichlorohydrin polyadduct of biphenyl type bisphenol.

Also, bis(2,3-epoxypropyl)methylpropylammonium p-toluenesulfonate, 1,4-bis(2',3'-epoxypropyloxy)butane, a sorbitol polyglycidyl ether, a polyglycerol polyglycidyl ether, a pentaerythritol polyglycidyl ether, a diglycerol polyglycidyl ether, a glycerol polyglycidyl ether and trimethylolpropane polyglycidyl ether are exemplified.

Commercially available products of the epoxy compound include, for example, Denacol (trade mark) series epoxy compounds produced by Nagase ChemteX Corp. and jER1001 (molecular weight: about 900; epoxy equivalent: 450 to 500) produced by Japan Epoxy Resins Co., Ltd.

According to the invention, the epoxy compound having a molecular weight of 1,000 or less (D) particularly preferably contains an isocyanuric acid skeleton. The epoxy compound containing an isocyanuric acid skeleton preferably includes compounds represented by formula (2) shown below.

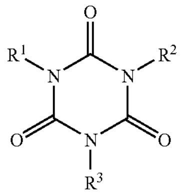

(2)

In formula (2), at least one of $R^1$ to $R^3$ represents a group containing an epoxy group, and the remainder of $R^1$ to $R^3$ which dose not contain an epoxy group represents a hydrogen atom, an alkyl group or alkenyl group having from 1 to 10 carbon atoms which may have a substituent.

The group containing an epoxy group is preferably a hydrocarbon group having from 1 to 10 carbon atoms, more preferably a hydrocarbon group having from 1 to 6 carbon atoms, and may contain a connecting group selected from —CH$_2$—, —O—, —NH—, —CO— and combinations thereof between the epoxy group and the hydrocarbon group.

The group containing no epoxy group for $R^1$ to $R^3$ is preferably an alkyl group which may have a substituent.

Examples of the substituent include a halogen atom, a hydroxy group and an amino group and among them, a hydroxy group is most preferable because of a large effect of preventing the degradation of on-press development property.

Specific examples of the epoxy compound having a molecular weight of 1,000 or less and including an isocyanuric acid skeleton (D) are set forth below, but the invention should not be construed as being limited thereto.

(D-1)

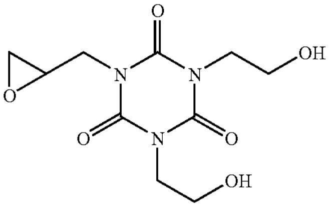

(D-2)

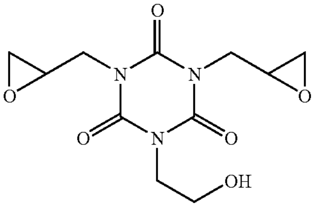

(D-3)

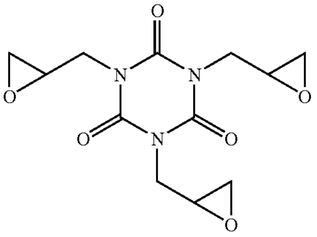

(D-4)

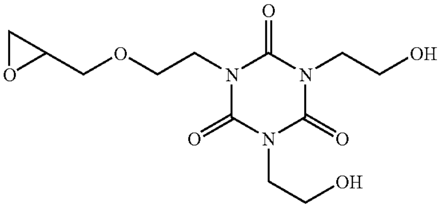

(D-5)

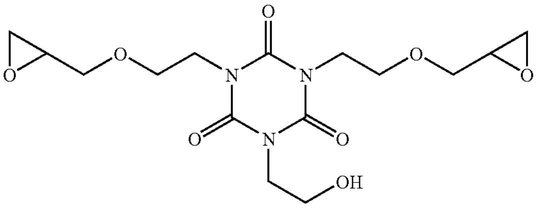

(D-6)

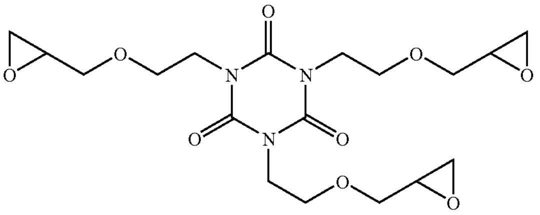

(D-7)

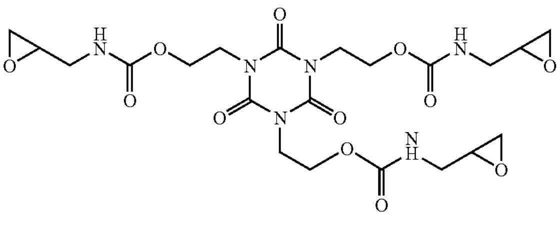

-continued (D-8)

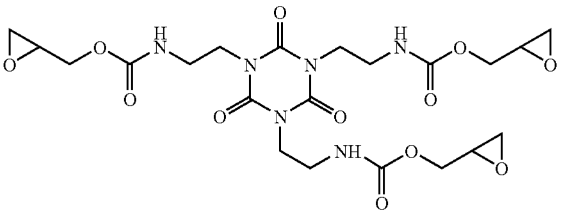

The amount of the epoxy compound having a molecular weight of 1,000 or less (D) according to the invention added is preferably from 0.4 to 20% by weight, more preferably from 1 to 10% by weight, most preferably from 2 to 6% by weight, based on the total solid content of the image-recording layer.

Next, other components contained in the image-recording layer will be described in order.

<(A) Infrared Absorbing Agent>

The lithographic printing plate precursor according to the invention contains an infrared absorbing agent in the image-recording layer thereof. The infrared absorbing agent has a function of converting the infrared ray absorbed to heat and a function of being excited by the infrared ray to perform electron transfer and/or energy transfer to a radical polymerization initiator described hereinafter. By the incorporation of infrared absorbing agent into the image-recording layer, the image formation using as a light source, a laser emitting an infrared ray of 760 to 1,200 nm or the like is easily performed.

The infrared absorbing agent for use in the invention is preferably a dye or pigment having an absorption maximum in a wavelength range of 760 to 1,200 nm.

As the dye, commercially available dyes and known dyes described in literatures, for example, *Senryo Binran* (Dye Handbook) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 (the term "JP-B" as used herein means an "examined Japanese patent publication") and JP-B-5-19702 are also preferably used. Other preferable examples of the dye include near infrared absorbing dyes represented by formulae (I) and (II) in U.S. Pat. No. 4,756,993.

Other preferable examples of the infrared absorbing dye according to the invention include specific indolenine cyanine dyes described in JP-A-2002-278057 as illustrated below.

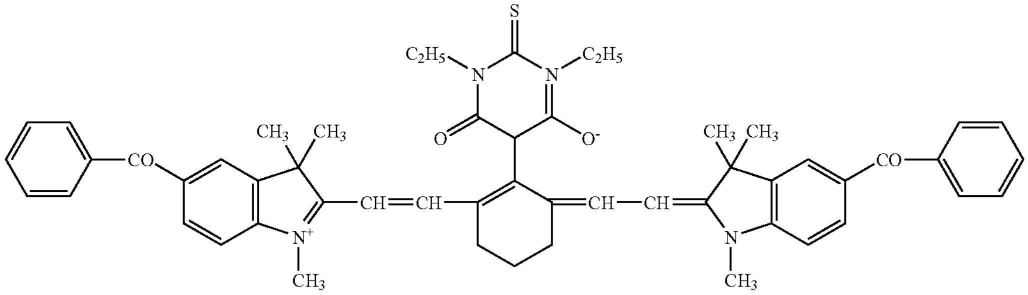

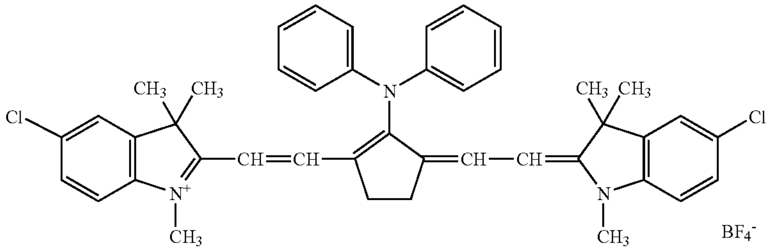

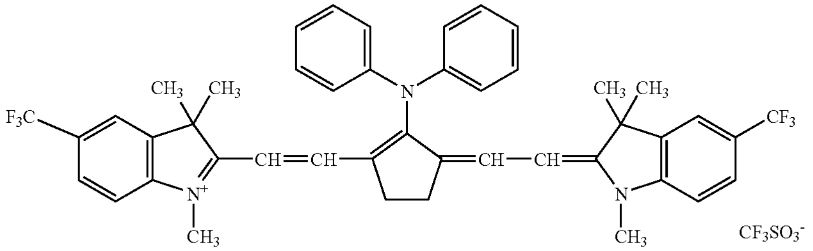

Of the dyes, cyanine dyes, squarylium dyes, pyrylium dyes, nickel thiolate complexes and indolenine cyanine dyes are preferred. Further, cyanine dyes and indolenine cyanine dyes are more preferred. As a particularly preferable example of the dye, a cyanine dye represented by formula (i) shown below is exemplified.

Formula (i):

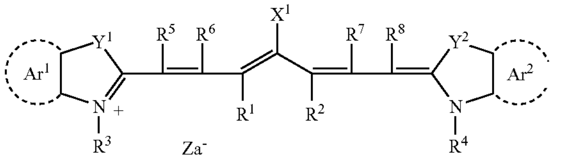

In formula (i), $X^1$ represents a hydrogen atom, a halogen atom, —$NPh_2$, $X^2$-$L^1$ or a group represented by the structural formula shown below. $X^2$ represents an oxygen atom, a nitrogen atom or a sulfur atom, $L^1$ represents a hydrocarbon group having from 1 to 12 carbon atoms, an aromatic ring containing a hetero atom or a hydrocarbon group having from 1 to 12 carbon atoms and containing a hetero atom. The hetero atom used herein indicates a nitrogen atom, a sulfur atom, an oxygen atom, a halogen atom and a selenium atom. $R^a$ represents a substituent selected from a hydrogen atom, an alkyl group, an aryl group, a substituted or unsubstituted amino group and a halogen atom, and $Xa^-$ has the same meaning as $Za^-$ defined hereinafter.

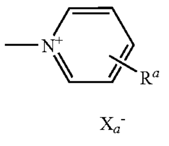

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms, and it is particularly preferred that $R^1$ and $R^2$ are combined with each other to form a 5-membered or 6-membered ring.

$Ar^1$ and $Ar^2$, which may be the same or different, each represents an aromatic hydrocarbon group which may have a substituent. Preferable examples of the aromatic hydrocarbon group include a benzene ring and a naphthalene ring. Also, preferable examples of the substituent include a hydrocarbon group having 12 or less carbon atoms, a halogen atom and an alkoxy group having 12 or less carbon atoms, and a hydrocarbon group having 12 or less carbon atoms and an alkoxy group having 12 or less carbon atoms are most preferable. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulfo group, and an alkoxy group having 12 or less carbon atoms is most preferable. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the cyanine dye represented by formula (i) has an anionic substituent in the structure thereof and neutralization of charge is not needed. In view of the preservation stability of a coating solution for image-recording layer, preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a tetrafluoroborate ion, a hexafluorophosphate ion and an arylsulfonate ion.

Specific examples of the cyanine dye represented by formula (i), which can be preferably used in the invention, include those described in paragraph Nos. [0017] to [0019] of JP-A-2001-133969.

Further, other particularly preferable examples include specific indolenine cyanine dyes described in JP-A-2002-278057 described above.

Examples of the pigment for use in the invention include commercially available pigments and pigments described in Colour Index (C.I.), *Saishin Ganryo Binran* (Handbook of the Newest Pigments) compiled by Pigment Technology Society of Japan (1977), *Saishin Ganryo Oyou Gijutsu* (Newest Application on Technologies for Pigments), CMC Publishing Co., Ltd. (1986) and *Insatsu Ink Gijutsu* (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in *Kinzoku Sekken no Seishitsu to Oyo* (Properties and Applications of Metal Soap), Saiwai Shobo, *Insatsu Ink Gijutsu* (Printing Ink Technology), CMC Publishing Co., Ltd. (1984), and *Saishin Ganryo Oyo Gijutsu* (Newest Application on Technologies for Pigments), CMC Publishing Co., Ltd. (1986).

The pigment has a particle size of preferably from 0.01 to 10 μm, more preferably from 0.05 to 1 μm, particularly preferably from 0.1 to 1 μm. In the range described above, good stability of the pigment dispersion in the coating solution for image-recording layer and good uniformity of the image-recording layer can be obtained.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in *Saishin Ganryo Oyo Gijutsu* (Newest Application on Technologies for Pigments), CMC Publishing Co., Ltd. (1986).

The infrared absorbing agent may be added together with other components to the same image-recording layer or may be added to a different image-recording layer separately provided. With respect to the amount of the infrared absorbing agent added, in the case of preparing a lithographic printing plate precursor, the amount is so controlled that absorbance of the image-recording layer at the maximum absorption wavelength in the wavelength region of 760 to 1,200 nm measured by reflection measurement is in a range of 0.3 to 1.2, preferably in a range of 0.4 to 1.1. In the range described above, the polymerization reaction proceeds uniformly in the thickness direction of the image-recording layer and good film strength of the image area and good adhesion property of the image area to the support are achieved.

The absorbance of the image-recording layer can be controlled depending on the amount of the infrared absorbing agent added to the image-recording layer and the thickness of the image-recording layer. The measurement of the absorbance can be carried out in a conventional manner. The method for measurement includes, for example, a method of forming an image-recording layer having a thickness determined appropriately in the range necessary for a coating amount after drying of the lithographic printing plate precursor on a reflective support, for example, an aluminum plate, and measuring reflection density of the image-recording layer by an optical densitometer or a spectrophotometer according to a reflection method using an integrating sphere.

Speaking specifically, the content of the infrared absorbing agent (A) in the image-recording layer according to the invention is preferably from 0.1 to 10.0% by weight, more preferably from 0.5 to 5.0% by weight, based on the total solid content of the image-recording layer.

<(B) Radical Polymerization Initiator>

The radical polymerization initiator (B) for use in the invention is a compound that generates a radical with light energy, heat energy or both energies to initiate or accelerate polymerization of polymerizable compound (C). The radical polymerization initiator for use in the invention includes, for example, known thermal polymerization initiators, compounds containing a bond having small bond dissociation energy and photopolymerization initiators.

The radical polymerization initiators in the invention include, for example, (a) organic halides, (b) carbonyl compounds, (c) azo compounds, (d) organic peroxides, (e) metallocene compounds, (f) azido compounds, (g) hexaarylbiimidazole compounds, (h) organic borate compounds, (i) disulfone compounds, (j) oxime ester compounds and (k) onium salt compounds.

The organic halides (a) specifically include, for example, compounds described in Wakabayashi et al., *Bull. Chem. Soc. Japan,* 42, 2924 (1969), U.S. Pat. No. 3,905,815, JP-B-46-4605, JP-A-48-35281, JP-A-55-32070, JP-A-60-239736, JP-A-61-169835, JP-A-61-169837, JP-A-62-58241, JP-A-62-212401, JP-A-63-70243, JP-A-63-298339 and M. P. Hutt, *Journal of Heterocyclic Chemistry,* 1, No. 3 (1970). Particularly, oxazole compounds and s-triazine compounds each substituted with a trihalomethyl group are preferably exemplified.

More preferably, s-triazine derivatives and oxadiazole derivatives each of which has at least one of mono-, di- and tri-halogen substituted methyl groups connected are exemplified. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-(p-bromophenyl)-4,6-bis(trichloromethyl)-s-triazine, 2-(p-fluorophenyl)-4,6-bis(trichloromethyl)-s-triazine, 2-(p-trifluoromethylphenyl)-4,6-bis(trichloromethyl)-s-triazine, 2-(2,6-dichlorophenyl)-4,6-bis(trichloromethyl)-s-triazine, 2-(2,6-difluorophenyl)-4,6-bis(trichloromethyl)-s-triazine, 2-(2,6-dibromophenyl)-4,6-bis(trichloromethyl)-s-triazine, 2-(4-biphenylyl)-4,6-bis(trichloromethyl)-s-triazine, 2-(4'-chloro-4-biphenylyl)-4,6-bis(trichloromethyl)-s-triazine, 2-(p-cyanophenyl)-4,6-bis(trichloromethyl)-s-triazine, 2-(p-acetylphenyl)-4,6-bis (trichloromethyl)-s-triazine, 2-(p-ethoxycarbonylphenyl)-4,6-bis(trichloromethyl)-s-triazine, 2-(p-phenoxycarbonylphenyl)-4,6-bis(trichloromethyl)-s-triazine, 2-(p-methylsulfonylphenyl)-4,6-bis(trichloromethyl)-s-triazine, 2-(p-dimethylsulfoniumphenyl)-4,6-bis(trichloromethyl)-s-triazine tetrafluoroborate, 2-(2,4-difluorophenyl)-4,6-bis(trichloromethyl)-s-triazine, 2-(p-diethoxyphosphorylphenyl)-4,6-bis(trichloromethyl)-s-triazine, 2-[4-(4-hydroxyphenylcarbonylamino)phenyl]-4,6-bis(trichloromethyl)-s-triazine, 2-[4-(p-methoxyphenyl)-1,3-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, 2-(o-methoxystyryl)-5-trichloromethyl-1,3,4-oxadiazole, 2-(3,4-epoxystyryl)-5-trichloromethyl-1,3,4-oxadiazole, 2-[1-phenyl-2-(4-methoxyphenyl)vinyl]-5-trichloromethyl-1,3,4-oxadiazole, 2-(p-hydroxystyryl)-5-trichloromethyl-1,3,4-oxadiazole, 2-(3,4-dihydroxystyryl)-5-trichloromethyl-1,3,4-oxadiazole and 2-(p-tert-butoxystyryl)-5-trichloromethyl-1,3,4-oxadiazole.

The carbonyl compounds (b) include, for example, benzophenone derivatives, e.g., benzophenone, Michler's ketone, 2-methylbenzophenone, 3-methylbenzophenone, 4-methylbenzophenone, 2-chlorobenzophenone, 4-bromobenzophenone or 2-carboxybenzophenone, acetophenone derivatives, e.g., 2,2-dimethoxy-2-phenylacetophenone, 2,2-diethoxyacetophenone, 1-hydroxycyclohexylphenylketone, α-hydroxy-2-methylphenylpropanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone or 1,1,1,-trichloromethyl-(p-butylphenyl)ketone, thioxanthone derivatives, e.g., thioxanthone, 2-ethylthioxanthone, 2-isopropylthioxanthone, 2-chlorothioxanthone, 2,4-dimethylthioxanthone, 2,4-dietylthioxantone or 2,4-diisopropylthioxanthone, and benzoic acid ester derivatives, e.g., ethyl p-dimethylaminobenzoate or ethyl p-diethylaminobenzoate.

The azo compounds (c) include, for example, azo compounds described in JP-A-8-108621.

The organic peroxides (d) include, for example, trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, tersyl carbonate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

The metallocene compounds (e) include, for example, various titanocene compounds described in JP-A-59-152396, JP-A-61-151197, JP-A-63-41484, JP-A-2-249, JP-A-2-4705 and JP-A-5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl or dicyclopentadienyl-Ti-bis-2,6-difluoro-3-(pyrol-1-yl)phen-1-yl, and iron-arene complexes described in JP-A-1-304453 and JP-A-1-152109.

The azido compounds (f) include, for example, 2,6-bis(4-azidobenzylidene)-4-methylcyclohexanone.

The hexaarylbiimidazole compounds (g) include, for example, various compounds described in JP-B-6-29285 and U.S. Pat. Nos. 3,479,185, 4,311,783 and 4,622,286, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetrakis(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole or 2,2'-bis(o-trifluoromethylphenyl)-4,4',5,5'-tetraphenylbiimidazole.

The organic borate compounds (h) include, for example, organic borates described in JP-A-62-143044, JP-A-62-150242, JP-A-9-188685, JP-A-9-188686, JP-A-9-188710, JP-A-2000-131837, JP-A-2002-107916, Japanese Patent 2,764,769, JP-A-2002-116539 and Martin Kunz, *Rad Tech '98, Proceeding*, April 19-22 (1998), Chicago, organic boron sulfonium complexes or organic boron oxosulfonium complexes described in JP-A-6-157623, JP-A-6-175564 and JP-A-6-175561, organic boron iodonium complexes described in JP-A-6-175554 and JP-A-6-175553, organic boron phosphonium complexes described in JP-A-9-188710, and organic boron transition metal coordination complexes described in JP-A-6-348011, JP-A-7-128785, JP-A-7-140589, JP-A-7-306527 and JP-A-7-292014.

The disulfone compounds (i) include, for example, compounds described in JP-A-61-166544 and JP-A-2002-328465.

The oxime ester compounds (j) include, for example, compounds described in *J. C. S. Perkin II,* 1653-1660 (1979), *J. C. S. Perkin II,* 156-162 (1979), *Journal of Photopolymer Science and Technology,* 202-232 (1995) and JP-A-2000-66385, and compounds described in JP-A-2000-80068. Specific examples thereof include compounds represented by the following structural formulae:

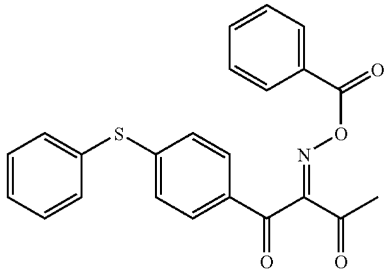

-continued
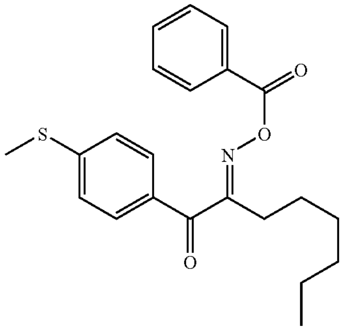
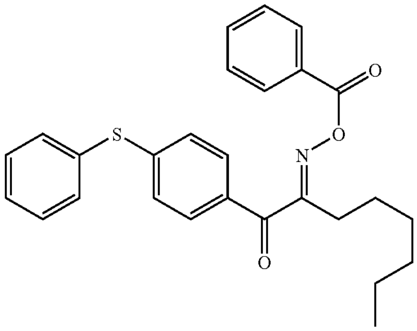
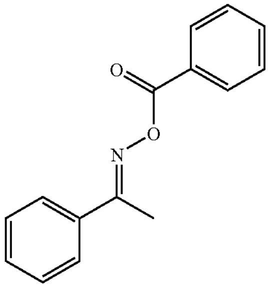
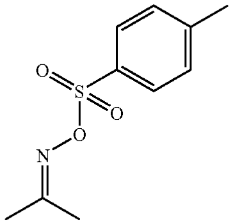
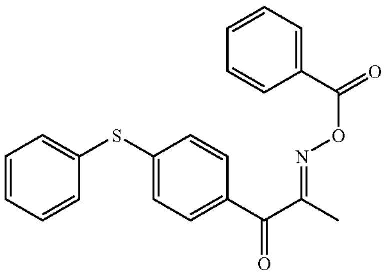
-continued
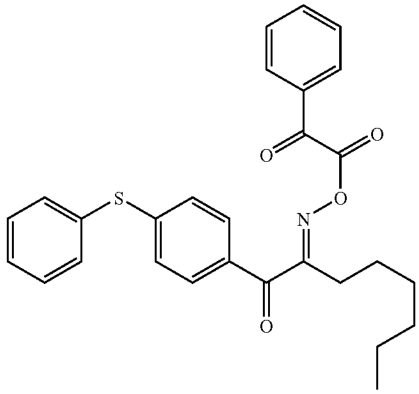
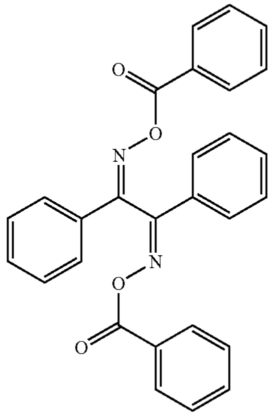
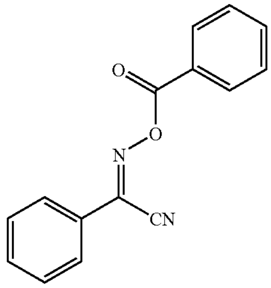
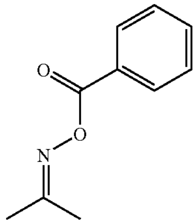
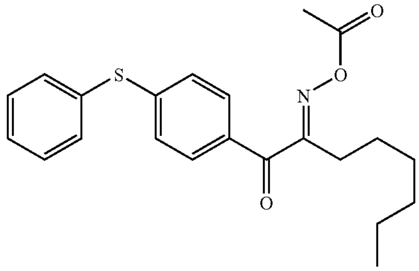
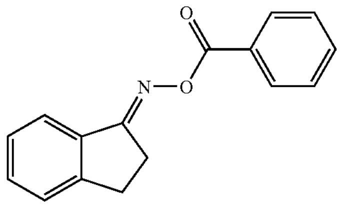

-continued
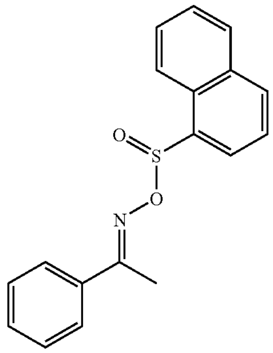
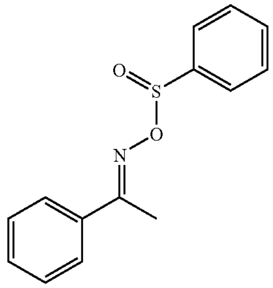
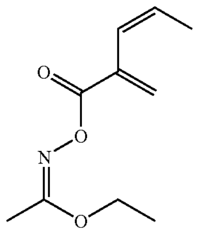
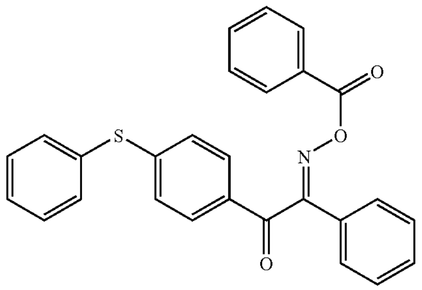
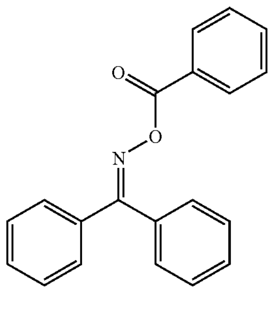
-continued
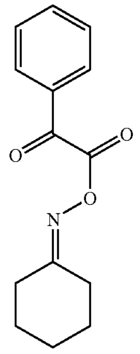
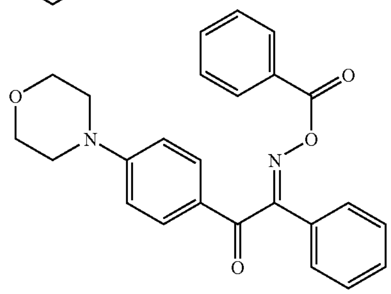
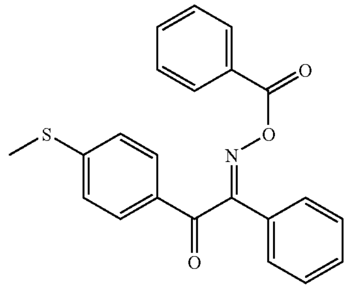
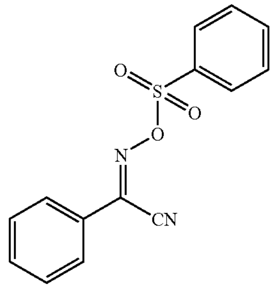
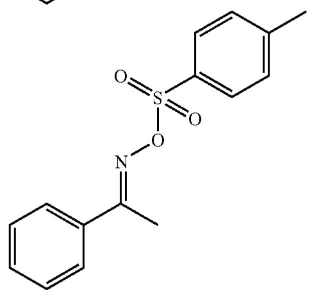
The onium salt compounds (k) include, for example, diazonium salts described in S. I. Schlesinger, *Photogr. Sci. Eng.,* 18, 387 (1974) and T. S. Bal et al., *Polymer,* 21, 423 (1980), ammonium salts described in U.S. Pat. No. 4,069,055 and JP-A-4-365049, phosphonium salts described in U.S. Pat. Nos. 4,069,055 and 4,069,056, iodonium salts described in European Patent 104,143, U.S. Pat. Nos. 339,049 and 410,201, JP-A-2-150848 and JP-A-2-296514, sulfonium salts described in European Patents 370,693, 390,214, 233,567, 297,443 and 297,442, U.S. Pat. Nos. 4,933,377, 161,811, 410,201, 339,049, 4,760,013, 4,734,444 and 2,833,827 and German Patents 2,904,626, 3604,580 and 3,604,581, selenonium salts described in J. V. Crivello et al., *Macromolecules,* 10 (6), 1307 (1977) and J. V. Crivello et al., *J. Polymer Sci., Polymer Chem. Ed.,* 17, 1047 (1979), and arsonium salts described in C. S. Wen et al., *Teh, Proc. Conf. Rad. Curing ASIA*, p. 478, Tokyo, October (1988).

Particularly, in view of reactivity and stability, the oxime ester compounds and diazonium salts, iodonium salts and sulfonium salts described above are preferably exemplified. In the invention, the onium salt functions not as an acid generator but as an ionic radical polymerization initiator.

The onium salts preferably used in the invention include onium salts represented by the following formulae (RI-I) to (RI-III):

(RI-I)

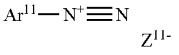

(RI-II)

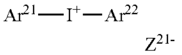

(RI-III)

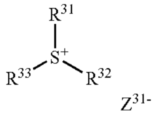

In formula (RI-I), $Ar^{11}$ represents an aryl group having 20 or less carbon atoms, which may have 1 to 6 substituents. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{11-}$ represents a monovalent anion and specifically includes a halide ion, a perchlorate ion, a hexafluorophosphate ion, a tetrafluoroborate ion, a sulfonate ion, a sulfinate ion, a thiosulfonate ion and a sulfate ion. From the standpoint of stability and visibility of print-out image, a perchlorate ion, a hexafluorophosphate ion, a tetrafluoroborate ion, a sulfonate ion or a sulfinate ion is preferable.

In the formula (RI-II), $Ar^{21}$ and $Ar^{22}$ each independently represents an aryl group having 20 or less carbon atoms, which may have 1 to 6 substituents. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{21-}$ represents a monovalent anion and specifically includes a halide ion, a perchlorate ion, a hexafluorophosphate ion, a tetrafluoroborate ion, a sulfonate ion, a sulfinate ion, a thiosulfonate ion, a sulfate ion and a carboxylate ion. From the standpoint of stability and visibility of print-out image, a perchlorate ion, a hexafluorophosphate ion, a tetrafluoroborate ion, a sulfonate ion, a sulfinate ion or a carboxylate ion is preferable.

In the formula (RI-III), $R^{31}$, $R^{32}$ and $R^{33}$ each independently represents an aryl group having 20 or less carbon atoms, which may have 1 to 6 substituents, an alkyl group, an alkenyl group or an alkynyl group and is preferably an awl group from the standpoint of reactivity and stability. Preferable example of the substituent includes an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido group or arylamido group having from 1 to 12 carbon atoms, a carbonyl group, a carboxyl group, a cyano group, a sulfonyl group, an thioalkyl group having from 1 to 12 carbon atoms and an thioaryl group having from 1 to 12 carbon atoms. $Z^{31-}$ represents a monovalent anion and specifically includes a halide ion, a perchlorate ion, a hexafluorophosphate ion, a tetrafluoroborate ion, a sulfonate ion, a sulfinate ion, a thiosulfonate ion, a sulfate ion and a carboxylate ion. From the standpoint of stability and visibility of print-out image, a perchlorate ion, a hexafluorophosphate ion, a tetrafluoroborate ion, a sulfonate ion, a sulfinate ion or a carboxylate ion is preferable. Carboxylate ions described in JP-A-2001-343742 are more preferable, and carboxylate ions described in JP-A-2002-148790 are particularly preferable.

Specific examples of the onium salt compound preferably used as the radical polymerization initiator in the invention are set forth below, but the invention should not be construed as being limited thereto.

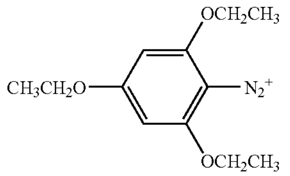

(N-1)

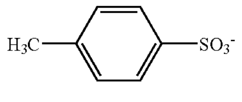

(N-2)

$PF_6^-$

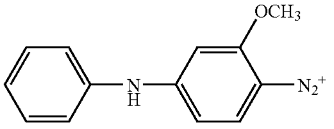

(N-3)

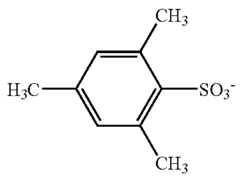

-continued
(N-4)
$ClO_4^-$
(N-5)
$PF_6^-$
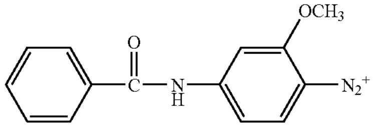
(N-6)
$CF_3SO_3^-$
(N-7)
$BF_4^-$
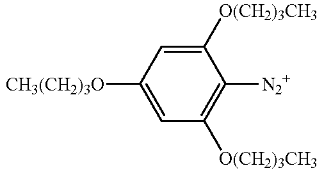
(N-8)
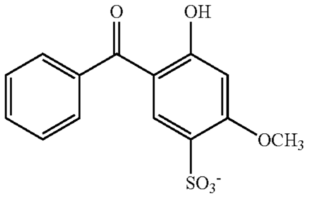
(N-9)
$ClO_4^-$
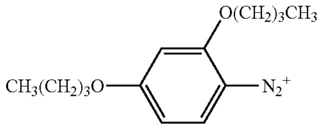
(N-10)
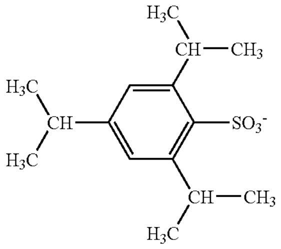
(N-11)
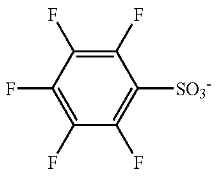
(N-12)
$PF_6^-$
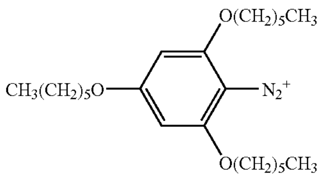
-continued
(N-13)
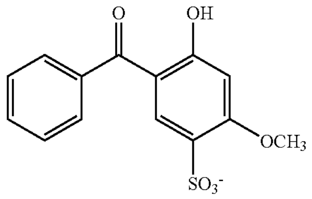
(N-14)
$ClO_4^-$
(N-15)
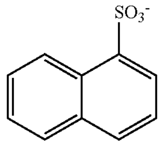
(N-16)
$PF_6^-$
(N-17)
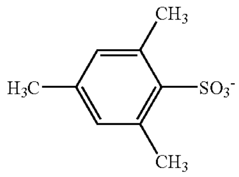
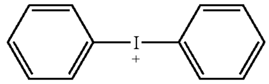
(I-1)
(I-2)
$PF_6^-$
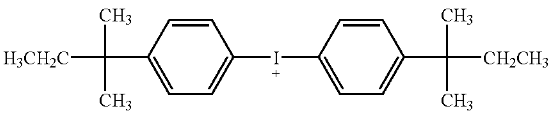
(I-3)
$PF_6^-$
(I-4)
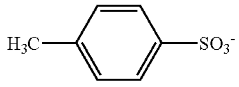
(I-5)
$ClO_4^-$
(I-6)
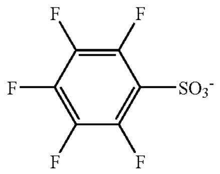
(I-7)
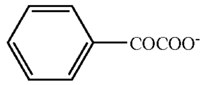
(I-8)
$CF_3SO_3^-$
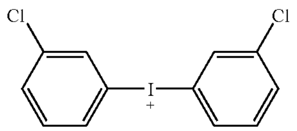

-continued
(I-9)
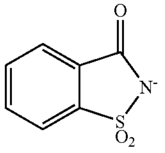
(I-10)
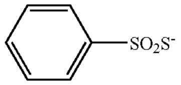
(I-11)
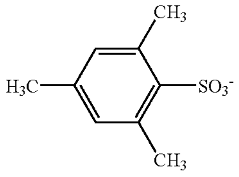
(I-12)
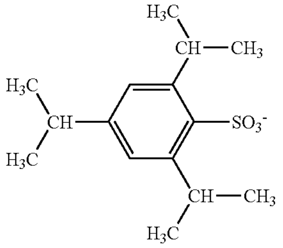
(I-13)
$BF_4^-$
(I-14)
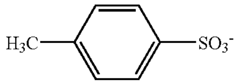
(I-15)
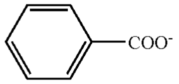
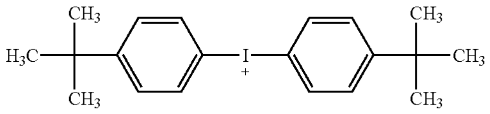
(I-16)
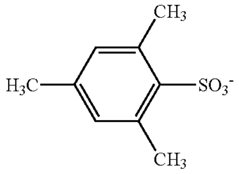
(I-17)
$ClO_4^-$
(I-18)
$PF_6^-$
(I-19)
$C_4F_9SO_3^-$
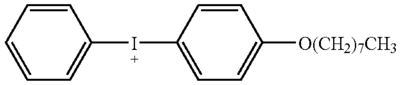
-continued
(I-20)
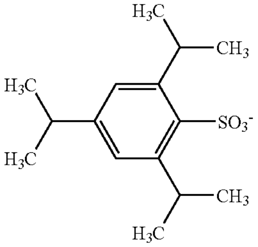
(I-21)
$CF_3COO^-$
(I-22)
$CF_3SO_3^-$
(I-23)
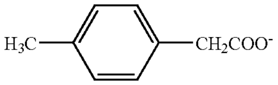
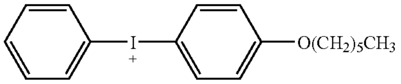
(I-24)
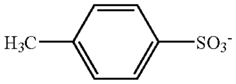
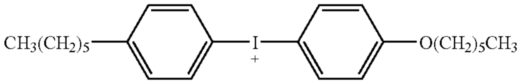
(I-25)
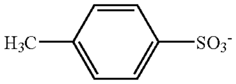
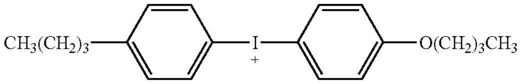
(I-26)
$C_4F_9COO^-$
(I-27)
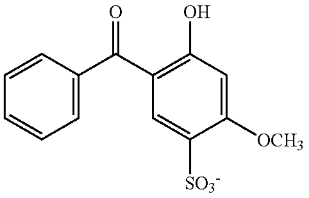
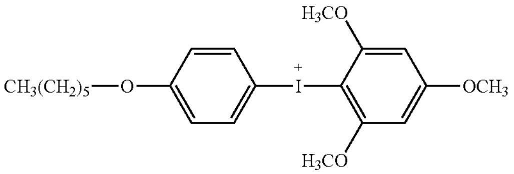
(I-28)
$PF_6^-$
(I-29)
$ClO_4^-$
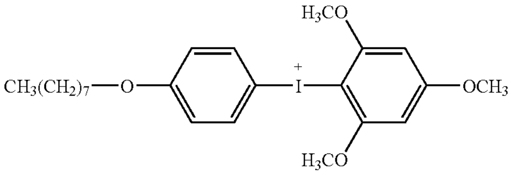

-continued
(I-30)
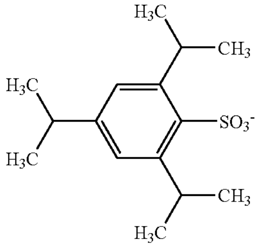
(I-31)
$PF_6^-$
(I-32)
$C_4F_9SO_3^-$
(I-33)
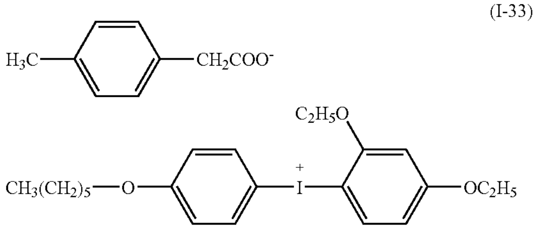
(I-34)
$BF_4^-$
(I-35)
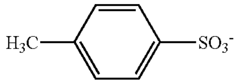
(I-36)
$PF_6^-$
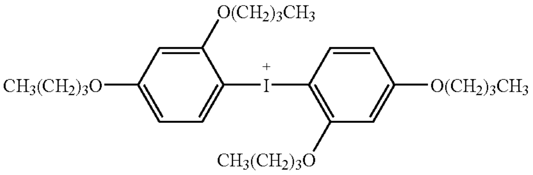
(I-37)
$PF_6^-$
(I-38)
$C_4F_9SO_3^-$
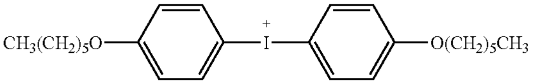
(I-39)
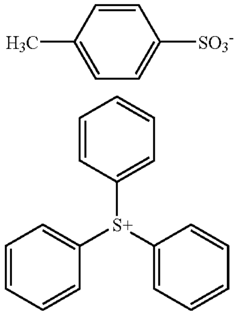
(S-1)
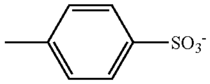
(S-2)
$PF_6^-$
(S-3)
$ClO_4^-$
-continued
(S-4)
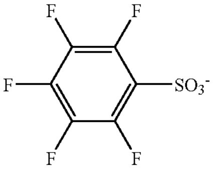
(S-5)
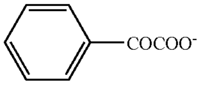
(S-6)
$CF_3SO_3^-$
(S-7)
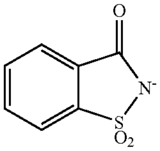
(S-8)
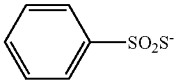
(S-9)
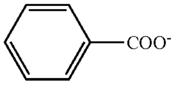
(S-10)
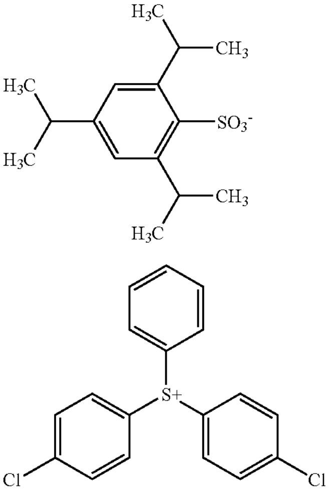
(S-11)
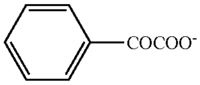
(S-12)
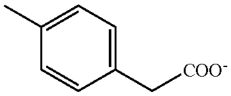
(S-13)
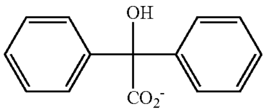

-continued

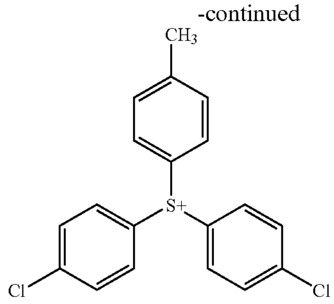

(S-14)

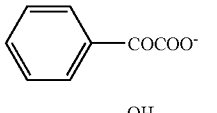

(S-15)

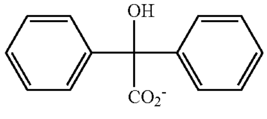

(S-16)

$BF_4^-$ (S-17)

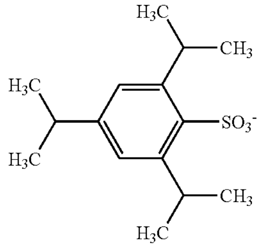

(S-18)

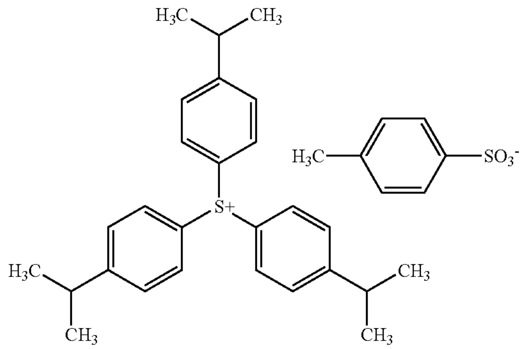

(S-19)

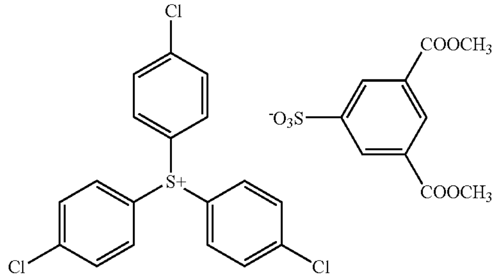

The radical polymerization initiator (B) is not limited to those described above. In particular, the organic halides (a), particularly the triazine type initiators included therein, the oxime ester compounds (j), the diazonium salts, iodonium salts and sulfonium salts included in the onium salt compounds (k) are more preferable from the standpoint of reactivity and stability. Of the radical polymerization initiators, onium salt compounds including as a counter ion, an inorganic anion, for example, $PF_6^-$ or $BE_4^-$ are preferable in combination with the infrared absorbing agent from the standpoint of improvement in the visibility of print-out image. Further, in view of excellence in the color-forming property, a diaryl iodonium is preferable as the onium salt.

From the standpoint of the prevention of degradation of on-press development property with the lapse of time, which is the object of the invention, the iodonium salt or sulfonium salt is particularly preferable and the iodonium salt is most preferable. The reason for this is that the salt is slightly decomposed with the lapse of time when the lithographic printing plate precursor is preserved to generate an acid which enables acceleration of the ring-opening reaction of the low molecular weight epoxy compound.

The radical polymerization initiators (B) may be used individually or in combination of two or more thereof.

The radical polymerization initiator (B) can be added to the image-recording layer preferably in an amount from 0.1 to 50% by weight, more preferably from 0.5 to 30% by weight, particularly preferably from 0.8 to 20% by weight, based on the total solid content constituting the image-recording layer. In the range described above, good sensitivity and good stain resistance in the non-image area at the time of printing are obtained.

<(C) Polymerizable Compound>

The polymerizable compound (C) for use in the invention is an addition-polymerizable compound having at least one ethylenically unsaturated double bond, and it is selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a (co)polymer thereof, or a mixture thereof.

Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphoric acid, styrene, vinyl ether or the like can also be used.

With respect to specific examples of the monomer, which is an ester of an aliphatic polyhydric alcohol compound with an unsaturated carboxylic acid, as an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri (acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer is exemplified.

As a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane or bis[p-(methacryloxyethoxy) phenyl]dimethylmethane is exemplified.

As an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate is exemplified.

As a crotonic acid ester, for example, ethylene glycol dicrotonate, tetramethylene glycol dicrotonate, pentaerythritol dicrotonate and sorbitol tetracrotonate is exemplified.

As an isocrotonic acid ester, for example, ethylene glycol diisocrotonate, pentaerythritol diisocrotonate and sorbitol tetraisocrotonate is exemplified.

As a maleic acid ester, for example, ethylene glycol dimaleate, triethylene glycol dimaleate, pentaerythritol dimaleate or sorbitol tetramaleate is exemplified.

Other examples of the ester, which can be preferably used, include aliphatic alcohol esters described in JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide. Other preferable examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (A) shown below to a polyisocyanate compound having two or more isocyanate groups per molecule, described in JP-B-48-41708.

$$CH_2{=}C(R^{19})COOCH_2CH(R^{20})OH \qquad (A)$$

wherein $R^{19}$ and $R^{20}$ each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used. Furthermore, a photopolymerizable composition having remarkably excellent photosensitive speed can be obtained by using an addition polymerizable compound having an amino structure or a sulfide structure in its molecule, described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with acrylic acid or methacrylic acid, described in JP-A-48-64183, JP-B-49-43191 and JP-B-52-30490. Specific unsaturated compounds described in JP-B-46-43946, JP-B-1-40337 and JP-B-1-40336, and vinylphosphonic acid type compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi* (*Journal of Japan Adhesion Society*), Vol. 20, No. 7, pages 300 to 308 (1984) can also be used.

Details of the method of using the polymerizable compound, for example, selection of the structure, individual or combination use, or an amount added, can be appropriately arranged depending on the characteristic design of the final lithographic printing plate precursor. For instance, the compound is selected from the following standpoints.

In view of the sensitivity, a structure having a large content of unsaturated groups per molecule is preferred and in many cases, a bifunctional or more functional compound is preferred. In order to increase the strength of image area, that is, cured layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength.

The selection and use method of the addition polymerizable compound are also important factors for the compatibility and dispersibility with other components (for example, a binder polymer, a radical polymerization initiator or a coloring agent) in the image-recording layer. For instance, the compatibility may be improved in some cases by using the compound of low purity or using two or more kinds of the compounds in combination. A specific structure may be selected for the purpose of improving an adhesion property, for example, to a support or a protective layer.

In the invention, the polymerizable compound (C) is preferably used in an amount from 5 to 80% by weight, more preferably from 25 to 75% by weight, based on the nonvolatile component of the image-recording layer.

In the method of using the addition polymerizable compound, the structure, blend and amount added can be appropriately selected by taking account of the extent of polymerization inhibition due to oxygen, resolution, fogging property, change in refractive index, surface tackiness and the like. Further, depending on the case, a layer construction, for example, an undercoat layer or an overcoat layer, and a coating method, may also be considered.

The image-recording layer according to the invention may contain the component described below, if desired.

<(E) Binder Polymer>

In the image-recording layer according to the invention, a binder polymer can be used for the purpose of improving film strength of the image-recording layer. The binder polymer for use in the invention can be selected from those heretofore known without restriction, and a polymer having a film-forming property is preferable. Examples of the binder polymer include acrylic resins, polyvinyl acetal resins, polyurethane resins, polyurea resins, polyimide resins, polyamide resins, epoxy resins, methacrylic resins, polystyrene resins, novolac type phenolic resins, polyester resins, synthesis rubbers and natural rubbers.

The binder polymer may have a crosslinkable property in order to improve the film strength of the image area. In order to impart the crosslinkable property to the binder polymer, a crosslinkable functional group, for example, an ethylenically unsaturated bond is introduced into a main chain or side chain of the polymer. The crosslinkable functional group may be introduced by copolymerization.

Examples of the polymer having an ethylenically unsaturated bond in the main chain thereof include poly-1,4-butadiene and poly-1,4-isoprene.

Examples of the polymer having an ethylenically unsaturated bond in the side chain thereof include a polymer of an ester or amide of acrylic acid or methacrylic acid, which is a polymer wherein the ester or amide residue (R in —COOR or —CONHR) has an ethylenically unsaturated bond.

Examples of the residue (R described above) having an ethylenically unsaturated bond include $—(CH_2)_nCR^1═CR^2R^3$, $—(CH_2O)_nCH_2CR^1═CR^2R^3$, $—(CH_2CH_2O)_nCH_2CR^1═CR^2R^3$, $—(CH_2)_nNH—CO—O—CH_2CR^1═CR^2R^3$, $—(CH_2)_n—O—CO—CR^1R^2R^3$ and $—(CH_2CH_2O)_2—X$ (wherein $R^1$ to $R^3$ each represents a hydrogen atom, a halogen atom or an alkyl group having from 1 to 20 carbon atoms, an aryl group, alkoxy group or aryloxy group, or $R^1$ and $R^2$ or $R^1$ and $R^3$ may be combined with each other to form a ring. n represents an integer of 1 to 10. X represents a dicyclopentadienyl residue).

Specific examples of the ester residue include $—CH_2CH═CH_2$ (described in JP-B-7-21633), $—CH_2CH_2O—CH_2CH═CH_2$, $—CH_2C(CH_3)═CH_2$, $—CH_2CH═CH—C_6H_5$, $—CH_2CH_2OCOCH═CH—C_6H_5$, $—CH_2CH_2—NHCOO—CH_2CH═CH_2$ and $—CH_2CH_2O—X$ (wherein X represents a dicyclopentadienyl residue).

Specific examples of the amide residue include $CH_2CH═CH_2$, $—CH_2CH_2—Y$ (wherein Y represents a cyclohexene residue) and $—CH_2CH_2—OCO—CH═CH_2$.

The binder polymer having crosslinkable property is cured, for example, by addition of a free radical (a polymerization initiating radical or a growing radical of a polymerizable compound during polymerization) to the crosslinkable functional group of the polymer and undergoing addition polymerization between the polymers directly or through a polymerization chain of the polymerizable compound to form crosslinkage between the polymer molecules. Alternately, it is cured by generation of a polymer radical upon extraction of an atom (for example, a hydrogen atom on a carbon atom adjacent to the functional crosslinkable group) in the polymer by a free radial and connecting the polymer radicals with each other to form cross-linkage between the polymer molecules.

The content of the crosslinkable group in the binder polymer (content of the radical polymerizable unsaturated double bond determined by iodine titration) is preferably from 0.1 to 10.0 mmol, more preferably from 1.0 to 7.0 mmol, most preferably from 2.0 to 5.5 mmol, based on 1 g of the binder polymer. In the range described above, good sensitivity and good preservation stability can be obtained.

The binder polymer for use in the invention preferably has a hydrophilic group. The hydrophilic group contributes to impart the on-press development property to the image-recording layer. In particular, when the crosslinkable group and the hydrophilic group are present in the binder polymer, both printing durability and developing property are well achieved.

Examples of the hydrophilic group include a hydroxy group, a carboxyl group, a carboxylate group, a hydroxyethyl group, an alkylene oxide structure, a hydroxypropyl group, a polyoxyethyl group, a polyoxypropyl group, an amino group, an aminoethyl group, an aminopropyl group, an ammonium group, an amido group, a carboxymethyl group, a sulfo group and a phosphoric acid group. Preferably, for example, an amido group, a hydroxy group, a polyoxyethyl group and an alkylene oxide group are exemplified. The alkylene oxide structure represented by formula (ii) shown below is most preferable. The alkylene oxide structure is preferably incorporated into a side chain of the binder polymer.

(ii)

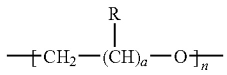

In formula (ii), R represents a hydrogen atom or a methyl group, a represents an integer of 1, 3 or 5, and n represents an integer of 1 to 9. n preferably represents an integer of 1 to 8, more preferably an integer of 1 to 7, still more preferably an integer of 1 to 6, and most preferably an integer of 2 to 4.

In order to introduce the hydrophilic group into an acrylic resin, a monomer having a hydrophilic group may be copolymerized. Specific examples of the copolymerizable monomer having a hydrophilic group include acrylamide, methacrylamide, N,N-dimethylacrylamide, N-isopropylacrylamide, N-vinylpyrrolidone, N-vinylacetamide, N-acryloylmorpholine, 2-hydroxyethyl acrylate, 2-hydroxyethyl methacrylate, polyoxyethylene monomethacrylate, polyoxyethylene monoacrylate, polyoxypropylene monomethacrylate, polyoxypropylene monoacrylate, meth (acrylate) of polyoxyethylene monoalkyl ether and meth (acrylate) of polyoxypropylene monoalkyl ether.

The copolymerizable monomers having a hydrophilic group may be used individually or in combination of two or more thereof. The content of the structural unit having a hydrophilic group in the binder polymer is preferably from 1 to 85% by mole, and particularly preferably from 5 to 70% by mole.

According to the invention, an oleophilic group containing carbon atoms, for example, an alkyl group, an aryl group, an aralkyl group or an alkenyl group may further be introduced into the binder polymer to the extent that the effects of the invention are not damaged. By the introduction of an oleophilic group, an ink acceptivity can be controlled.

In order to impart the oleophilicity to an acrylic resin, a hydrophobic monomer may be copolymerized. Examples of the copolymerizable monomer includes monomers selected from an acrylate, a methacrylate, an N,N-disubstituted acrylamide, an N,N-disubstituted methacrylamide, a styrene, acrylonitrile and methacrylonitrile.

Specific examples thereof include an acrylate, for example, an alkyl acrylate (preferably having from 1 to 20 carbon atoms in the alkyl group thereof) (e.g., methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate or tetrahydrofurfuryl acrylate) or an aryl acrylate (e.g., phenyl acrylate), a methacrylate, for example, an alkyl methacrylate (preferably having from 1 to 20 carbon atoms in the alkyl group thereof) (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate) or an aryl methacrylate (e.g., phenyl methacrylate, cresyl methacrylate or naphthyl methacrylate), styrene, a styrene derivative, for example, an alkylstyrene (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene or acetoxymethylstyrene), an alkoxystyrene (e.g., methoxystyrene, 4-methoxy-3-methylstyrene or dimethoxystyrene), or a halogenostyrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene), acrylonitrile and methacrylonitrile.

According to the invention, of the binder polymers a binder polymer having an acid value of 0.3 meq/g or less (E) is particularly preferred. By using the binder polymer having an acid value of 0.3 meq/g or less, the low molecular weight epoxy compound does not undergo ring-opening just after the production of lithographic printing plate precursor and maintains the original molecular form, whereby the effect of the epoxy compound can be sustained after the lapse of time. The acid value of the binder polymer is more preferably 0.1 meq/g or less, and still more preferably 0.05 meq/g or less.

In order to reduce the acid value of the binder polymer as 0.3 meq/g or less, it is preferred that when a monomer having an acid group is used as a copolymerization component of polymer, a copolymerization ratio of the monomer is lowered, that even when the monomer having an acid group is not used, other acrylic monomers used together have a sufficiently high esterification degree and do not contain impurities, for example, acrylic acid, and that when a polymer having an acid group is synthesized and then a double bond is introduced to the polymer, for example, by an addition reaction of glycidyl methacrylate, a reaction rate (consumption rate of acid group) of the polymer reaction is increased as much as possible.

The acid value can be obtained in the method described below.

Specifically, in a 100-ml beaker is precisely weighed 3.0 g of a sample of polymer, is added 54 ml of a solvent capable of dissolving the polymer to be measured and compatible with water, for example, 1-methoxy-2-propanol with stirring to dissolve the polymer, and then added 6 ml of pure water, followed by stirring with a stirrer. The resulting solution is titrated with an aqueous 0.01 N sodium hydroxide solution to determine the consumption amount (ml) thereof. A blank experiment is conducted simultaneously. From the result of titration, an acid value (meq/g) is calculated using a formula shown below.

Acid value (meq/g)=0.01×[consumption amount (ml)−blank (ml)]/sample amount (3.0 g)×solid content concentration (% by weight)/100

The weight average molecular weight (Mw) of the binder polymer is preferably 5,000 or more, and more preferably from 10,000 to 300,000. The number average molecular weight (Mn) of the binder polymer is preferably 1,000 or more, and more preferably from 2,000 to 250,000. The polydispersity (weight average molecular weight/number average molecular weight) thereof is preferably from 1.1 to 10.

The binder polymer is available by purchasing a commercial product or synthesizing according to a known method.

The content of the binder polymer is ordinarily from 5 to 90% by weight, preferably from 5 to 80% by weight, more preferably from 10 to 70% by weight, based on the total solid content of the image-recording layer. In the range described above, good strength of the image area and good image-forming property are obtained.

According to the invention, the polymerizable compound (C) and the binder polymer are used preferably in a weight ratio of 0.4/1 to 1.8/1, more preferably in a weight ratio of 0.7/1 to 1.5/1.

Specific examples of the binder polymer for use in the invention are set forth below, but the invention should not be construed as being limited thereto.

(1)

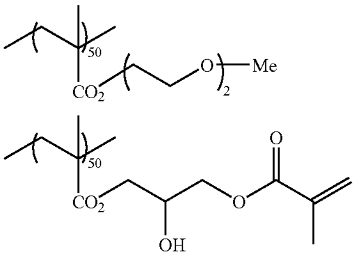

(2)

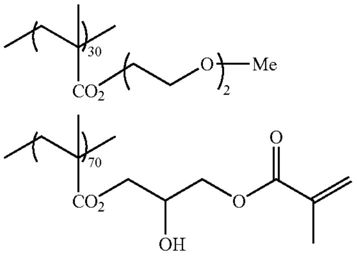

(3)

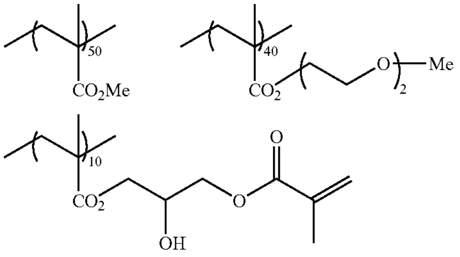

(4)

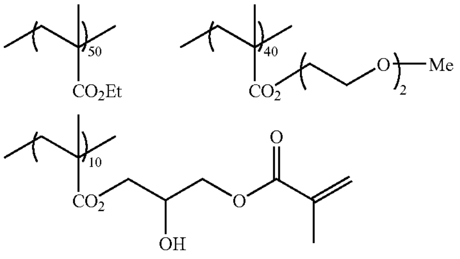

-continued
(5)
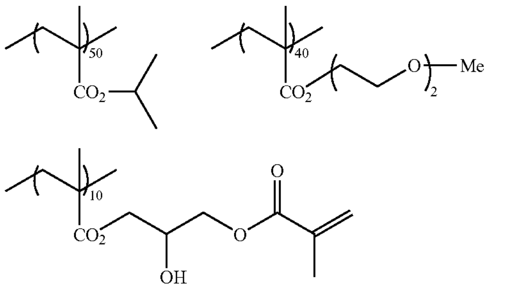
(6)
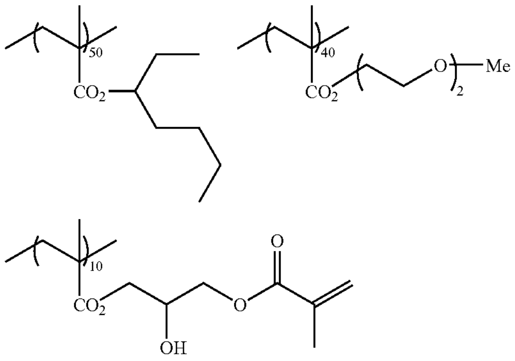
(7)
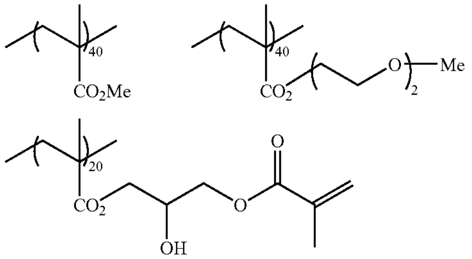
(8)
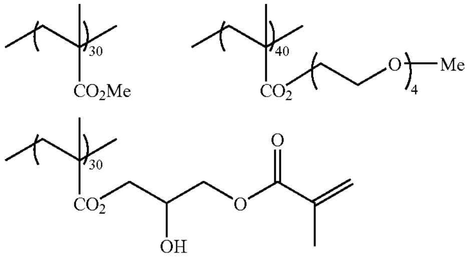
(9)
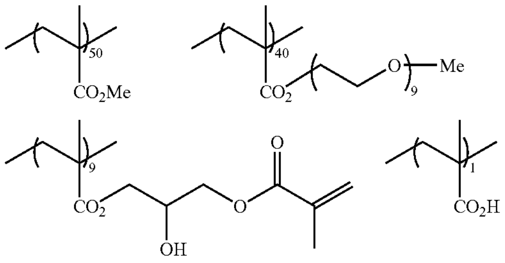
(10)
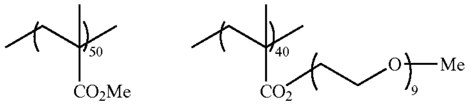
-continued
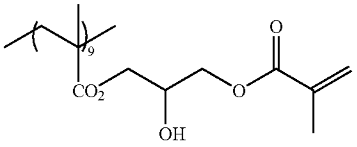
(11)
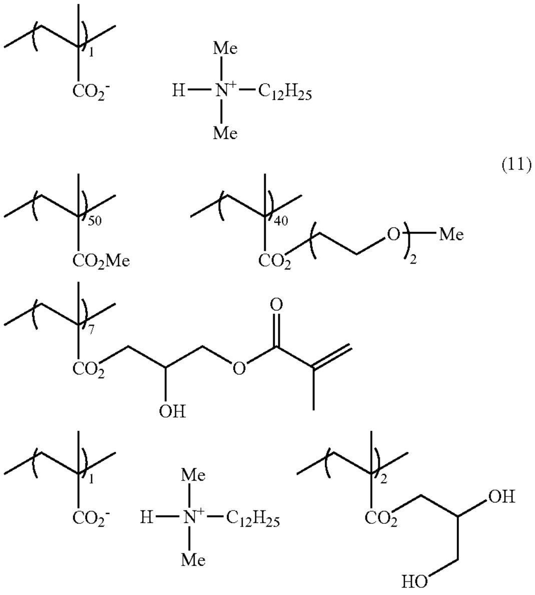
(12)
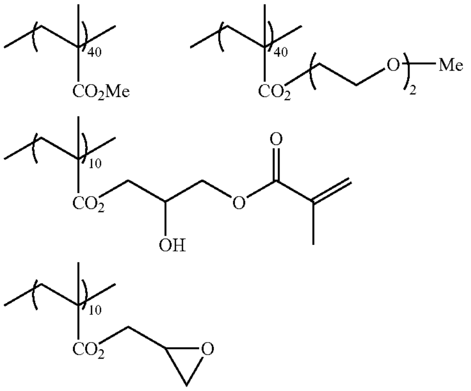
(13)
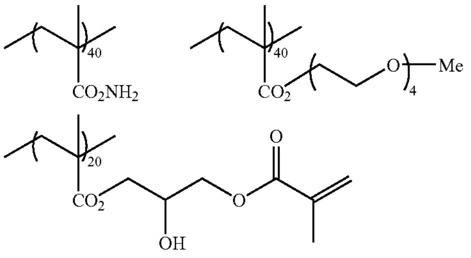
(14)
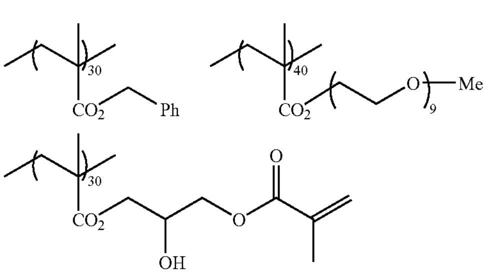

-continued
(15)
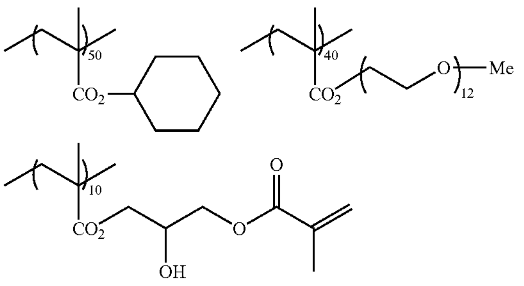
(16)
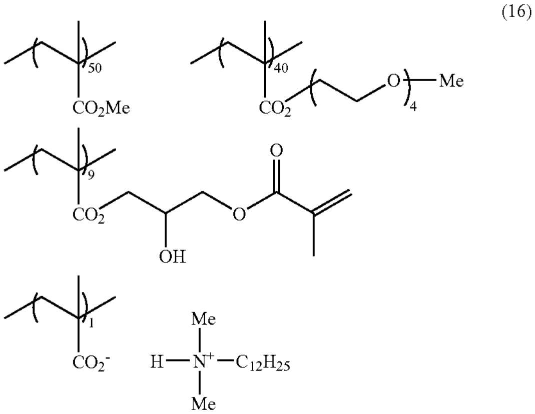
(17)
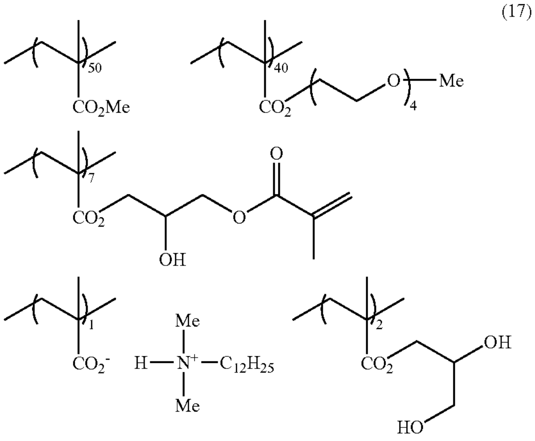
(18)
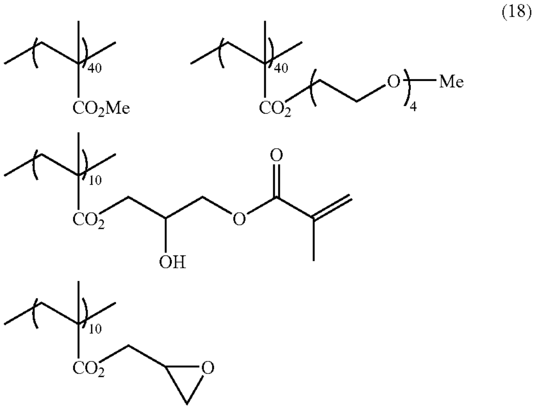
(19)
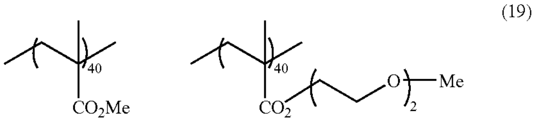
-continued
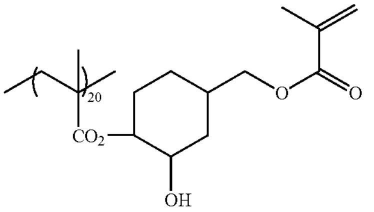
(20)
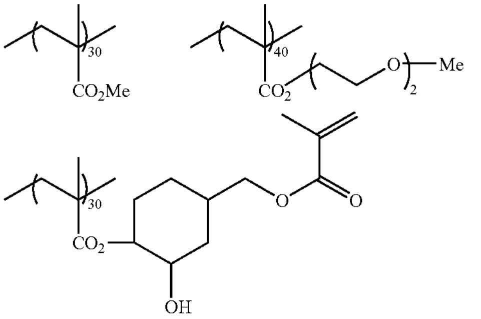
(21)
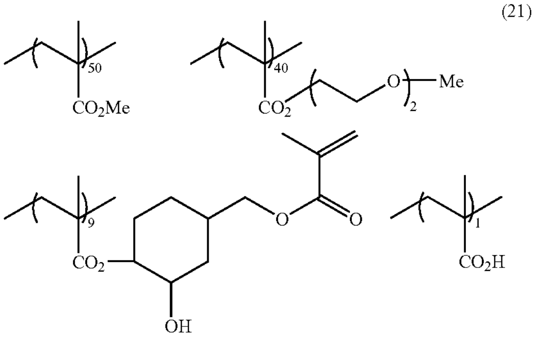
(22)
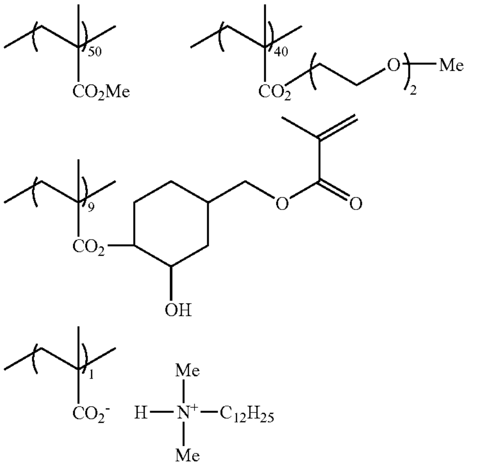
(23)
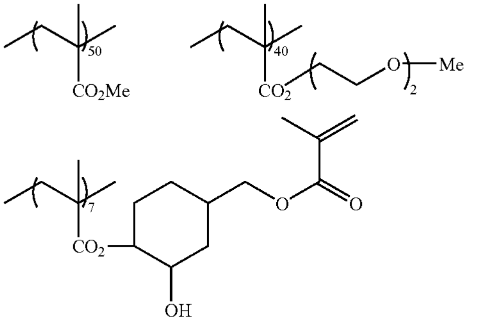

-continued

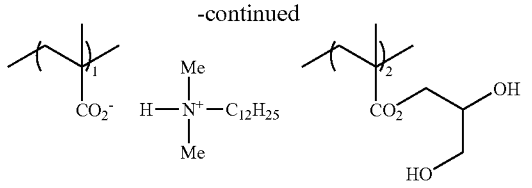

(24)

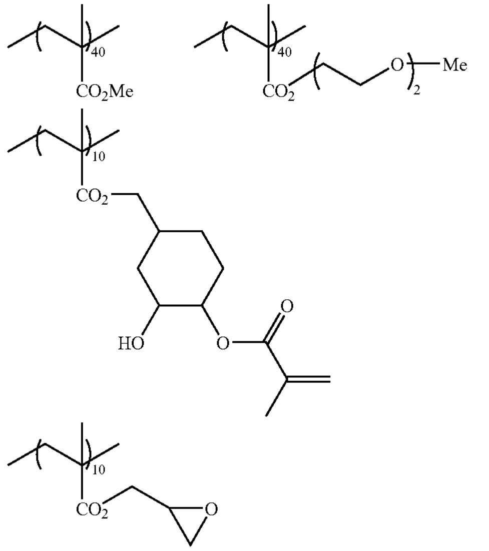

(25)

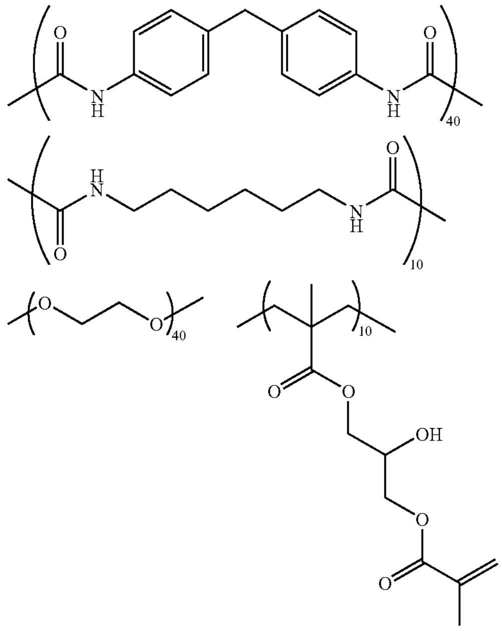

<Microcapsule and Microgel>

The image-recording layer according to the invention preferably has an embodiment of containing a microcapsule or microgel, from the standpoint of obtaining good on-press development property. Specifically, the embodiment of incorporating the above-described constituting components (A) to (D) of the image-recording layer and other constituting components described hereinafter into a microcapsule or microgel is preferable. Both of the microcapsule and microgel may be incorporated into the image-recording layer.

The microcapsule for use in the invention contains all or part of the constituting components (constituting components (A) to (D) described above) of the image-recording layer encapsulated as described, for example, in JP-A-2001-277740 and JP-A-2001-277742. The constituting components of the image-recording layer may be present outside the microcapsules. It is a more preferable embodiment of the image-recording layer containing microcapsule that hydrophobic constituting components are encapsulated in microcapsules and hydrophilic constituting components are present outside the microcapsules.

According to the invention, the image-recording layer may have an embodiment containing a crosslinked resin particle, that is, a microgel. The microgel can contain a part of the constituting components (A) to (D) inside and/or on the surface thereof. Particularly, an embodiment of a reactive microgel containing the polymerizable compound (C) on the surface thereof is preferable in view of the image-forming sensitivity and printing durability.

As a method of microencapsulation or microgelation of the constituting component of the image-recording layer, known methods can be used.

Methods of producing the microcapsule include, for example, a method of utilizing coacervation described in U.S. Pat. Nos. 2,800,457 and 2,800,458, a method of using interfacial polymerization described in U.S. Pat. No. 3,287,154, JP-B-38-19574 and JP-B-42-446, a method of using deposition of polymer described in U.S. Pat. Nos. 3,418,250 and 3,660,304, a method of using an isocyanate polyol wall material described in U.S. Pat. No. 3,796,669, a method of using an isocyanate wall material described in U.S. Pat. No. 3,914,511, a method of using a urea-formaldehyde-type or urea-formaldehyde-resorcinol-type wall-forming material described in U.S. Pat. Nos. 4,001,140, 4,087,376 and 4,089,802, a method of using a wall material, for example, a melamine-formaldehyde resin or hydroxycellulose described in U.S. Pat. No. 4,025,445, an in-situ method by monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074, but the invention should not be construed as being limited thereto.

A preferable microcapsule wall used in the invention has three-dimensional crosslinking and has a solvent-swellable property. From this point of view, a preferable wall material of the microcapsule includes polyurea, polyurethane, polyester, polycarbonate, polyamide and a mixture thereof, and polyurea and polyurethane are particularly preferred. Further, a compound having a crosslinkable functional group, for example, an ethylenically unsaturated bond, capable of being introduced into the binder polymer described hereinafter may be introduced into the microcapsule wall.

On the other hand, methods of preparing the microgel include, for example, a method of utilizing granulation by interfacial polymerization described in JP-B-38-19574 and JP-B-42-446 and a method of utilizing granulation by dispersion polymerization in a non-aqueous system described in JP-A-5-61214, but the invention should not be construed as being limited thereto.

To the method utilizing interfacial polymerization, known production methods of microcapsule can be applied.

The microgel preferably used in the invention is granulated by interfacial polymerization and has three-dimensional crosslinking. From this point of view, a preferable material to be used includes polyurea, polyurethane, polyester, polycarbonate, polyamide and a mixture thereof, and polyurea and polyurethane are particularly preferred.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time-lapse stability can be achieved.

<Other Components of Image-Recording Layer>

The image-recording layer according to the invention may further contain other components, if desired. Other components constituting the image-recording layer according to the invention will be described blow.

(1) Surfactant

In the image-recording layer according to the invention, a surfactant can be used in order to improve the state of coated surface.

The surfactant used includes, for example, a nonionic surfactant, an anionic surfactant, a cationic surfactant, an amphoteric surfactant and a fluorine-based surfactant. Among them, a fluorine-based surfactant is preferable.

As the fluorine-based surfactant, a fluorine-based surfactant containing a perfluoroalkyl group in its molecule is exemplified. Examples of the fluorine-based surfactant include an anionic type, for example, perfluoroalkyl carboxylates, perfluoroalkyl sulfonates or perfluoroalkyl phosphates; an amphoteric type, for example, perfluoroalkyl betaines; a cationic type, for example, perfluoroalkyl trimethyl ammonium salts; and a nonionic type, for example, perfluoroalkyl amine oxides, perfluoroalkyl ethylene oxide adducts, oligomers having a perfluoroalkyl group and a hydrophilic group, oligomers having a perfluoroalkyl group and an oleophilic group, oligomers having a perfluoroalkyl group, a hydrophilic group and an oleophilic group or urethanes having a perfluoroalkyl group and an oleophilic group. Further, fluorine-based surfactants described in JP-A-62-170950, JP-A-62-226143 and JP-A-60-168144 are also preferably exemplified.

The surfactants can be used individually or in combination of two or more thereof.

The content of the surfactant is preferably from 0.001 to 10% by weight, more preferably from 0.01 to 5% by weight, based on the total solid content of the image-recording layer.

(2) Coloring Agent

In the image-recording layer according to the invention, a dye having a large absorption in the visible region can be used as a coloring agent of the image formed. Specifically, the dye includes Oil yellow #101, Oil yellow #103, Oil pink #312, Oil green BG, Oil blue BOS, Oil blue #603, Oil black BY, Oil black BS, Oil black T-505 (produced by Orient Chemical Industries, Ltd.), Victoria pure blue, Crystal violet (CI42555), Methyl violet (CI42535), Ethyl violet, Rhodamine B (CI45170B), Malachite green (CI42000), Methylene blue (CI52015) and dyes described in JP-A-62-293247. Further, a pigment, for example, a phthalocyanine pigment, an azo pigment, carbon black or titanium oxide can also preferably be used.

It is preferred to add the coloring agent since distinction between the image area and the non-image area is easily conducted after the formation of image.

The amount of the coloring agent added is preferably from 0.01 to 10% by weight based on the total solid content of the image-recording layer.

(3) Print-Out Agent

To the image-recording layer according to the invention, a compound undergoing discoloration with an acid or radical can be added in order to form a print-out image.

As the compound used for such a purpose, various dyes, for example, of diphenylmethane type, triphenylmethane type, thiazine type, oxazine type, xanthene type, anthraquinone type, iminoquinone type, azo type and azomethine type are effectively used.

Specific examples thereof include dyes, for example, Brilliant green, Ethyl violet, Methyl green, Crystal violet, basic Fuchsine, Methyl violet 2B, Quinaldine red, Rose Bengal, Methanyl yellow, Thimol sulfonphthalein, Xylenol blue, Methyl orange, Paramethyl red, Congo red, Benzo purpurin 4B, α-Naphthyl red, Nile blue 2B, Nile blue A, Methyl violet, Malachite green, Parafuchsine, Victoria pure blue BOH (produced by Hodogaya Chemical Co., Ltd.), Oil blue #603 (produced by Orient Chemical Industries, Ltd.), Oil pink #312 (produced by Orient Chemical Industries, Ltd.), Oil red 5B (produced by Orient Chemical Industries, Ltd.), Oil scarlet #308 (produced by Orient Chemical Industries, Ltd.), Oil red OG (produced by Orient Chemical Industries, Ltd.), Oil red RR (produced by Orient Chemical Industries, Ltd.), Oil green #502 (produced by Orient Chemical Industries, Ltd.), Spiron Red BEH special (produced by Hodogaya Chemical Co., Ltd.), m-Cresol purple, Cresol red, Rhodamine B, Rhodamine 6G, Sulfo Rhodamine B, Auramine, 4-p-diethylaminophenyliminonaphthoquinone, 2-carboxyanilino-4-p-diethylaminophenyliminonaphthoquinone, 2-carboxystearylamino-4-p-N,N-bis(hydroxyethyl) aminophenyliminonaphthoquinone, 1-phenyl-3-methyl-4-p-diethylaminophenylimino-5-pyrazolon or 1-β-naphtyl-4-p-diethylaminophenylimino-5-pyrazolon, and a leuco dye, for example, p, p', p"-hexamethyltriaminotriphenylmethane (leuco crystal violet) or Pergascript Blue SRB (produced by Ciba Geigy Ltd.).

In addition to those described above, a leuco dye known as a material for heat-sensitive paper or pressure-sensitive paper is also preferably used. Specific examples thereof include crystal violet lactone, malachite green lactone, benzoyl leuco methylene blue, 2-(N-phenyl-N-methylamino)-6-(N-p-tolyl-N-ethyl)aminofluoran, 2-anilino-3-methyl-6-(n-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N—N-diethylamino)-6-methyl-7-anilinofluoran, 3-(N,N-diethylamino)-6-methyl-7-xylidinofluoran, 3-(N,N-diethylamino)-6-methyl-7-chlorofluorane, 3-(N,N-diethylamino)-6-methoxy-7-aminofluoran, 3-(N,N-diethylamino)-7-(4-chloroanilino)fluoran, 3-(N,N-diethylamino)-7-chlorofluorane, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-pipelidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The amount of the dye undergoing discoloration with an acid or radical is preferably from 0.01 to 10% by weight based on the solid content of the image-recording layer.

(4) Polymerization Inhibitor

It is preferred to add a small amount of a thermal polymerization inhibitor to the image-recording layer according to the invention in order to inhibit undesirable thermal polymerization of the polymerizable compound (C) during the production or preservation of the image-recording layer.

The thermal polymerization inhibitor preferably includes, for example, hydroquinone, p-methoxyphenol, di-tert-butylp-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The amount of the thermal polymerization inhibitor added is preferably from about 0.01 to about 5% by weight based on the total solid content of the image-recording layer.

(5) Higher Fatty Acid Derivative

To the image-recording layer according to the invention, a higher fatty acid derivative, for example, behenic acid or behenic acid amide may be added to localize on the surface of the image-recording layer during a drying step after coating in order to avoid polymerization inhibition due to oxygen.

The amount of the higher fatty acid derivative added is preferably from about 0.1 to about 10% by weight based on the total solid content of the image-recording layer.

(6) Plasticizer

The image-recording layer according to the invention may contain a plasticizer in order to improve the on-press development property.

The plasticizer preferably includes, for example, a phthalic acid ester, e.g., dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate or diallyl phthalate; a glycol ester, e.g., dimethylglycol phthalate, ethylphthalylethyl glycolate, methylphthalylethyl glycolate, butylphthalylbutyl glycolate or triethylene glycol dicaprylate ester; a phosphoric acid ester, e.g., tricresyl phosphate or triphenyl phosphate; an aliphatic dibasic acid ester, e.g., diisobutyl adipate, dioctyl adipate, dimethyl sebacate, dibutyl sebacate, dioctyl azelate or dibutyl maleate; polyglycidyl methacrylate, triethyl citrate, glycerin triacetyl ester and butyl laurate.

The amount of the plasticizer is preferably about 30% by weight or less based on the total solid content of the image-recording layer.

(7) Fine Inorganic Particle

The image-recording layer according to the invention may contain fine inorganic particle in order to increase the strength of cured film and to improve the on-press development property.

The fine inorganic particle preferably includes, for example, silica, alumina, magnesium oxide, titanium oxide, magnesium carbonate, calcium alginate and a mixture thereof. The fine inorganic particle can be used, for example, for strengthening the film or enhancing interface adhesion property due to surface roughening.

The fine inorganic particle preferably has an average particle size from 5 nm to 10 μm, more preferably from 0.5 to 3 μm. In the range described above, it is stably dispersed in the image-recording layer, sufficiently maintains the film strength of the image-recording layer and can form the non-imaging area excellent in hydrophilicity and prevented from the occurrence of stain at the time of printing.

The fine inorganic particle described above is easily available as a commercial product, for example, colloidal silica dispersion.

The content of the fine inorganic particle is preferably 40% by weight or less, more preferably 30% by weight or less, based on the total solid content of the image-recording layer.

(8) Hydrophilic Low Molecular Weight Compound

The image-recording layer according to the invention may contain a hydrophilic low molecular weight compound in order to improve the on-press development property without accompanying degradation of the printing durability.

The hydrophilic low molecular weight compound includes a water-soluble organic compound, for example, a glycol compound, e.g., ethylene glycol, diethylene glycol, triethylene glycol, propylene glycol, dipropylene glycol or tripropylene glycol, or an ether or ester derivative thereof, a polyhydroxy compound, e.g., glycerine, pentaerythritol or tris(2-hydroxyethyl)isocyanurate, an organic amine compound, e.g., triethanol amine, diethanol amine or monoethanol amine, or a salt thereof, an organic sulfonic acid compound, e.g., an alkyl sulfonic acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine.

Of the compounds, an organic sulfonic acid, an organic sulfamic acid, an organic sulfate, for example, sodium salt or lithium salt of an organic sulfuric acid, or a betaine is preferably used.

Specific examples of the salt of organic sulfonic acid include sodium n-butylsulfonate, sodium isobutylsulfonate, sodium sec-butylsulfonate, sodium tert-butylsulfonate, sodium n-pentylsulfonate, sodium 1-ethylpropylsulfonate, sodium n-hexylsulfonate, sodium 1,2-dimethylpropylsulfonate, sodium 2-ethylbutylsulfonate, sodium 2-ethylhexylsulfonate, sodium cyclohexylsulfonate, sodium n-heptylsulfonate, sodium n-octylsulfonate, sodium tert-octylsulfonate, sodium n-nonylsulfonate, sodium allylsulfonate, sodium 2-methylallylsulfonate, sodium 4-[2-(2-butyloxyethoxy)ethoxy]butane-1-sulfonate, sodium 4-[2-(2-hexyloxyethoxy)ethoxy]butane-1-sulfonate, sodium 4-{2-[2-(2-ethyl)hexyloxyethoxy]ethoxy}butane-1-sulfonate, sodium 4-[2-(2-decyloxyethoxy)ethoxy]butane-1-sulfonate, sodium 4-{2-[2-(2-butyloxyethoxy)ethoxy]ethoxy}butane-1-sulfonate, sodium 4-[2-{2-[2-(2-ethyl)hexyloxyethoxy]ethoxy}ethoxy]butane-1-sulfonate, sodium benzenesulfonate, sodium p-toluenesulfonate, sodium p-hydroxybenzenesulfonate, sodium p-styrenesulfonate, sodium isophthalic acid dimethyl-5-sulfonate, disodium 1,3-benzenedisulfonate, trisodium 1,3,5-benzenetrisulfonate, sodium p-chlorobenzenesulfonate, sodium 3,4-dichlorobenzenesulfonate, sodium 1-naphtylsulfonate, sodium 2-naphtylsulfonate, sodium 4-hydroxynaphtylsulfonate, disodium 1,5-naphtyldisulfonate, disodium 2,6-naphtyldisulfonate, trisodium 1,3,6-naphtyltrisulfonate and lithium salts of these compounds wherein the sodium is exchanged with lithium.

Specific examples of the salt of organic sulfamic acid include sodium n-butylsulfamate, sodium isobutylsulfamate, sodium tert-butylsulfamate, sodium n-pentylsulfamate, sodium 1-ethylpropylsulfamate, sodium n-hexylsulfamate, sodium 1,2-dimethylpropylsulfamate, sodium 2-ethylbutylsulfamate, sodium cyclohexylsulfamate and lithium salts of these compounds wherein the sodium is exchanged with lithium.

The hydrophilic low molecular weight compound has the hydrophobic portion of a small structure and almost no surface active function and thus, it can be clearly distinguished from the surfactant described hereinbefore in which a long-chain alkylsulfonate or a long-chain alkylbenzenesulfonate is preferably used.

As the organic sulfate, a compound represented by formula (iii) shown below is particularly preferably used.

(iii)

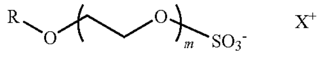

In formula (iii), R represents an alkyl group, an alkenyl group, an alkynyl group, an aryl group or a heterocyclic group, m represents an integer of 1 to 4, and X represents sodium, potassium or lithium.

R in formula (iii) preferably represents a straight-chain, branched or cyclic alkyl group having from 1 to 12 carbon atoms, an alkenyl group having from 1 to 12 carbon atoms, an alkynyl group having from 1 to 12 carbon atoms or an aryl group having 20 or less carbon atoms. These groups may have a substituent. Examples of the substituent capable of being introduced include a straight-chain, branched or cyclic alkyl group having from 1 to 12 carbon atoms, an alkenyl group having from 1 to 12 carbon atoms, an alkynyl group having from 1 to 12 carbon atoms, a halogen atom and an aryl group having 20 or less carbon atoms.

Preferable examples of the compound represented by formula (iii) include sodium oxyethylene 2-ethylhexyl ether sulfate, sodium dioxyethylene 2-ethylhexyl ether sulfate, potassium dioxyethylene 2-ethylhexyl ether sulfate, lithium dioxyethylene 2-ethylhexyl ether sulfate, sodium trioxyethylene 2-ethylhexyl ether sulfate, sodium tetraoxyethylene 2-ethylhexyl ether sulfate, sodium dioxyethylene hexyl ether sulfate, sodium dioxyethylene octyl ether sulfate and sodium dioxyethylene lauryl ether sulfate. Most preferable examples thereof include sodium dioxyethylene 2-ethylhexyl ether sulfate, potassium dioxyethylene 2-ethylhexyl ether sulfate and lithium dioxyethylene 2-ethylhexyl ether sulfate.

As the betaine, compounds represented by formulae (iv) and (v) are preferably used.

(iv)

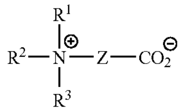

(v)

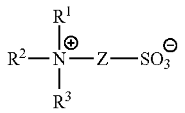

In formulae (iv) and (v), $R^1$ to $R^3$ each independently represents an alkyl group having from 1 to 5 carbon atoms, an alkenyl group, an alkynyl group, a cycloalkyl group or an aryl group, each of which groups may be substituted with a hydroxy group or an amino group, Z represents an alkylene group having from 1 to 4 carbon atoms, which may be substituted with a hydroxy group, or at least two of $R^1$ to $R^3$ and Z may be combined with each other to form a heterocyclic ring. Of the compounds represented by formulae (iv) and (v), it is preferred that $R^1$ to $R^3$ each independently represents an alkyl group having from 1 to 3 carbon atoms or two of $R^1$ to $R^3$ and Z are combined with each other to form a 5-membered or 6-membered heterocyclic ring. In particular, a compound having a quaternary ammonium skeleton in which $R^1$ to $R^3$ in formula (iv) or (v) each independently represents a methyl group or an ethyl group, or a compound having a pyrrolidine skeleton, a piperidine skeleton, a pyridine skeleton or an imidazoline skeleton each of which is formed by combining two of $R^1$ to $R^3$ and Z in formula (iv) or (v) is preferable.

Since the compound represented by formula (iv) or (v) has a small structure of hydrophobic portion and almost no surface active function, degradations of the hydrophobicity and film strength of the image area due to the penetration of dampening water into the exposed area (image area) of the image-recording layer are prevented and thus, the ink receptivity and printing durability of the image-recording layer can be preferably maintained.

The amount of the hydrophilic low molecular weight compound added to the image-recording layer is preferably from 0.5 to 20% by weight, more preferably from 1 to 10% by weight, still more preferably from 2 to 8% by weight, based on the total solid content of the image-recording layer. In the range described above, good on-press development property and good printing durability are achieved.

The hydrophilic low molecular weight compounds may be used individually or as a mixture of two or more thereof.

(9) Oil-Sensitizing Agent

In the case where an inorganic stratiform compound is incorporated into a protective layer described hereinafter, in order to improve the ink-receptive property, an oil-sensitizing agent, for example, a phosphonium compound, a nitrogen-containing low molecular weight compound or an ammonium group-containing polymer can be used into the image-recording layer.

These compounds function as a surface covering agent (oil-sensitizing agent) of the inorganic stratiform compound and prevents deterioration of the ink-receptive property during printing due to the inorganic stratiform compound.

As preferable examples of the phosphonium compound, compounds represented by formula (K1) shown below described in JP-A-2006-297907 and compounds represented by formula (K2) shown below described in JP-A-2007-50660 are exemplified.

(K1)

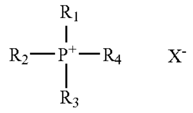

(K2)

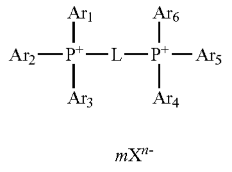

In formula (K1), $R_1$ to $R_4$ each independently represents an alkyl group, an alkenyl group, an alkynyl group, a cycloalkyl group, an alkoxy group, an aryl group, an aryloxy group, an alkylthio group or a heterocyclic group, each of which may have a substituent, or a hydrogen atom, alternatively, at least two of $R_1$ to $R_4$ may be combined with each other to form a ring, and $X^-$ represents a counter anion.

In formula (K2), $Ar_1$ to $Ar_6$ each independently represents an aryl group or a heterocyclic group, L represents a divalent connecting group, $X^{n-}$ represents a n-valent counter anion, n represents an integer of 1 to 3, and m represents a number satisfying $n \times m = 2$.

The aryl group preferably includes, for example, a phenyl group, a naphthyl group, a tolyl group, a xylyl group, a fluorophenyl group, a chlorophenyl group, a bromophenyl group, a methoxyphenyl group, an ethoxyphenyl group, a dimethoxyphenyl group, a methoxycarbonylphenyl group and a dimethylaminophenyl group. The heterocyclic group preferably includes, for example, a pyridyl group, a quinolyl group, a pyrimidinyl group, a thienyl group and a furyl group. L preferably represents a divalent connecting group having from 6 to 15 carbon atoms, more preferably a divalent connecting group having from 6 to 12 carbon atoms. $X^{n-}$ preferably represents a halide anion, for example, $Cl^-$, $Br^-$ or $I^-$, a sulfonate anion, for example, toluenesulfonate, naphthalene-1,7-disulfonate, naphthalene-1,3,6-trisulfonate or 5-benzoyl-4-hydroxy-2-methoxybenzene-4-sulfonate, a carboxylate anion, a sulfate ester anion, a sulfate anion, $PF_6^-$, $BE_4^-$ and a perchlorate anion. Among them, a sulfonate anion is particularly preferable.

Specific examples of the phosphonium compound represented by formula (K1) or (K2) are set forth below.

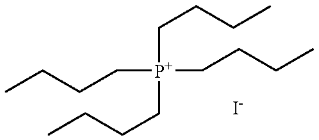

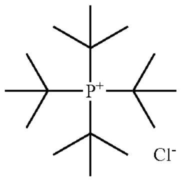

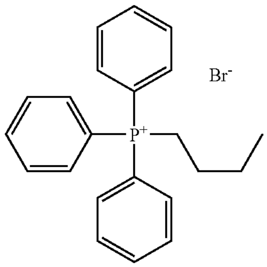

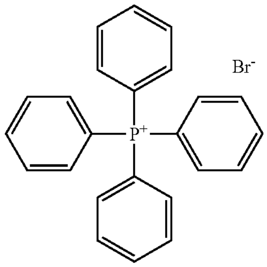

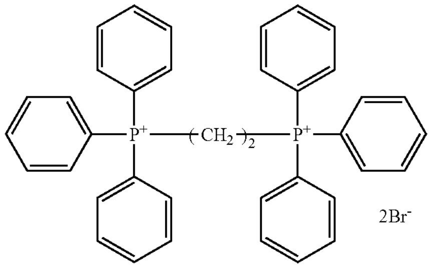

-continued

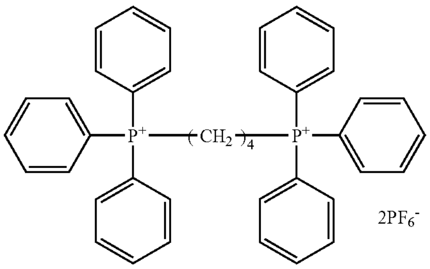

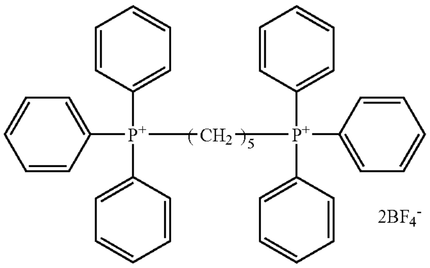

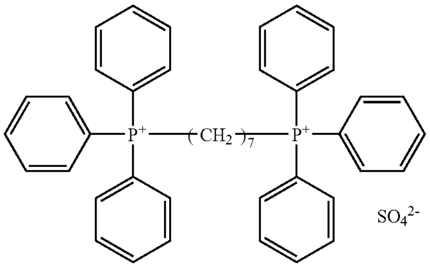

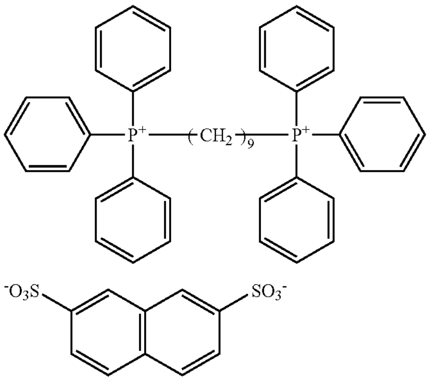

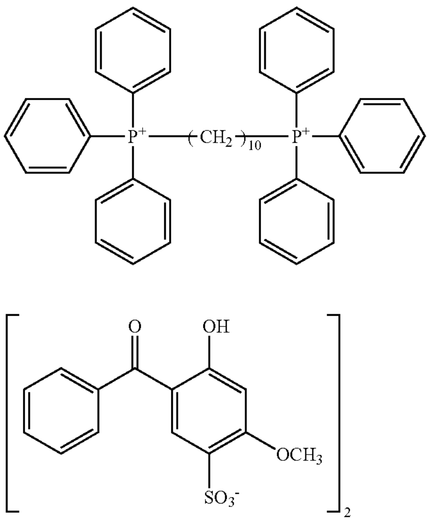

-continued

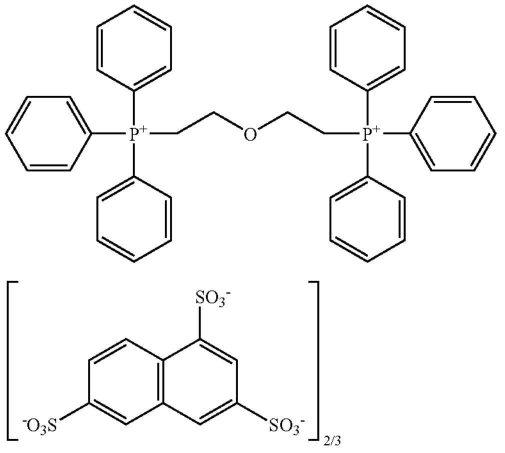

A nitrogen-containing low molecular weight compound described below is also exemplified as the oil-sensitizing agent, which is preferably used in the invention, as well as the phosphonium compound described above. Preferable examples of the nitrogen-containing low molecular weight compound include compounds having a structure represented by formula (K3) shown below.

(K3)

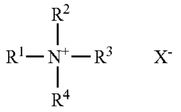

In formula (K3), $R^1$ to $R^4$ each independently represents an alkyl group, an alkenyl group, an alkynyl group, a cycloalkyl group, an alkoxy group, an aryl group, an aralkyl group or a heterocyclic group, each of which may have a substituent, or a hydrogen atom, alternatively, at least two of $R^1$ to $R^4$ may be combined with each other to form a ring, and $X^-$ represents an anion including $PF_6^-$, $BF_4^-$ or an organic sulfonate anion having a substituent selected from an alkyl group, an alkenyl group, an alkynyl group, a cycloalkyl group, an alkoxy group, an aryl group, an aralkyl group and a heterocyclic group.

Specifically, the nitrogen-containing low molecular weight compound for use in the invention includes an amine salt in which at least one of $R^1$ to $R^4$ in formula (K3) is a hydrogen atom, a quaternary ammonium salt in which any of $R^1$ to $R^4$ in formula (K3) is not a hydrogen atom. Also, it may have a structure of an imidazolinium salt represented by formula (K4) shown below, of a benzimidazolinium salt represented by formula (K5) shown below, of a pyridinium salt represented by formula (K6) shown below, or of a quinolinium salt represented by formula (K7) shown below.

(K4)

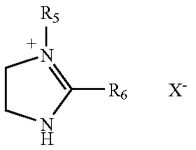

-continued (K5)

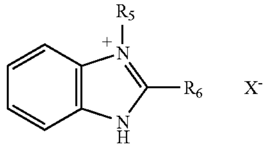

(K6)

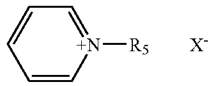

(K7)

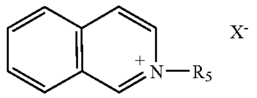

In the above formulae, $R_5$ and $R_6$ each independently represents an alkyl group, an alkenyl group, an alkynyl group, a cycloalkyl group, an alkoxy group, an aryl group, an aralkyl group or a heterocyclic group, each of which may have a substituent, or a hydrogen atom, and $X^-$ represents an anion having the same meaning as $X^-$ in formula (K3).

Of the nitrogen-containing low molecular weight compounds, the quaternary ammonium salt and pyridinium salt are preferably used. Specific examples thereof are set forth below.

(A-1)

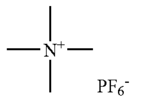

(A-2)

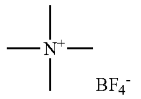

(A-3)

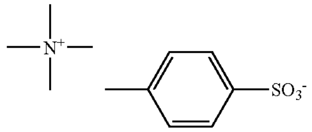

(A-4)

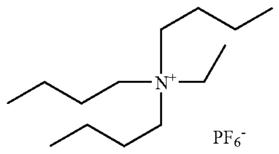

(A-5)

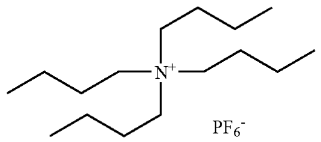

(A-6)

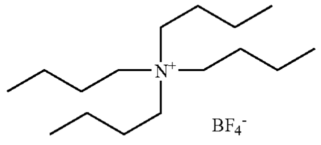

-continued
(A-7)
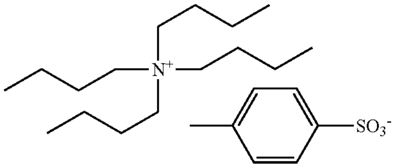
(A-8)
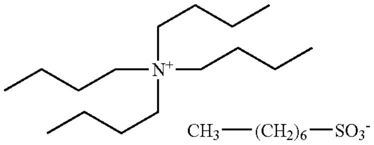
$CH_3—(CH_2)_6—SO_3^-$
(A-9)
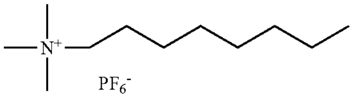
$PF_6^-$
(A-10)
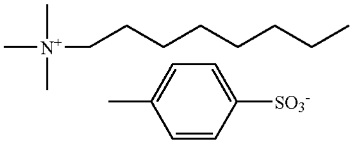
(A-11)
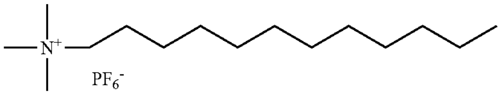
$PF_6^-$
(A-12)
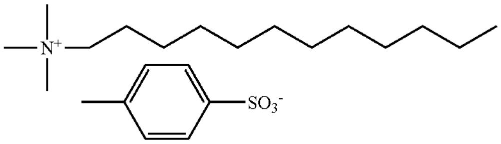
(A-13)
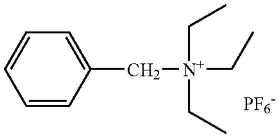
$PF_6^-$
(A-14)
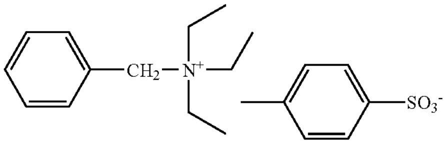
(A-15)
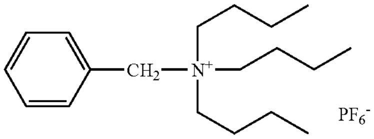
$PF_6^-$
(A-16)
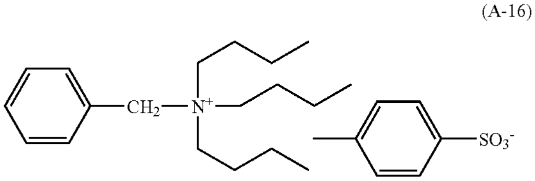
(A-17)
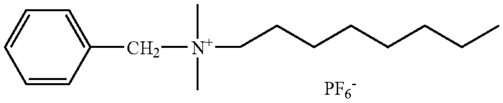
$PF_6^-$
-continued
(A-18)
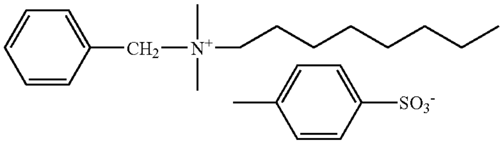
(A-19)
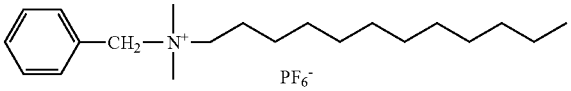
$PF_6^-$
(A-20)
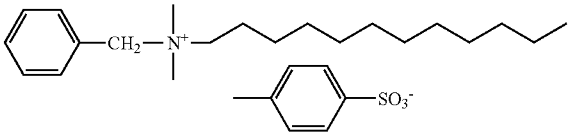
(A-21)
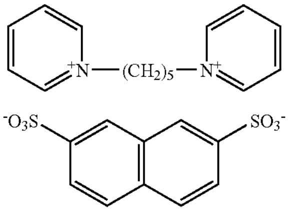
(A-22)
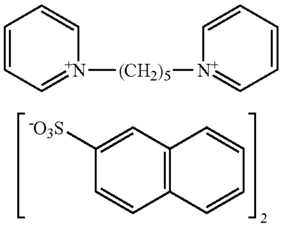
(A-23)
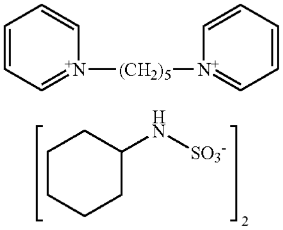
(A-24)
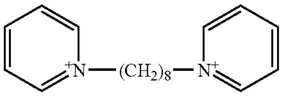
$[C_7H_{15}SO_3^-]_2$
(A-25)
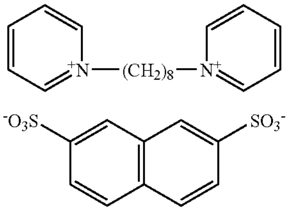

-continued (A-26)

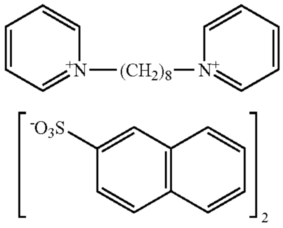

(A-27)

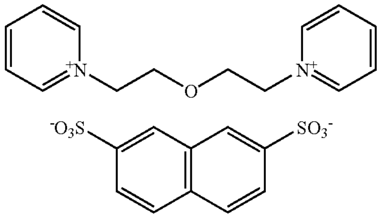

(A-28)

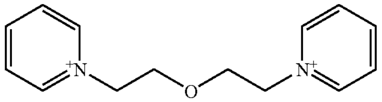

$[C_7H_{15}SO_3^-]_2$ (A-29)

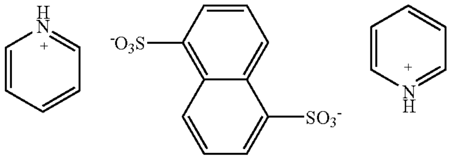

(P-1)

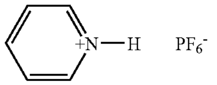

(P-2)

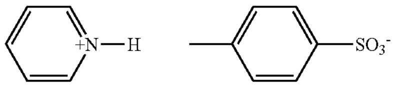

(P-3)

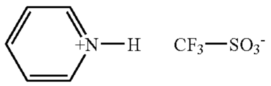

(P-4)

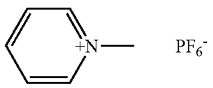

(P-5)

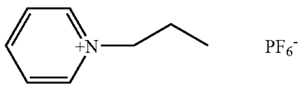

(P-6)

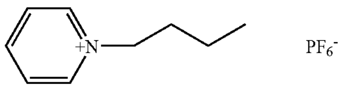

(P-7)

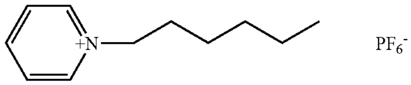

(P-8)

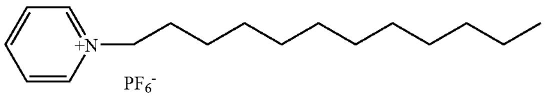

-continued (P-9)

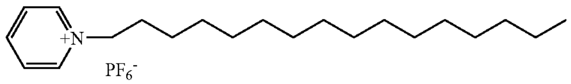

(P-10)

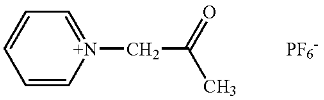

(P-11)

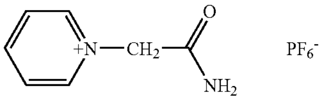

(P-12)

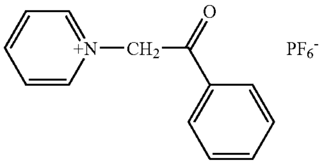

(P-13)

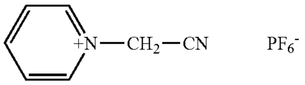

(P-14)

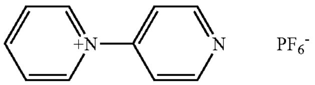

The amount of the phosphonium compound or nitrogen-containing low molecular weight compound added to the image-recording layer is preferably from 0.01 to 20% by weight, more preferably from 0.05 to 10% by weight, most preferably from 0.1 to 5% by weight, based on the solid content of the image-recording layer. In the range described above, good ink-receptive property during printing is obtained.

As the oil-sensitizing agent for use in the invention, an ammonium group-containing polymer described below is also preferably exemplified. The ammonium group-containing polymer may be any polymer containing an ammonium group in its structure and is preferably a polymer containing as repeating units, a structure represented by formula (K8) shown below and a structure represented by formula (K9) shown below.

(K8)

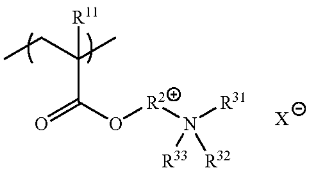

(K9)

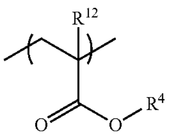

In formulae (K8) and (K9), $R^{11}$ and $R^{12}$ each independently represents a hydrogen atom or a methyl group, $R^2$ represents a divalent connecting group, for example, an alkylene group which may have a substituent or an alkyleneoxy group which may have a substituent, $R^{31}$, $R^{32}$ and $R^{33}$ each independently represents an alkyl group having from 1 to 10 carbon atoms or an aralkyl group, $X^-$ represents an organic or inorganic anion, for example, $F^-$, $Cl^-$, $Br^-$, $I^-$, a benzenesulfonate anion which may have a substituent, a methylsulfate anion, an ethylsulfate anion, a propylsulfate anion, a butylsulfate anion which may be branched, an amylsulfate anion which may be branched, $PF_6^-$, $BF_4^-$ or $B(C_6F_5)_4^-$, $R^4$ represents an alkyl group having from 1 to 21 carbon atoms, an aralkyl group, an aryl group, —$(C_2H_4O)_n$—$R^5$ or —$(C_3H_6O)_n$—$R^5$, $R^5$ represents a hydrogen atom, a methyl group or an ethyl group, and n represents 1 or 2.

The ammonium group-containing polymer includes at least one of the structural units represented by formula (K8) and at least one of the structural units represented by formula (K9), and it may include two or more of the structural units represented by formula (K8) or (K9) or both. A ratio of the both structural units is not particularly restricted and is particularly preferably from 5:95 to 80:20 in a molar ratio. The polymer may include other copolymerization component within a range of ensuring the effects of the invention.

As to the ammonium group-containing polymer, a reduced specific viscosity value (unit: cSt/g/ml) obtained according to the measuring method described below is preferably from 5 to 120, more preferably from 10 to 110, particularly preferably from 15 to 100.

<Measuring Method of Reduced Specific Viscosity>

In a 20 ml measuring flask was weighed 3.33 g of a 30% by weight polymer solution (1 g as a solid content) and the measuring flask was filled up to the gauge line with N-methylpyrrolidone. The resulting solution was put into an Ubbelohde viscometer (viscometer constant: 0.010 cSt/s) and a period for running down of the solution at 30° C. was measured. The viscosity was determined in a conventional manner according to the following calculating formula:

Kinetic viscosity=Viscometer constant×Period for liquid to pass through a capillary (sec)

The content of the ammonium group-containing polymer is preferably from 0.0005 to 30.0% by weight, more preferably from 0.001 to 20.0% by weight, most preferably from 0.002 to 15.0% by weight, based on the total solid content of the image-recording layer. In the range described above, good ink-receptive property is obtained. The ammonium group-containing polymer may further be incorporated into a protective layer.

Specific examples of the ammonium group-containing polymer are set forth below.

(1)

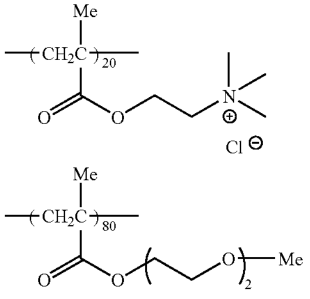

-continued (2)

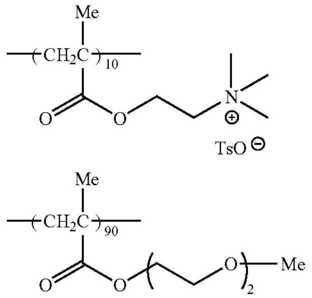

(3)

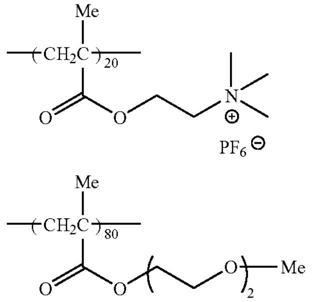

(4)

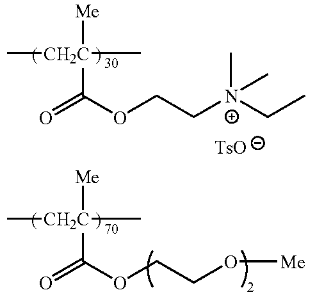

(5)

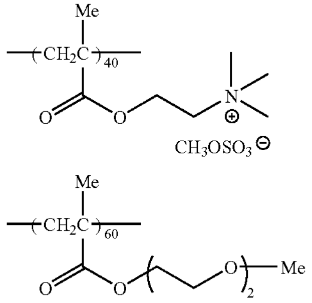

(6)

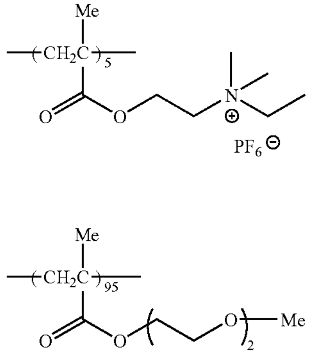

-continued
(7)
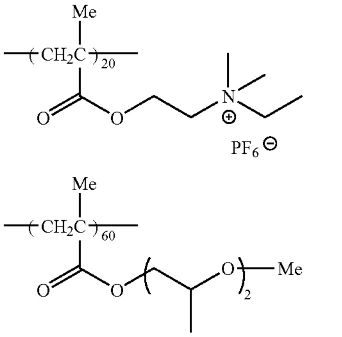
(8)
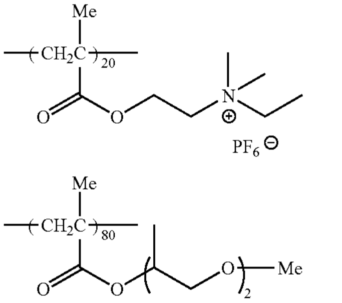
(9)
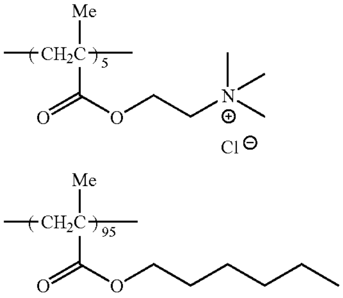
(10)
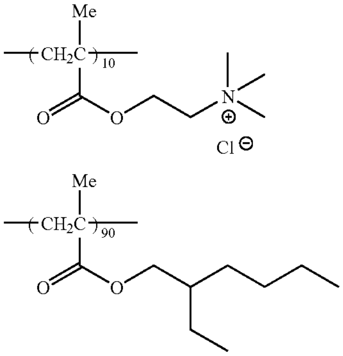
(11)
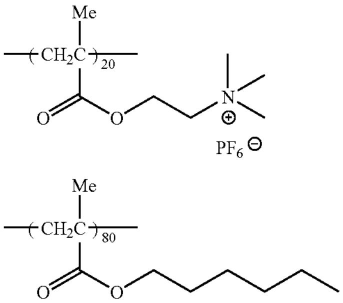
-continued
(12)
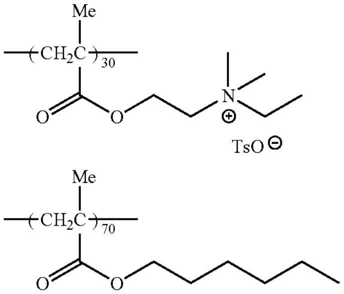
(13)
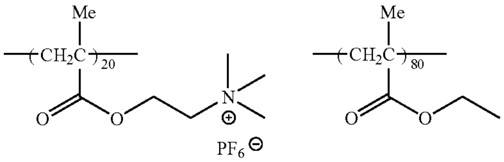
(14)
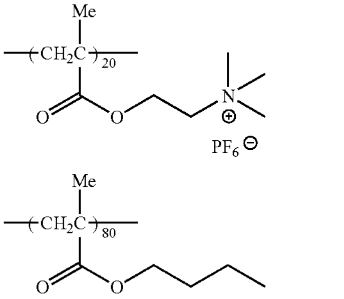
(15)
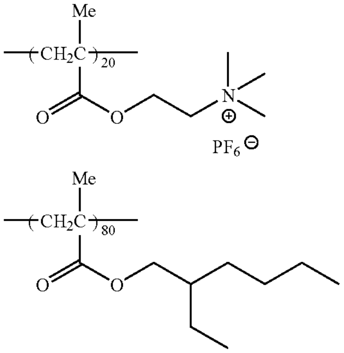
(16)
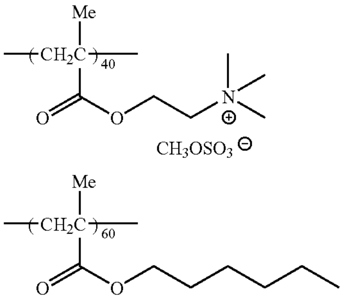
(17)
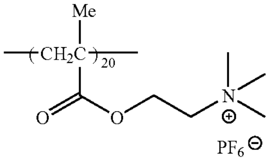

-continued

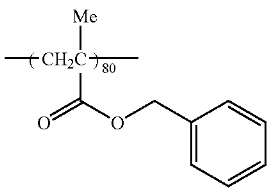

(18)

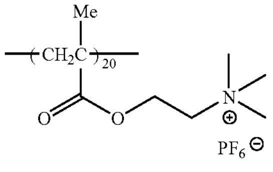

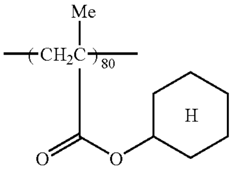

(19)

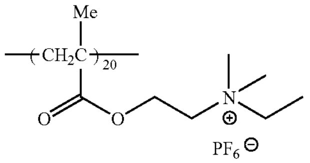

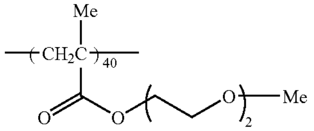

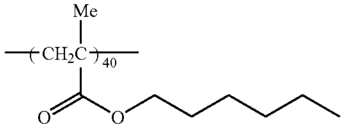

(20)

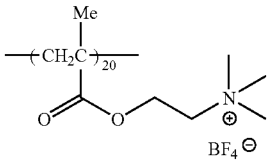

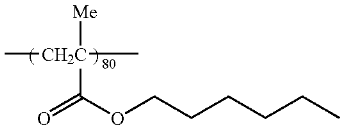

(21)

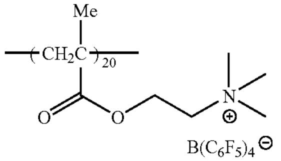

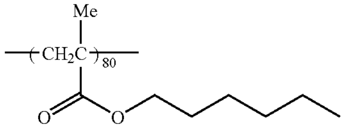

(22)

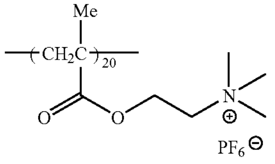

-continued

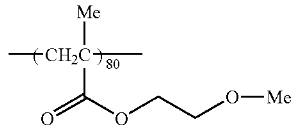

(23)

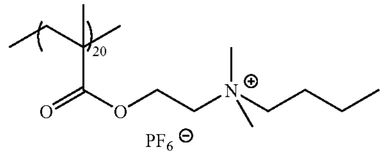

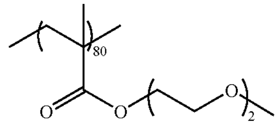

(24)

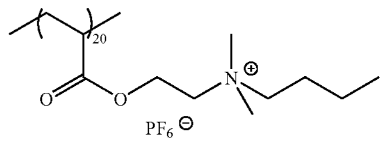

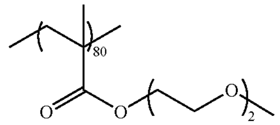

(25)

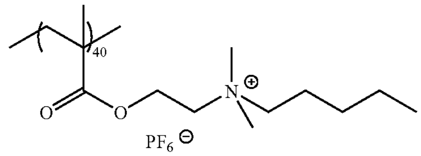

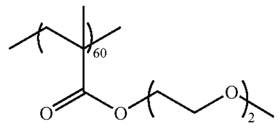

<Formation of Image-Recording Layer>

The image-recording layer according to the invention is formed by dispersing or dissolving each of the necessary constituting components described above in a solvent to prepare a coating solution and coating the solution on a support and drying.

The solvent used include, for example, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene and water, but the invention should not be construed as being limited thereto. The solvents may be used individually or as a mixture. The solid content concentration of the coating solution is preferably from 1 to 50% by weight.

As to the image-recording layer according to the invention, it is also possible to form the image-recording layer of multilayer structure by preparing plural coating solutions by dispersing or dissolving the same or different constituting components described above into the same or different solvents and conducting repeatedly the coating and drying plural times.

The coating amount (solid content) of the image-recording layer formed on a support after coating and drying may be varied according to the intended purpose but is ordinarily preferably from 0.3 to 3.0 $g/m^2$. In the range described above, good sensitivity and good film property of the image-recording layer can be achieved.

Various methods can be used for the coating. Examples of the coating method include bar coater coating, spin coating, spray coating, curtain coating, dip coating, air knife coating, blade coating and roll coating.

(Undercoat Layer)

In the lithographic printing plate precursor, an undercoat layer (also referred to as an intermediate layer) is provided between the support and the image-recording layer, if desired. The undercoat layer strengthens adhesion between the support and the image-recording layer in the exposed area and makes removal of the image-recording layer from the support in the unexposed area easy, thereby contributing improvement in the developing property without accompanying degradation of the printing durability. Further, it is advantageous that in the case of infrared laser exposure, since the undercoat layer acts as a heat insulating layer, heat generated upon the exposure does not diffuse into the support and is efficiently utilized and as a result, the increase in sensitivity can be achieved. The components used in the undercoat layer according to the invention are described below.

As a compound for undercoat layer, specifically, for example, a silane coupling agent having an addition-polymerizable ethylenic double bond reactive group described in JP-A-10-282679 and a phosphorus compound having an ethylenic double bond reactive group described in JP-A-2-304441 are preferably exemplified.

As the most preferable compound for undercoat layer, a polymer resin having an adsorbing group, a hydrophilic group and a crosslinkable group is exemplified. The polymer resin is preferably obtained by copolymerization of a monomer having an adsorbing group, a monomer having a hydrophilic group and a monomer having a crosslinkable group.

The polymer resin for undercoat layer preferably has an adsorbing group to the hydrophilic surface of support. Whether adsorptivity to the hydrophilic surface of support is present or not can be judged, for example, by the following method.

A test compound is dissolved in an easily soluble solvent to prepare a coating solution, and the coating solution is coated and dried on a support so as to have the coating amount after drying of 30 $mg/m^2$. After thoroughly washing the support coated with the test compound using the easily soluble solvent, the residual amount of the test compound that has not been removed by the washing is measured to calculate the adsorption amount of the test compound to the support. For measuring the residual amount, the residual amount of the test compound may be directly determined, or may be calculated by determining the amount of the test compound dissolved in the washing solution. The determination for the test compound can be performed, for example, by X-ray fluorescence spectrometry measurement, reflection absorption spectrometry measurement or liquid chromatography measurement. The compound having the adsorptivity to support is a compound that remains by 1 $mg/m^2$ or more even after conducting the washing treatment described above.

The adsorbing group to the hydrophilic surface of support is a functional group capable of forming a chemical bond (for example, an ionic bond, a hydrogen bond, a coordinate bond or a bond with intermolecular force) with a substance (for example, metal or metal oxide) or a functional group (for example, a hydroxy group) present on the hydrophilic surface of support. The adsorbing group is preferably an acid group or a cationic group.

The acid group preferably has an acid dissociation constant (pKa) of 7 or less. Examples of the acid group include a phenolic hydroxy group, a carboxyl group, $—SO_3H$, $—OSO_3H$, $—PO_3H_2$, $—OPO_3H_2$, $—CONHSO_2—$, $—SO_2NHSO_2—$ and $—COCH_2COCH_3$. Among them, $—OPO_3H_2$ and $—PO_3H_2$ are particularly preferred. The acid group may be the form of a metal salt.

The cationic group is preferably an onium group. Examples of the onium group include an ammonium group, a phosphonium group, an arsonium group, a stibonium group, an oxonium group, a sulfonium group, a selenonium group, a stannonium group and iodonium group. Among them, the ammonium group, phosphonium group and sulfonium group are preferred, the ammonium group and phosphonium group are more preferred, and the ammonium group is most preferred.

Particularly preferable examples of the monomer having the adsorbing group which can be used in synthesis of the polymer resin suitable for the compound for undercoat layer include a compound represented by the following formula (U1) or (U2):

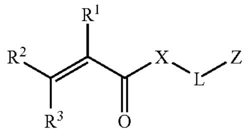

(U1)

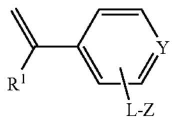

(U2)

In formulae (U1) and (U2), $R^1$, $R^2$ and $R^3$ each independently represents a hydrogen atom, halogen atom or an alkyl group having from 1 to 6 carbon atoms.

$R^1$, $R^2$ and $R^3$ each independently represents preferably a hydrogen atom or an alkyl group having from 1 to 6 carbon atoms, more preferably a hydrogen atom or an alkyl group having from 1 to 3 carbon atoms, most preferably a hydrogen atom or a methyl group. It is particularly preferred that $R^2$ and $R^3$ each represents a hydrogen atom.

Z represents a functional group adsorbing to the hydrophilic surface of support. With respect to the adsorbing functional group, the above description on the adsorbing group can be referred to.

In formulae (U1) and (U2), L represents a single bond or a divalent connecting group. It is preferred that L represents a divalent aliphatic group (for example, an alkylene group, a substituted alkylene group, an alkenylene group, a substituted alkenylene group, an alkinylene group or a substituted alkinylene group), a divalent aromatic group (for example, an arylene group or a substituted arylene group), a divalent heterocyclic group or a combination of each of these groups with an oxygen atom (—O—), a sulfur atom (—S—), an imino group (—NH—), a substituted imino group (—NR—, where R represents an aliphatic group, an aromatic group or a heterocyclic group) or a carbonyl group (—CO—).

The divalent aliphatic group may have a cyclic structure or a branched structure. The number of carbon atoms of the divalent aliphatic group is preferably from 1 to 20, more preferably from 1 to 15, most preferably from 1 to 10. It is preferred that the divalent aliphatic group is a saturated aliphatic group rather than an unsaturated aliphatic group. The divalent aliphatic group may have a substituent. Examples of the substituent include a halogen atom, a hydroxy group, an aromatic group and a heterocyclic group.

The number of carbon atoms of the divalent aromatic group is preferably from 6 to 20, more preferably from 6 to 15, most preferably from 6 to 10. The divalent aromatic group may have a substituent. Examples of the substituent include a halogen atom, a hydroxy group, an aliphatic group, an aromatic group and a heterocyclic group.

It is preferred that the divalent heterocyclic group has a 5-membered or 6-membered ring as the hetero ring. Other heterocyclic ring, an aliphatic ring or an aromatic ring may be condensed to the heterocyclic ring. The divalent heterocyclic group may have a substituent. Examples of the substituent include a halogen atom, a hydroxy group, an oxo group (=O), a thioxo group (=S), an imino group (=NH), a substituted imino group (=N—R, where R represents an aliphatic group, an aromatic group or a heterocyclic group), an aliphatic group, an aromatic group and a heterocyclic group.

It is preferred that L represents a divalent connecting group containing a plurality of polyoxyalkylene structures in the invention. It is more preferred that the polyoxyalkylene structure is a polyoxyethylene structure. Specifically, it is preferred that L contains $—(OCH_2CH_2)_n—$ (n is an integer of 2 or more).

In formula (U1), X represents an oxygen atom (—O—) or imino group (—NH—). Preferably, X represents an oxygen atom.

In formula (U2), Y represents a carbon atom or a nitrogen atom. In the case where Y is a nitrogen atom and L is connected to Y to form a quaternary pyridinium group, Z is not mandatory and may represents a hydrogen atom because the quaternary pyridinium group itself exhibits the adsorptivity.

Representative examples of the compound represented by formula (U1) or (U2) are set forth below.

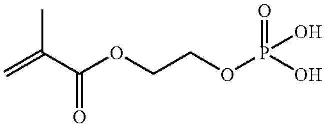

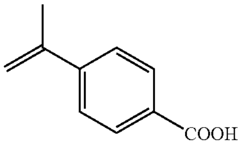

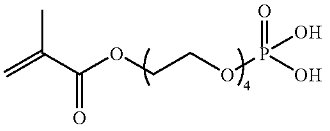

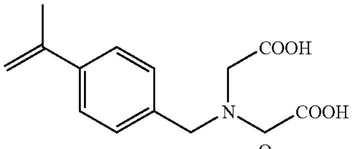

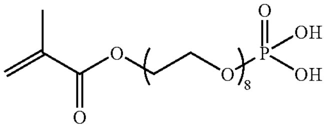

-continued

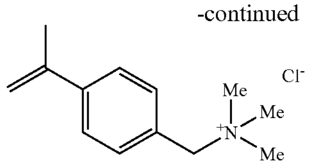

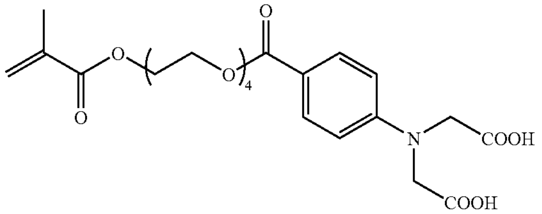

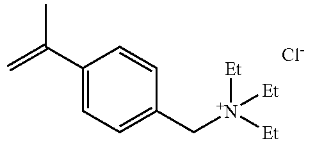

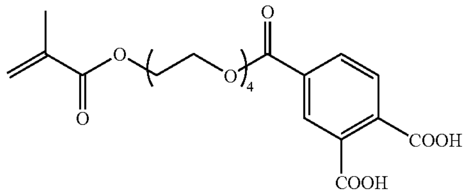

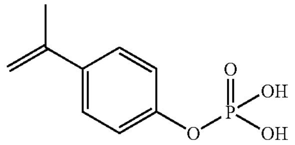

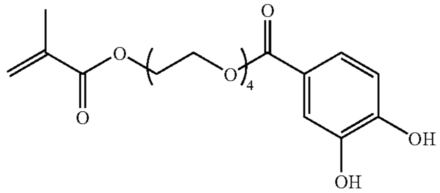

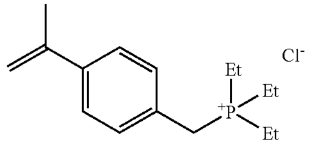

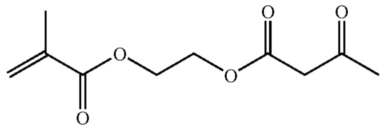

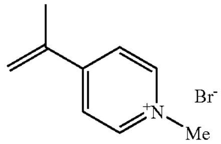

The polymer resin suitable for the compound for undercoat layer preferably has a hydrophilic group. The hydrophilic group preferably includes, for example, a hydroxy group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group and a phosphoric acid group. Among them, a sulfo group exhibiting a highly hydrophilic property is preferable.

Specific examples of the monomer having a sulfo group include a sodium salt or amine salt of methallyloxybenzenesulfonic acid, allyloxybenzenesulfonic acid, allylsulfonic acid, vinylsulfonic acid, p-styrenesulfonic acid, methallylsulfonic acid, acrylamido-tert-butylsulfonic acid, 2-acrylamido-2-methylpropanesulfonic acid or (3-acryloyloxypropyl)buthylsulfonic acid. Among them, from the standpoint of the hydrophilic property and handling property in the synthesis thereof, sodium salt of 2-acrylamido-2-methylpropanesulfonic acid is preferable.

Such a monomer is preferably used in the synthesis of the polymer resin suitable for the compound for undercoat layer.

The polymer resin for undercoat layer according to the invention preferably has a crosslinkable group. The crosslinkable group acts to improve the adhesion property to the image area. In order to impart the crosslinking property to the polymer resin for undercoat layer, introduction of a crosslinkable functional group, for example, an ethylenically unsaturated bond into the side chain of the polymer or introduction by formation of a salt structure between a polar substituent of the polymer resin and a compound containing a substituent having a counter charge to the polar substituent of the polymer resin and an ethylenically unsaturated bond is used.

Examples of the polymer having the ethylenically unsaturated bond in the side chain thereof include a polymer of an ester or amide of acrylic acid or methacrylic acid, wherein the ester or amide residue (R in —COOR or —CONHR) has the ethylenically unsaturated bond.

Examples of the residue (R described above) having an ethylenically unsaturated bond include $-(CH_2)_nCR^1=CR^2R^3$, $-(CH_2O)_nCH_2CR^1=CR^2R^3$, $-(CH_2CH_2O)_nCH_2CR^1=CR^2R^3$, $-(CH_2)_nNH-CO-O-CH_2CR^1=CR^2R^3$, $-(CH_2)_n-O-CO-CR^1=R^2R^3$ and $-(CH_2CH_2O)_2-X$ (wherein $R^1$ to $R^3$ each represents a hydrogen atom, a halogen atom or an alkyl group having from 1 to 20 carbon atoms, an aryl group, alkoxy group or aryloxy group, or $R^1$ and $R^2$ or $R^1$ and $R^3$ may be combined with each other to form a ring. n represents an integer of 1 to 10. X represents a dicyclopentadienyl residue).

Specific examples of the ester residue include $-CH_2CH=CH_2$ (described in JP-B-7-21633) $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2CH_2NHCOO-CH_2CH=CH_2$ and $-CH_2CH_2O-X$ (wherein X represents a dicyclopentadienyl residue).

Specific examples of the amide residue include $-CH_2CH=CH_2$, $-CH_2CH_2O-Y$ (wherein Y represents a cyclohexene residue) and $-CH_2CH_2OCO-CH=CH_2$.

As a monomer having a crosslinkable group for the polymer resin for undercoat layer, an ester or amide of acrylic acid or methacrylic acid having the crosslinkable group described above is preferably used.

The content of the crosslinkable group (content of the radical polymerizable unsaturated double bond determined by iodine titration) in the polymer resin for undercoat layer is preferably from 0.1 to 10.0 mmol, more preferably from 1.0 to 7.0 mmol, most preferably from 2.0 to 5.5 mmol, based on 1 g of the polymer resin. In the range described above, preferable compatibility between the sensitivity and stain resistance and good preservation stability can be achieved.

The weight average molecular weight of the polymer resin for undercoat layer is preferably 5,000 or more, more preferably from 10,000 to 300,000. The number average molecular weight of the polymer resin is preferably 1,000 or more, more preferably from 2,000 to 250,000. The polydispersity (weight average molecular weight/number average molecular weight) thereof is preferably from 1.1 to 10.

The polymer resin for undercoat layer may be any of a random polymer, a block polymer, a graft polymer and the like, and is preferably a random polymer.

The polymer resins for undercoat layer may be used individually or in a mixture of two or more thereof.

The undercoat layer according to the invention may include a secondary or a tertiary amine or a polymerization inhibitor in order to prevent the occurrence of stain due to preservation of the lithographic printing plate precursor. Examples of the secondary or tertiary amine include imidazole, 4-dimethylaminopyridine, 4-dimethylaminobenzaldehyde, tris(2-hydroxy-1-methyl)amine, 1,4-diazobicyclo[2,2,2]octane (DABCO), 1,5,7-triazabicyclo[4,4,0]deca-5-ene, 1,8-diazobicyclo[5,4,0]undeca-7-ene, 1,10-phenanthroline, 1,8-bis(dimethylamino)naphthalene, 4,4'-bis(dimethylamino)biphenyl, diphenylamine, 1,3-diphenylguanidine, 4-phenylpyridine and N,N'-ethylenebis(2,2,5,5-tetramethylpyrrolidine).

The polymerization inhibitor includes known thermal polymerization inhibitors. Preferable examples of the polymerization inhibitor include compounds selected from the group consisting of a phenolic hydroxy group-containing compound, a quinone compound, an N-oxide compound, a pyridine-1-oxyl free radical compound, a pyrrolidine-1-oxyl free radical compound, an N-nitrosophenylhydroxylamine compound, a diazonium compound, a cationic dye, a sulfido group-containing compound, a nitro group-containing compound and a transition metal compound, for example, $FeCl_3$ or $CuCl_2$. Of the compounds, the quinone compound is particularly preferable. Specific examples of the quinone compound include 1,4-benzoquinine, 2,3,5,6-tetrahydroxy-1,4-benzoquinine, 2,5-dihydroxy-1,4-benzoquinine, chloranil, 2,3-dichloro-5,6-dicyano-1,4-benzoquinine, naphthoquinone, 2-fluoro-1,4-naphthoquinone, 2-hydroxyethyl-1,4-naphthoquinone, anthraquinone, 1,2,4-trihydroxyanthraquinone and 2,6-dihydroxyanthraquinone.

The amount of such a compound added to the undercoat layer is preferably from 10 to 90% by weight, more preferably from 20 to 80% by weight, most preferably from 30 to 70% by weight, to the constituting component of the undercoat layer.

As a compound effective for preventing the occurrence of stain, a compound having an amino group or a functional group having a polymerization inhibiting function and a group capable of interacting with the surface of aluminum support can also be used. Examples of the group capable of interacting with the surface of aluminum support include a trialkoxysilyl group, an onium group and an acid group selected from a phenolic hydroxy group, a carboxyl group, $-SO_3H$, $-OSO_3H$, $-PO_3H_2$, $-OPO_3H_2$, $-CONHSO_2-$, $-SO_2NHSO_2-$ and $-COCH_2CO-$ and a metal salt thereof.

Examples of the compound having an amino group and a group capable of interacting with the surface of aluminum support include a salt of 1,4-diazobicyclo[2,2,2]octane and an acid, a compound containing at least one 4-aza-1-azoniabicyclo[2,2,2]octane structure (for example, 1-methyl-4-aza-1-azoniabicyclo[2,2,2]octane p-toluenesulfonate), ethylenediaminetetraacetic acid, hydroxyenediaminetriacetic acid, dihydroxyenediaminediacetic acid, 1,3-propanediaminetetraacetic acid, diethylenetriaminepentaacetic acid, triethylenetetraminehexaacetic acid and hydroxyethyliminodiacetic acid. Examples of the compound having a functional group having a polymerization inhibiting function and a group capable of interacting with the surface of aluminum support include 2-trimethoxysilylpropylthio-1,4-benzoquinone, 2,5-bis(timethoxysilylpropylthio)-1,4-benzoquinone, 2-carboxyanthraquinone and 2-trimethylammonioanthraquinone chloride.

A coating solution for undercoat layer is obtained by dissolving the polymer resin for undercoat layer and necessary additives in an organic solvent (for example, methanol, ethanol, acetone or methyl ethyl ketone) and/or water. The coating solution for undercoat layer may contain an infrared absorbing agent.

In order to coat the coating solution for undercoat layer on the support, various known methods can be used. Examples of the method include bar coater coating, spin coating, spray coating, curtain coating, dip coating, air knife coating, blade coating and roll coating.

The coating amount (solid content) of the undercoat layer is preferably from 0.1 to 100 mg/$m^2$, more preferably from 1 to 30 mg/$m^2$.

(Support)

The support for use in the lithographic printing plate precursor according to the invention is not particularly restricted as long as it is a dimensionally stable plate-like material. The support includes, for example, paper, paper laminated with plastic (for example, polyethylene, polypropylene or polystyrene), a metal plate (for example, aluminum, zinc or copper plate), a plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film) and paper or a plastic film laminated or deposited with the metal described above. Preferable examples of the support include a polyester film and an aluminum plate. Among them, the aluminum plate is preferred since it has good dimensional stability and is relatively inexpensive.

The aluminum plate includes a pure aluminum plate, an alloy plate comprising aluminum as a main component and containing a trace amount of hetero elements and a thin film of aluminum or aluminum alloy laminated with plastic. The hetero element contained in the aluminum alloy includes, for example, silicon, iron, manganese, copper, magnesium, chromium, zinc, bismuth, nickel and titanium. The content of the hetero element in the aluminum alloy is preferably 10% by weight or less. Although a pure aluminum plate is preferred in the invention, since completely pure aluminum is difficult to be produced in view of the refining technique, the aluminum plate may slightly contain the hetero element. The composition is not specified for the aluminum plate and those materials conventionally known and used can be appropriately utilized.

The thickness of the support is preferably from 0.1 to 0.6 mm, more preferably from 0.15 to 0.4 mm.

In advance of the use of aluminum plate, a surface treatment, for example, roughening treatment or anodizing treatment is preferably performed. The surface treatment facilitates improvement in the hydrophilic property and ensure for adhesion property between the image-recording layer and the support. Prior to the roughening treatment of the aluminum plate, a degreasing treatment, for example, with a surfactant, an organic solvent or an aqueous alkaline solution is conducted for removing rolling oil on the surface thereof, if desired.

The roughening treatment of the surface of the aluminum plate is conducted by various methods and includes, for example, mechanical roughening treatment, electrochemical roughening treatment (roughening treatment of electrochemically dissolving the surface) and chemical roughening treatment (roughening treatment of chemically dissolving the surface selectively).

As the method of the mechanical roughening treatment, a known method, for example, ball graining, brush graining, blast graining or buff graining can be used. Also, a transfer method can be employed wherein using a roll having concavo-convex shape the concavo-convex shape is transferred to the surface of aluminum plate during a rolling step of the aluminum plate.

The electrochemical roughening treatment method includes, for example, a method of conducting by passing alternating current or direct current in an electrolytic solution containing an acid, for example, hydrochloric acid or nitric acid. Also, a method of using a mixed acid described in JP-A-54-63902 can be exemplified.

The aluminum plate subjected to the roughening treatment is subjected, if desired, to an alkali etching treatment using an aqueous solution, for example, of potassium hydroxide or sodium hydroxide and further subjected to a neutralizing treatment, and then subjected to an anodizing treatment for improving the abrasion resistance, if desired.

As the electrolyte used for the anodizing treatment of the aluminum plate, various electrolytes capable of forming porous oxide film can be used. Ordinarily, sulfuric acid, hydrochloric acid, oxalic acid, chromic acid or a mixed acid thereof is used. The concentration of the electrolyte can be appropriately determined depending on the kind of the electrolyte used.

Since the conditions for the anodizing treatment are varied depending on the electrolyte used, they cannot be defined commonly. However, it is ordinarily preferred that electrolyte concentration in the solution is from 1 to 80% by weight, liquid temperature is from 5 to 70° C., current density is from 5 to 60 A/$dm^2$, voltage is from 1 to 100 V, and electrolysis time is from 10 seconds to 5 minutes. The amount of the anodized film formed is preferably from 1.0 to 5.0 g/$m^2$, more preferably from 1.5 to 4.0 g/$m^2$. In the range described above, good printing durability and good scratch resistance in the non-image area of lithographic printing plate can be achieved.

The aluminum plate subjected to the surface treatment and having the anodized film as described above is used as it is as the support in the invention. However, in order to more improve the adhesion property to a layer provided thereon, hydrophilicity, stain resistance, heat insulating property or the like, other treatment, for example, an enlarging treatment of micropores or a sealing treatment of micropores of the anodized film described in JP-A-2001-253181 and JP-A-2001-322365, or a surface hydrophilizing treatment by immersing in an aqueous solution containing a hydrophilic compound may be appropriately conducted. Needless to say, the enlarging treatment and sealing treatment are not limited to those described in the above-described patents and any conventionally known method may be employed. For instance, as the sealing treatment, as well as a sealing treatment with steam, a sealing treatment with fluorozirconic acid alone, a sealing treatment with sodium fluoride or a sealing treatment with steam having added thereto lithium chloride may be employed.

The sealing treatment for use in the invention is not particularly limited and conventionally known methods can be employed. Among them, a sealing treatment with an aqueous solution containing an inorganic fluorine compound, a sealing treatment with water vapor and a sealing treatment with hot water are preferred. The sealing treatments will be described in more detail below, respectively.

<1> Sealing Treatment with Aqueous Solution Containing Inorganic Fluorine Compound As the inorganic fluorine compound used in the sealing treatment with an aqueous solution containing an inorganic fluorine compound, a metal fluoride is preferably exemplified.

Specific examples thereof include sodium fluoride, potassium fluoride, calcium fluoride, magnesium fluoride, sodium fluorozirconate, potassium fluorozirconate, sodium fluorotitanate, potassium fluorotitanate, ammonium fluorozirconate, ammonium fluorotitanate, potassium fluorotitanate, fluorozirconic acid, fluorotitanic acid, hexafluorosilicic acid, nickel fluoride, iron fluoride, fluorophosphoric acid and ammonium fluorophosphate. Among them, sodium fluorozirconate, sodium fluorotitanate, fluorozirconic acid and fluorotitanic acid are preferred.

The concentration of the inorganic fluorine compound in the aqueous solution is preferably 0.01% by weight or more, more preferably 0.05% by weight or more, in view of performing satisfactory sealing of micropores of the anodized film, and it is preferably 1% by weight or less, more preferably 0.5% by weight or less, in view of the stain resistance.

The aqueous solution containing an inorganic fluorine compound preferably further contains a phosphate compound. When the phosphate compound is contained, the hydrophilicity on the anodized film surface is increased and thus, the on-press development property and stain resistance can be improved.

Preferable examples of the phosphate compound include phosphates of metal, for example, an alkali metal or an alkaline earth metal.

Specific examples of the phosphate compound include zinc phosphate, aluminum phosphate, ammonium phosphate, diammonium hydrogen phosphate, ammonium dihydrogen phosphate, monoammonium phosphate, monopotassium phosphate, monosodium phosphate, potassium dihydrogen phosphate, dipotassium hydrogen phosphate, calcium phosphate, sodium ammonium hydrogen phosphate, magnesium hydrogen phosphate, magnesium phosphate, ferrous phosphate, ferric phosphate, sodium dihydrogen phosphate, sodium phosphate, disodium hydrogen phosphate, lead phosphate, diammonium phosphate, calcium dihydrogen phosphate, lithium phosphate, phosphotungstic acid, ammonium phosphotungstate, sodium phosphotungstate, ammonium phosphomolybdate, sodium phosphomolybdate, sodium phosphite, sodium tripolyphosphate and sodium pyrophosphate. Among them, sodium dihydrogen phosphate, disodium hydrogen phosphate, potassium dihydrogen phosphate and dipotassium hydrogen phosphate are preferred.

The combination of inorganic fluorine compound and phosphate compound is not particularly limited, but it is preferred that the aqueous solution contains at least sodium fluorozirconate as the inorganic fluorine compound and at least sodium dihydrogen phosphate as the phosphate compound.

The concentration of the phosphate compound in the aqueous solution is preferably 0.01% by weight or more, more preferably 0.1% by weight or more, in view of improvement in the on-press development property and stain resistance, and it is preferably 20% by weight or less, more preferably 5% by weight or less, in view of solubility.

The ratio of respective compounds in the aqueous solution is not particularly limited, and the weight ratio between the inorganic fluorine compound and the phosphate compound is preferably from 1/200 to 10/1, more preferably from 1/30 to 2/1.

The temperature of the aqueous solution is preferably 20° C. or more, more preferably 40° C. or more, and it is preferably 100° C. or less, more preferably 80° C. or less.

The pH of the aqueous solution is preferably 1 or more, more preferably 2 or more, and it is preferably 11 or less, more preferably 5 or less.

A method of the sealing treatment with the aqueous solution containing an inorganic fluorine compound is not particularly limited and examples thereof include a dipping method and a spray method. One of the treatments may be used alone once or multiple times, or two or more thereof may be used in combination.

In particular, the dipping method is preferred. In the case of performing the treatment using the dipping method, the treating time is preferably one second or more, more preferably 3 seconds or more, and it is preferably 100 seconds or less, more preferably 20 seconds or less.

<2> Sealing Treatment with Water Vapor

Examples of the sealing treatment with water vapor include a method of continuously or discontinuously bringing water vapor under applied pressure or normal pressure into contact with the anodized film.

The temperature of the water vapor is preferably 80° C. or more, more preferably 95° C. or more, and it is preferably 105° C. or less.

The pressure of the water vapor is preferably in a range from (atmospheric pressure−50 mmAg) to (atmospheric pressure+300 mmAg) (from $1.008\times10^5$ to $1.043\times10^5$ Pa).

The time period for which water vapor is contacted is preferably one second or more, more preferably 3 seconds or more, and it is preferably 100 seconds or less, more preferably 20 seconds or less.

<3> Sealing Treatment with Hot Water

Examples of the sealing treatment with hot water include a method of dipping the aluminum plate having formed thereon the anodized film in hot water.

The hot water may contain an inorganic salt (for example, a phosphate) or an organic salt.

The temperature of the hot water is preferably 80° C. or more, more preferably 95° C. or more, and it is preferably 100° C. or less.

The time period for which the aluminum plate is dipped in the hot water is preferably one second or more, more preferably 3 seconds or more, and it is preferably 100 seconds or less, more preferably 20 seconds or less.

The hydrophilizing treatment includes an alkali metal silicate method described in U.S. Pat. Nos. 2,714,066, 3,181,461, 3,280,734 and 3,902,734. In the method, the support is subjected to immersion treatment or electrolytic treatment in an aqueous solution containing, for example, sodium silicate. In addition, the hydrophilizing treatment includes, for example, a method of treating with potassium fluorozirconate described in JP-B-36-22063 and a method of treating with polyvinyl phosphonic acid described in U.S. Pat. Nos. 3,276,868, 4,153,461 and 4,689,272.

In the case of using a support having a surface of insufficient hydrophilicity, for example, a polyester film, in the invention, it is desirable to coat a hydrophilic layer thereon to make the surface sufficiently hydrophilic. Examples of the hydrophilic layer preferably includes a hydrophilic layer formed by coating a coating solution containing a colloid of oxide or hydroxide of at least one element selected from beryllium, magnesium, aluminum, silicon, titanium, boron, germanium, tin, zirconium, iron, vanadium, antimony and a transition metal described in JP-A-2001-199175, a hydrophilic layer containing an organic hydrophilic matrix obtained by crosslinking or pseudo-crosslinking of an organic hydrophilic polymer described in JP-A-2002-79772, a hydrophilic layer containing an inorganic hydrophilic matrix obtained by sol-gel conversion comprising hydrolysis and condensation reaction of polyalkoxysilane and titanate, zirconate or aluminate, and a hydrophilic layer comprising an inorganic thin layer having a surface containing metal oxide. Among them, the hydrophilic layer formed by coating a coating solution containing a colloid of oxide or hydroxide of silicon is preferred.

Further, in the case of using, for example, a polyester film as the support in the invention, it is preferred to provide an antistatic layer on the hydrophilic layer side, opposite side to the hydrophilic layer or both sides. When the antistatic layer is provided between the support and the hydrophilic layer, it also contributes to improve the adhesion property of the hydrophilic layer to the support. As the antistatic layer, a polymer layer having fine particles of metal oxide or a matting agent dispersed therein described in JP-A-2002-79772 can be used.

The support preferably has a center line average roughness of 0.10 to 1.2 μm. In the range described above, good adhesion property to the image-recording layer, good printing durability and good stain resistance can be achieved.

(Protective Layer)

In the lithographic printing plate precursor according to the invention, it is preferred to provide a protective layer (overcoat layer) on the image-recording layer.

The protective layer has a function for preventing, for example, occurrence of scratch in the image-recording layer or ablation caused by exposure with a high illuminance laser beam, in addition to the function for restraining an inhibition reaction against the image formation by means of oxygen blocking.

The components constituting the protective layer will be described below.

Ordinarily, the exposure process of a lithographic printing plate precursor is performed in the air. The image-forming reaction occurred upon the exposure process in the image-recording layer may be inhibited by a low molecular weight compound, for example, oxygen or a basic substance present in the air. The protective layer prevents the low molecular weight compound, for example, oxygen or the basic substance from penetrating into the image-recording layer and as a result, the inhibition of image-forming reaction at the exposure process in the air can be avoided. Accordingly, the property required of the protective layer is to reduce permeability of the low molecular compound, for example, oxygen. Further, the protective layer preferably has good transparency to light used for the exposure, is excellent in an adhesion property to the image-recording layer, and can be easily removed during the on-press development processing step after the exposure. With respect to the protective layer having such properties, there are described, for example, in U.S. Pat. No. 3,458,311 and JP-B-55-49729.

As a material for use in the protective layer, any water-soluble polymer and water-insoluble polymer can be appropriately selected to use. Specifically, a water-soluble polymer, for example, polyvinyl alcohol, a modified polyvinyl alcohol, polyvinyl pyrrolidone, polyvinyl imidazole, polyacrylic acid, polyacrylamide, a partially saponified product of polyvinyl acetate, an ethylene-vinyl alcohol copolymer, a water-soluble cellulose derivative, gelatin, a starch derivative or gum arabic, and a polymer, for example, polyvinylidene chloride, poly(meth)acrylonitrile, polysulfone, polyvinyl chloride, polyethylene, polycarbonate, polystyrene, polyamide or cellophane are exemplified.

The polymers may be used in combination of two or more thereof, if desired.

As a relatively useful material for use in the protective layer, a water-soluble polymer compound excellent in crystallinity is exemplified. Specifically, polyvinyl alcohol, polyvinyl pyrrolidone, polyvinyl imidazole, a water-soluble acrylic resin, for example, polyacrylic acid, gelatin or gum arabic is preferably used. Above all, polyvinyl alcohol, polyvinyl pyrrolidone and polyvinyl imidazole are more preferably used from the standpoint of capability of coating with water as a solvent and easiness of removal with dampening water at the printing. Among them, polyvinyl alcohol (PVA) provides most preferable results on the fundamental properties, for example, oxygen blocking property or removability with development.

The polyvinyl alcohol for use in the protective layer may be partially substituted with ester, ether or acetal as long as it contains a substantial amount of unsubstituted vinyl alcohol units necessary for maintaining water solubility. Also, the polyvinyl alcohol may partially contain other copolymerization components. For instance, polyvinyl alcohols of various polymerization degrees having at random a various kind of hydrophilic modified cites, for example, an anion-modified cite modified with an anion, e.g., a carboxyl group or a sulfo group, a cation-modified cite modified with a cation, e.g., an amino group or an ammonium group, a silanol-modified cite or a thiol-modified cite, and polyvinyl alcohols of various polymerization degrees having at the terminal of the polymer chain a various kind of modified cites, for example, the above-described anion-modified cite, cation modified cite, silanol-modified cite or thiol-modified cite, an alkoxy-modified cite, a sulfide-modified cite, an ester modified cite of vinyl alcohol with a various kind of organic acids, an ester modified cite of the above-described anion-modified cite with an alcohol or an epoxy-modified cite are also preferably used.

Preferable examples of the polyvinyl alcohol include those having a hydrolysis degree of 71 to 100% by mole and a polymerization degree of 300 to 2,400. Specific examples of the polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, produced by Kuraray Co., Ltd.

Specific examples of the modified polyvinyl alcohol include that having an anion-modified cite, for example, KL-318, KL-118, KM-618, KM-118 or SK-5102, that having a cation-modified cite, for example, C-318, C-118 or CM-318, that having a terminal thiol-modified cite, for example, M-205 or M-115, that having a terminal sulfide-modified cite, for example, MP-103, MP-203, MP-102 or MP-202, that having an ester-modified cite with a higher fatty acid at the terminal, for example, HL-12E or HL-1203 and that having a reactive silane-modified cite, for example, R-1130, R-2105 or R-2130, all produced by Kuraray Co., Ltd.

It is also preferable that the protective layer contains an inorganic stratiform compound, that is, an inorganic compound having a stratiform structure and a tabular shape. By using the inorganic stratiform compound together, in addition that the oxygen blocking property is more increased and the film strength of the protective layer is more increased to improve the scratch resistance, a matting property is imparted to the protective layer.

The stratiform compound includes, for instance, mica, for example, natural mica represented by the following formula: $A(B,C)_{2-5}D_4O_{10}(OH,F,O)_2$, (wherein A represents any one of Li, K, Na, Ca, Mg and an organic cation, B and C each represents any one of Fe (II), Fe(III), Mn, Al, Mg and V, and D represents Si or Al) or synthetic mica, talc represented by the following formula: $3MgO.4SiO.H_2O$, teniolite, montmorillonite, saponite, hectolite and zirconium phosphate.

Of the mica compounds, examples of the natural mica include muscovite, paragonite, phlogopite, biotite and lepidolite. Examples of the synthetic mica include non-swellable mica, for example, fluorphlogopite $KMg_3(AlSi_3O_{10})F_2$ or potassium tetrasilic mica $KMg_{2.5}(Si_4O_{10})F_2$, and swellable mica, for example, Na tetrasilic mica $NaMg_{2.5}(Si_4O_{10}$, Na or Li teniolite (Na, Li)$Mg_2Li(Si_4O_{10})F_2$, or montmorillonite based Na or Li hectolite (Na, Li)$_{1/8}Mg_{2/5}Li_{1/8}(Si_4O_{10})F_2$. Synthetic smectite is also useful.

Of the mica compounds, fluorine-based swellable mica, which is a synthetic stratiform compound, is particularly useful. Specifically, the mica and an swellable clay mineral, for example, montmorillonite, saponite, hectolite or bentonite have a stratiform structure comprising a unit crystal lattice layer having thickness of approximately 10 to 15 angstroms, and metallic atom substitution in the lattices thereof is remarkably large in comparison with other clay minerals. As a result, the lattice layer results in lack of positive charge and to compensate it, a cation, for example, $Li^+$, $Na^+$, $Ca^{2+}$, $Mg^{2+}$ or an organic cation, e.g., an amine salt, a quaternary ammonium salt, a phosphonium salt or a sulfonium salt is adsorbed between the lattice layers. The stratiform compound swells upon contact with water. When share is applied under such condition, the stratiform crystal lattices are easily cleaved to form a stable sol in water. Since the bentnite and swellable synthetic mica have strongly such tendency, they are useful for the invention and particularly, the swellable synthetic mica is preferably used in the invention from the standpoint of ready availability and uniformity of the quality.

The shape of the stratiform compound is tabular and from the standpoint of control of diffusion, the thinner the thickness or the larger the plain size as long as smoothness of coated surface and transmission of actinic radiation are not damaged, the better. Therefore, an aspect ratio of the stratiform compound is ordinarily 20 or more, preferably 100 or more, particularly preferably 200 or more. The aspect ratio is a ratio of major axis to thickness of particle and can be determined, for example, from a projection drawing of particle by a microphotography. The larger the aspect ratio, the greater the effect obtained.

As for the particle diameter of the stratiform compound, an average diameter is ordinarily from 0.3 to 20 μm, preferably from 0.5 to 10 μm, particularly preferably from 1 to 5 μm. When the particle diameter is less than 0.3 μm, the inhibition of permeation of oxygen or moisture is insufficient and the effect of the stratiform compound can not be satisfactorily achieved. On the other hand, when it is larger than 20 μm, the dispersion stability of the particle in the coating solution is insufficient to cause a problem in that stable coating can not be performed. An average thickness of the particle is ordinarily 0.1 μm or less, preferably 0.05 μm or less, particularly preferably 0.01 μm or less. For example, with respect to the swellable synthetic mica that is the representative compound of the inorganic stratiform compounds, the thickness is approximately from 1 to 50 nm and the plain size is approximately from 1 to 20 μm.

When such an inorganic stratiform compound particle having a large aspect ratio is incorporated into the protective layer, strength of the coated layer increases and penetration of oxygen or moisture can be effectively inhibited and thus, the protective layer can be prevented from deterioration due to deformation, and even when the lithographic printing plate precursor is preserved for a long period of time under a high humidity condition, it is prevented from decrease in the image-forming property thereof due to the change of humidity and exhibits excellent preservation stability.

An example of common dispersing method for using the stratiform compound in the protective layer is described below.

Specifically, from 5 to 10 parts by weight of a swellable stratiform compound which is exemplified as a preferable stratiform compound is added to 100 parts by weight of water to adapt the compound to water and to be swollen, followed by dispersing using a dispersing machine. The dispersing machine used include, for example, a variety of mills conducting dispersion by directly applying mechanical power, a high-speed agitation type dispersing machine providing a large shear force and a dispersion machine providing ultrasonic energy of high intensity. Specific examples thereof include a ball mill, a sand grinder mill, a visco mill, a colloid mill, a homogenizer, a dissolver, a polytron, a homomixer, a homoblender, a keddy mill, a jet agitor, a capillary type emulsifying device, a liquid siren, an electromagnetic strain type ultrasonic generator and an emulsifying device having Polman whistle. A dispersion containing from 5 to 10% by weight of the inorganic stratiform compound thus prepared is highly viscous or gelled and exhibits extremely good preservation stability.

In the formation of a coating solution for protective layer using the dispersion, it is preferred that the dispersion is diluted with water, sufficiently stirred and then mixed with a solution of the polymer, for example, polyvinyl alcohol.

The content of the inorganic stratiform compound in the protective layer is ordinarily from 5/1 to 1/100 in terms of a weight ratio of the inorganic stratiform compound to the amount of a polymer used in the protective layer. When a plural kind of the inorganic stratiform compounds is used together, it is preferred that the total amount of the inorganic stratiform compounds is in the range of weight ratio described above.

As other additive for the protective layer, glycerin, dipropylene glycol, propionamide, cyclohexane diol, sorbitol or the like can be added in an amount corresponding to several % by weight of the water-soluble or water-insoluble polymer to impart flexibility. Also, a known additive, for example, a water-soluble (meth)acrylic polymer or a water-soluble plasticizer can be added in order to improve the physical property of the protective layer.

Further, the protective layer according to the invention is formed using a coating solution for protective layer as described below and to the coating solution for protective layer may be added known additives for increasing an adhesion property to the image-recording layer or for improving time-lapse stability of the coating solution.

Specifically, an anionic surfactant, a nonionic surfactant, a cationic surfactant or a fluorine-based surfactant can be added to the coating solution of protective layer in order to improve the coating property. More specifically, an anionic surfactant, for example, sodium alkyl sulfate or sodium alkyl sulfonate; an amphoteric surfactant, for example, alkylamino carboxylic acid salt or alkylamino dicarboxylic acid salt; or a nonionic surfactant, for example, polyoxyethylene alkyl phenyl ether can be added. The amount of the surfactant added is from 0.1 to 100% by weight of the water-soluble or water-insoluble polymer.

Further, for the purpose of improving the adhesion property to the image-recording layer, for example, it is described in JP-A-49-70702 and BP-A-1,303,578 that the sufficient adhesion property can be obtained by mixing from 20 to 60% by weight of solid particles of an acrylic polymer, a water-insoluble vinyl pyrrolidone-vinyl acetate copolymer, polyfluoroethylene or the like in a hydrophilic polymer mainly comprising polyvinyl alcohol and coating the mixture on the image-recording layer. In the invention, any of such known techniques can be used.

Moreover, the oil-sensitizing agent, for example, the nitrogen-containing low molecular weight compound, ammonium group-containing polymer as described above may be added to the protective layer. By the addition of such a compound, the effect of increasing the ink-receptive property is further achieved. In the case of adding the oil-sensitizing agent in the protective layer, the amount thereof added is preferably in a range of 0.5 to 30% by weight.

Into the protective layer according to the invention can be further incorporated a polymerization inhibitor. The polymerization inhibitor is effective to prevent degradation of the ink-receptive property during preservation after the production of lithographic printing plate precursor. The polymerization inhibitor is preferably water-soluble, because water is ordinarily used as a coating solvent for the protective layer. The solubility of polymerization inhibitor in water at 20° C. is preferably 0.25% by weight or more, and more preferably 1% by weight or more.

Specific examples of the polymerization inhibitor for use in the invention include a quinone compound, for example, a substituted or unsubstituted p-benzoquinone, a phenolic hydroxy compound, for example, a substituted or unsubstituted phenol or hydroquinone, an amino compound, for example, N,N'-tetraethyl-p-phenylenediamine, a sulfur compound, for example, a tetraalkylthiurum disulfide, an N-oxyl compound, for example, a substituted or unsubstituted 2,2,6,6-tetramethylpiperidine 1-oxyl free radical, an N-oxide compound, for example, a substituted or unsubstituted pyridine-N-oxide, a thiocyanate compound for example, ammonium thiocyanate and a nitrite, for example, sodium nitrite.

It is preferred that the polymerization inhibitor having a functional group capable of interacting with the inorganic stratiform compound contained in the protective layer in the molecule thereof. As a result, since the polymerization inhibitor absorbs onto the inorganic stratiform compound to make selective polymerization inhibition in the neighborhood of the inorganic stratiform compound possible, removal of the inorganic stratiform compound at the on-press development becomes easy, resulting in improvement in the ink-receptive property at the start of printing.

The functional group capable of interacting with the inorganic stratiform compound preferably has a positive charge. Among them, an onium group is preferable, an ammonium group, a sulfonium group or a phosphonium group is more preferable, and an ammonium group or a sulfonium group is still more preferable.

Also, a polyalkylene oxide group, for example, a polyethylene oxide group or a polypropylene oxide group is preferably used as the functional group capable of interacting with the inorganic stratiform compound.

The polymerization inhibitor having a functional group capable of interacting with the inorganic stratiform compound include a quinone compound, a phenolic hydroxy compound, an N-oxyl compound and an N-oxide compound. Specific examples thereof are set forth below.

(Q-1)

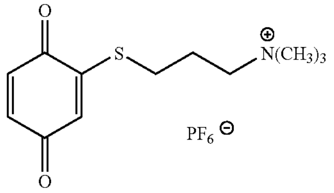

(Q-2)

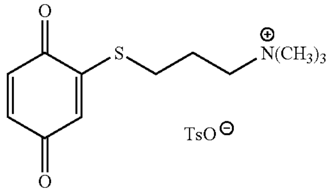

(Q-3)

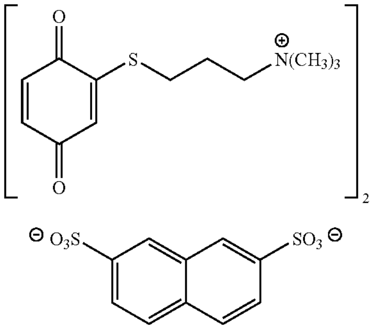

(Q-4)

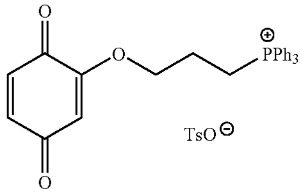

(Q-5)

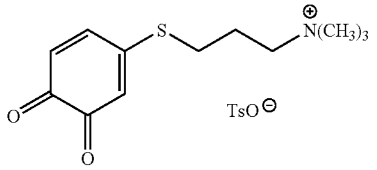

(Q-6)

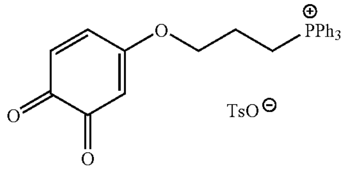

(Q-7)

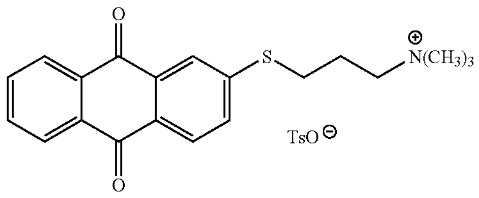

-continued (Q-8)

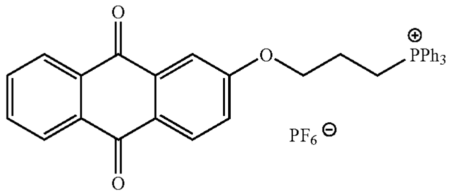

(Q-9)

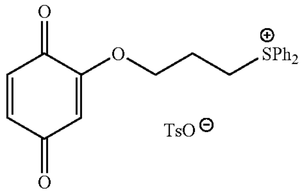

(Q-10)

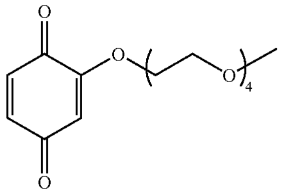

(H-1)

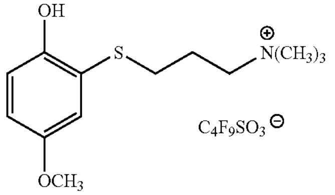

(H-2)

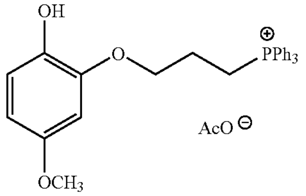

(H-3)

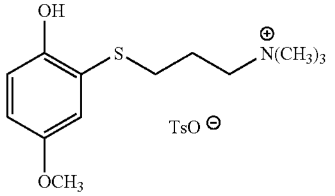

(H-4)

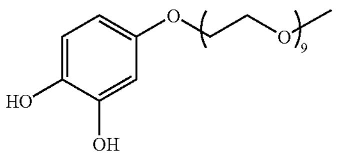

(N-1)

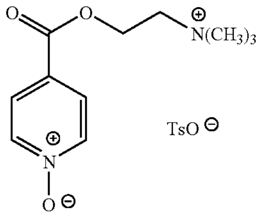

-continued (N-2)

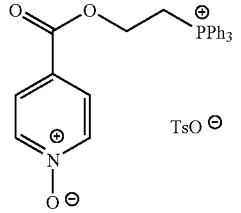

(N-3)

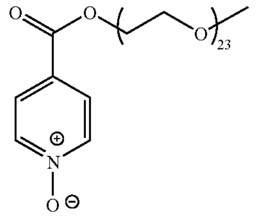

(R-1)

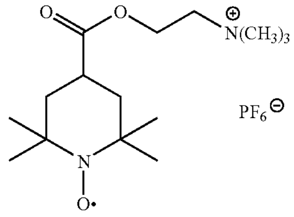

(R-2)

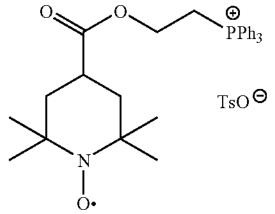

(R-3)

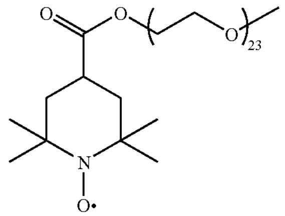

Furthermore, other functions can also be provided to the protective layer. For instance, by adding a coloring agent (for example, a water-soluble dye), which is excellent in permeability for infrared ray used for the exposure and capable of efficiently absorbing light at other wavelengths, a safe light adaptability can be improved without causing decrease in the sensitivity. Further, for the purpose of controlling a slipping property of the surface of the lithographic printing plate precursor, a spherical fine inorganic particle as described above with respect to the image-recording layer may be incorporated into the protective layer. The fine inorganic particle preferably includes, for example, silica, alumina, magnesium oxide, titanium oxide, magnesium carbonate, calcium alginate and a mixture thereof. The fine inorganic particle preferably has an average particle size from 5 nm to 10 μm, more preferably from 50 nm to 3 μm. The fine inorganic particle described above is easily available as a commercial product, for example, colloidal silica dispersion.

The content of the fine inorganic particle is preferably 40% by weight or less, more preferably 20% by weight or less, based on the total solid content of the protective layer.

The formation of protective layer is performed by coating a coating solution for protective layer prepared by dispersing or dissolving the components of protective layer in a solvent on the image-recording layer, followed by drying.

The coating solvent may be appropriately selected in view of the polymer used, and when a water-soluble polymer is used, distilled water or purified water is preferably used as the solvent.

A coating method of the protective layer is not particularly limited, and known methods, for example, methods described in U.S. Pat. No. 3,458,311 and JP-B-55-49729 can be utilized.

Specifically, in the formation of protective layer, for example, a blade coating method, an air knife coating method, a gravure coating method, a roll coating method, a spray coating method, a dip coating method or a bar coating method is used.

The coating amount of the protective layer is preferably in a range from 0.01 to 10 g/$m^2$, more preferably in a range from 0.02 to 3 g/$m^2$, most preferably in a range from 0.02 to 1 g/$m^2$, in terms of the coating amount after drying.

(Backcoat Layer)

After applying the surface treatment to the support or forming the undercoat layer on the support, a backcoat layer can be provided on the back surface of the support, if desired.

The backcoat layer preferably includes, for example, a coating layer comprising an organic polymer compound described in JP-A-5-45885 and a coating layer comprising a metal oxide obtained by hydrolysis and polycondensation of an organic metal compound or an inorganic metal compound described in JP-A-6-34174. Among them, use of an alkoxy compound of silicon, for example, $Si(OCH_3)_4$, $Si(OC_2H_5)_4$, $Si(OC_3H_7)_4$ or $Si(OC_4H_9)_4$ is preferred since the starting materials are inexpensive and easily available.

[Plate Making Method]

A on-press development method is preferably used in case of plate making of the lithographic printing plate precursor according to the invention. The on-press development method will be described below.

(On-Press Development Method)

The on-press development method includes a step in which the lithographic printing plate precursor is imagewise exposed and a printing step in which oily ink and an aqueous component are supplied to the exposed lithographic printing plate precursor without undergoing any development processing to perform printing, and it is characterized in that the unexposed area of the lithographic printing plate precursor is removed in the course of the printing step. The imagewise exposure may be performed on a printing machine after the lithographic printing plate precursor is mounted on the printing machine or may be separately performed using a platesetter or the like. In the latter case, the exposed lithographic printing plate precursor is mounted as it is on a printing machine without undergoing a development processing step. Then, the printing operation is initiated using the printing machine with supplying oily ink and an aqueous component and at an early stage of the printing the on-press development is performed. Specifically, the image-recording layer in the unexposed area is removed and the hydrophilic surface of support is revealed therewith to form the non-image area. As the oily ink and aqueous component, printing ink and dampening water for conventional lithographic printing can be employed, respectively.

The on-press development method is described in more detail below.

As the light source used for the image exposure in the invention, a laser is preferable. The laser for use in the invention is not particularly restricted and includes, for example, a solid laser or semiconductor laser emitting an infrared ray having a wavelength of 760 to 1,200 nm.

With respect to the infrared ray laser, the output is preferably 100 mW or more, the exposure time per pixel is preferably within 20 microseconds, and the irradiation energy is preferably from 10 to 300 mJ/$cm^2$. With respect to the laser exposure, in order to shorten the exposure time, it is preferred to use a multibeam laser device.

The exposed lithographic printing plate precursor is mounted on a plate cylinder of a printing machine. In case of using a printing machine equipped with a laser exposure apparatus, the lithographic printing plate precursor is mounted on a plate cylinder of the printing machine and then subjected to the imagewise exposure.

After the imagewise exposure of the lithographic printing plate precursor by a laser, when dampening water and printing ink are supplied to perform printing without undergoing a development processing step, for example, a wet development processing step, in the exposed area of the image-recording layer, the image-recording layer cured by the exposure forms the printing ink receptive area having the oleophilic surface. On the other hand, in the unexposed area, the uncured image-recording layer is removed by dissolution or dispersion with the dampening water and/or printing ink supplied to reveal the hydrophilic surface in the area. As a result, the dampening water adheres on the revealed hydrophilic surface and the printing ink adheres to the exposed area of the image-recording layer, whereby printing is initiated.

While either the dampening water or printing ink may be supplied at first on the surface of lithographic printing plate precursor, it is preferred to supply the printing ink at first in view of preventing the dampening water from contamination with the component of the image-recording layer removed.

Thus, the lithographic printing plate precursor is subjected to the on-press development on an offset printing machine and used as it is for printing a large number of sheets.

EXAMPLES

The present invention will be described in more detail with reference to the following examples, but the invention should not be construed as being limited thereto.

Examples 1 to 28 and Comparative Examples 1 to 3

1. Preparation of Lithographic Printing Plate Precursors (1) to (24), (29) and (30)

(1) Preparation of Support

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 g/$cm^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 g/$m^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm$^2$ in terms of the peak value of the electric current, and 5% of the electric current flowing from the electric source was divided to the auxiliary anode. The quantity of electricity in the nitric acid electrolysis was 175 C/dm$^2$ in terms of the quantity of electricity when the aluminum plate functioned as an anode. The plate was then washed with water by spraying.

The plate was further subjected to an electrochemical roughening treatment in the same mariner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm$^2$ in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm$^2$ to form a direct current anodized film of 2.5 g/m$^2$, washed with water and dried.

Thereafter, in order to ensure the hydrophilicity of the non-image area, the plate was subjected to silicate treatment using a 2.5% by weight aqueous sodium silicate No. 3 solution at 70° C. for 12 seconds. The adhesion amount of Si was 10 mg/m$^2$. Subsequently, the plate was washed with water to obtain Support (1). The center line average roughness (Ra) of Support (1) was measured using a stylus having a diameter of 2 μm and found to be 0.51 μm.

(2) Formation of Undercoat Layer (1)

Coating solution (1) for undercoat layer shown below was coated on Support (1) so as to have a dry coating amount of 28 mg/m$^2$ to form Undercoat layer (1).

| <Coating solution (1) for undercoat layer> | |
|---|---|
| Compound (1) for undercoat layer having structure shown below (Mw: 10 × 10$^4$) | 0.18 g |
| Hydroxyethyliminodiacetic acid | 0.10 g |
| Methanol | 55.24 g |
| Water | 6.15 g |

Compound (1) for undercoat layer

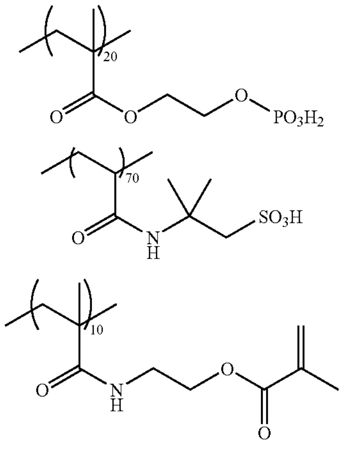

(3) Formation of Image-Recording Layer (1)

Coating solution (1) for image-recording layer having the composition shown below was coated on the undercoat layer described above by a bar and dried in an oven at 100° C. for 60 seconds to form Image-recording layer (1) having a dry coating amount of 1.0 g/m$^2$.

Coating solution (1) for image-recording layer was prepared by mixing Photosensitive solution (1) shown below with Microgel solution (1) shown below just before the coating, followed by stirring.

| <Photosensitive solution (1)> | |
|---|---|
| Binder polymer shown in Table 1 | 0.240 g |
| Infrared absorbing agent (1) having structure shown below | 0.030 g |
| Radical polymerization initiator shown in Table 1 | 0.162 g |
| Polymerizable compound (Tris(acryloyloxyethyl) isocyanurate (NK Ester A-9300, produced by Shin-Nakamura Chemical Co., Ltd.)) | 0.192 g |
| Low molecular weight epoxy compound shown in Table 1 | Amount shown in Table 1 |
| Hydrophilic low molecular weight compound (Tris(2-hydroxyethyl) isocyanurate) | 0.028 g |
| Hydrophilic low molecular weight compound (1) having structure shown below | 0.050 g |
| Oil-sensitizing agent (Phosphonium compound (1) having structure shown below | 0.055 g |
| Oil-sensitizing agent (Benzyl dimethyl octyl ammonium $PF_6$ salt | 0.018 g |
| Fluorine-based surfactant (1) having structure shown below (Mw: 1.3 × 10$^4$) | 0.008 g |
| Methyl ethyl ketone | 1.091 g |
| 1-Methoxy-2-propanol | 8.609 g |

| <Microgel solution (1)> | |
|---|---|
| Microgel (1) shown below | 2.640 g |
| Distilled water | 2.425 g |

The structures of Infrared absorbing agent (1), Phosphonium compound (1), Hydrophilic low molecular weight compound (1) and Fluorine-based surfactant (1) are shown below.

Infrared absorbing agent (1)

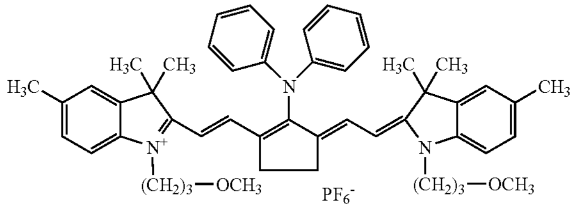

Fluorine-based surfactant (1)

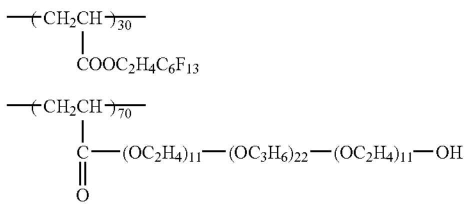

Phosphonium compound (1)

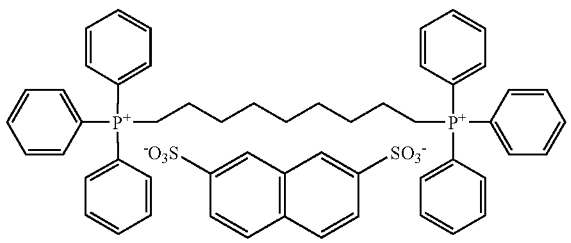

-continued

Hydrophilic low molecular weight compound (1)

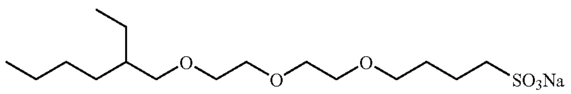

Microgel (1) described above was prepared in the following manner.

<Preparation of Microgel (1)>

An oil phase component was prepared by dissolving 10 g of adduct of trimethylol propane and xylene diisocyanate (Takenate D-110N, produced by Mitsui Takeda Chemical Co., Ltd.), 3.15 g of pentaerythritol triacrylate (SR444, produced by Nippon Kayaku Co., Ltd.) [Component (C)] and 0.1 g of Pionine A-41C (produced by Takemoto Oil and Fat Co., Ltd.) in 17 g of ethyl acetate. As an aqueous phase component, 40 g of a 4% by weight aqueous solution of PVA-205 was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid concentration of 15% by weight to prepare Microgel (1). The average particle size of Microgel (1) was measured by a light scattering method and found to be 0.2 μm.

(4) Formation of Protective Layer (1)

Coating solution (1) for protective layer having the composition shown below was coated on the image-recording layer described above by a bar and dried in an oven at 120° C. for 60 seconds to form Protective layer (1) having a dry coating amount of 0.17 g/$m^2$, thereby preparing Lithographic printing plate precursors (1) to (24), (29) and (30), respectively.

| <Coating solution (1) for protective layer> | |
|---|---|
| Dispersion of inorganic stratiform compound (1) shown below | 2.50 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.75 g |
| Aqueous 6% by weight solution of polyvinyl alcohol (PVA-405, saponification degree: 81.5% by mole, polymerization degree: 500, produced by Kuraray Co., Ltd.) | 0.30 g |
| Polymerization inhibitor (Compound (Q-1) described hereinbefore) | 0.015 g |
| Aqueous 1% by weight solution of surfactant (Emalex 710, produced by Nihon Emulsion Co., Ltd. | 1.20 g |
| Ion-exchanged water | 6.0 g |

<Preparation of Dispersion of Inorganic Stratiform Compound (1)>

To 193.6 g of ion-exchanged water was added 6.4 g of synthetic mica (Somasif ME-100, produced by CO-OP Chemical Co., Ltd.) and the mixture was dispersed using a homogenizer until an average particle size (according to a laser scattering method) became 3 μm to prepare Dispersion of inorganic stratiform compound (1). The aspect ratio of the inorganic particle thus-dispersed was 100 or more.

2. Preparation of Lithographic Printing Plate Precursors (25) to (28) and (31)

(1) Formation of Image-Recording Layer (2)

Lithographic printing plate precursors (25) to (28) and (31) were prepared in the same manner as in the preparation of Lithographic printing plate precursor (1) except for changing Coating solution (1) for image-recording layer to Coating solution (2) for image-recording layer shown below, respectively.

| <Coating solution (2) for image-recording layer> | |
|---|---|
| Binder polymer shown in Table 1 | 0.50 g |
| Infrared absorbing agent (2) having structure shown below | 0.05 g |
| Radical polymerization initiator shown in Table 1 | 0.20 g |
| Polymerizable compound (Aronics M-215, produced by Toagosei Co., Ltd.) | 1.00 g |
| Low molecular weight epoxy compound shown in Table 1 | Amount shown in Table 1 |
| Hydrophilic low molecular weight compound (Sodium n-heptylsulfonate) | 0.05 g |
| Oil-sensitizing agent (Benzyl dimethyl octyl ammonium $PF_6$ salt) | 0.018 g |
| Oil-sensitizing agent (Ammonium group-containing polymer: Compound (23) described hereinbefore (reduced specific viscosity: 44 cSt/g/ml) | 0.035 g |
| Fluorine-based surfactant (1) having structure shown above (Mw: 1.3 × $10^4$) | 0.10 g |
| Methyl ethyl ketone | 18.0 g |

Infrared absorbing agent (2)

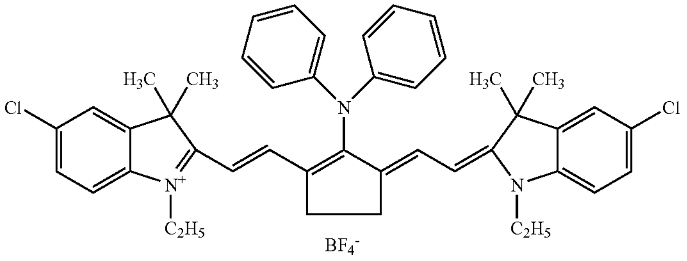

On-press development property after preservation and printing durability of Lithographic printing plate precursors (1) to (31) thus-obtained were evaluated in the following manner. The results obtained are shown in Table 2.

(1) On-Press Development Property after Preservation

The lithographic printing plate precursor and interleaf and cardboard (backing cardboard) using for lamination were allowed to stand under environment of 60% RH for one hour. Under the same environment, on the lithographic printing plate precursor was placed the interleaf to prepare a stack composed of 30 sheets of the interleaves and lithographic printing plate precursors, and the stack was sandwiched with the backing cardboards, packed by an aluminum kraft paper and fixed by a tape to prepare a package. The package was put in a constant temperature and humidity room of 60° C. and 50% RH for 48 hours to be subjected to an enforced time-lapse test. The package brought out from the room after 48 hours was cooled to room temperature and opened, and the lithographic printing plate precursors were used for the evaluation.

Each of the lithographic printing plate precursors which had not been subjected to the enforced time-lapse test and the lithographic printing plate precursors which had been subjected to the enforced time-lapse test was exposed by Luxel Platesetter T-6000III equipped with an infrared semiconductor laser, produced by Fuji Film Co., Ltd. under the conditions of a rotational number of external drum of 1,000 rpm, laser output of 70% and resolution of 2,400 dpi. The exposed image contained a solid image and a 50% halftone dot chart of a 20 μm-dot FM screen.

The exposed lithographic printing plate precursor was mounted without undergoing development processing on a plate cylinder of a printing machine (Lithrone 26, produced by Komori Corp.). Using dampening water (Ecolity-2 (produced by Fuji Film Co., Ltd.)/tap water=2/98 (volume ratio)) and Values-G (N) Black Ink (produced by Dainippon Ink & Chemicals, Inc.), the dampening water and ink were supplied according to the standard automatic printing start method of Lithrone 26 to perform printing on 100 sheets of Tokubishi art paper (76.5 kg) at a printing speed of 10,000 sheets per hour.

A number of the printing papers required for reaching a state where the ink was not transferred to the printing paper in the non-image region of the image-recording layer was measured to evaluate the on-press development property. The results obtained are shown in Table 2.

(2) Printing Durability

After performing the evaluation for the on-press development property with respect to the lithographic printing plate precursor which had not been subjected to the enforced time-lapse test, the printing was continued. As the increase in a number of printing papers, the image-recording layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the $100^{th}$ paper of the printing was determined to evaluate the printing durability. The results obtained are shown in Table 2.

TABLE 1

<Lithographic printing plate precursors (1) to (31)>

| Lithographic Printing Plate Precursor | Image-Recording Layer | (B) Polymerization Initiator | (E) Binder Polymer | (D) Low Molecular Weight Epoxy Compound: Kind of Compound | (D) Low Molecular Weight Epoxy Compound: Amount Added (g) |
|---|---|---|---|---|---|
| (1) | (1) | Compound (I-28) | Binder Polymer (1) shown below | Tripropylene glycol diglycidyl ether | 0.036 |
| (2) | | | | Bisphenol A diglycidyl ether | |
| (3) | | | | Compound (D-1) | |
| (4) | | | | Compound (D-3) | 0.005 |
| (5) | | | | | 0.010 |
| (6) | | | | | 0.018 |
| (7) | | | | | 0.036 |
| (8) | | | | | 0.060 |
| (9) | | | | | 0.100 |
| (10) | | | | | 0.180 |
| (11) | | | | | 0.250 |
| (12) | | | | Compound (D-6) | 0.036 |
| (13) | | | | Compound (D-7) | |
| (14) | | | | Denacol EX521*1) | |
| (15) | | | | Denacol EX614B*2) | |
| (16) | | | | jER1001*3) | |
| (17) | | Compound (I-19) | | Compound (D-3) | |
| (18) | | Compound (S-5) | | | |
| (19) | | Compound (S-19) | | | |
| (20) | | Compound (N-13) | | | |
| (21) | | Polymerization Initiator (1) shown below | | | |
| (22) | | (Compound I-28) | Binder Polymer (2) shown below | | |
| (23) | | | Binder Polymer (3) shown below | | |
| (24) | | | Binder Polymer (4) shown below | | |
| (25) | (2) | Compound (I-28) | Binder polymer (1) shown below | Tripropylene glycol diglycidyl ether | 0.072 |
| (26) | | | | Compound (D-3) | |
| (27) | | | | Compound (D-6) | |
| (28) | | | | Denacol EX521*1) | |

TABLE 1-continued

<Lithographic printing plate precursors (1) to (31)>

| Lithographic Printing Plate Precursor | Image-Recording Layer | (B) Polymerization Initiator | (E) Binder Polymer | (D) Low Molecular Weight Epoxy Compound Kind of Compound | Amount Added (g) |
|---|---|---|---|---|---|
| (29) | (1) | Compound (I-28) | Binder Polymer (1) | none | — |
| (30) | (1) | | shown below | jER1002*4) | 0.036 |
| (31) | (2) | | | none | — |

*1) Denacol EX521 (polyglycerol polyglycidyl ether, Mw: about 730, produced by Nagase ChemteX Corp.)
*2) Denacol EX614B (sorbitol polyglycidyl ether, Mw: about 410, produced by Nagase ChemteX Corp.)
*3) jER1001 (bisphenol type epoxy resin, Mw: 900, produced by Japan Epoxy Resins Co., Ltd.)
*4) jER1002 (bisphenol type epoxy resin, Mw: 1,200, produced by Japan Epoxy Resins Co., Ltd.)

Polymerization initiator (1)

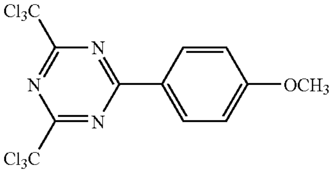

Binder Polymer (1)

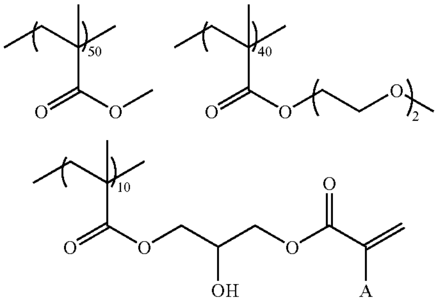

(Mw: 70,000, Acid value: 0 meq/g)

Binder Polymer (2)

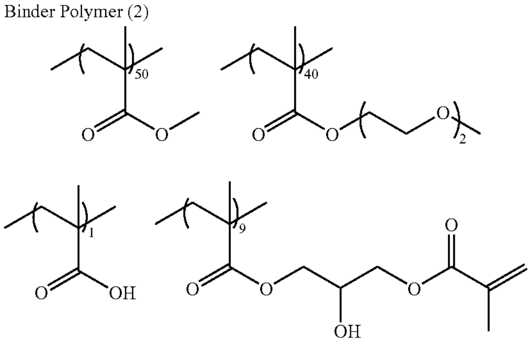

(Mw: 65,000, Acid value: 0.07 meq/g)

Binder Polymer (3)

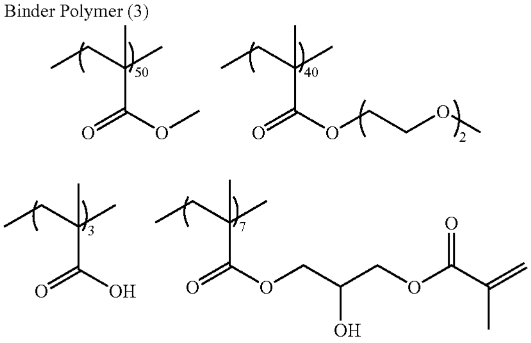

(Mw: 100,000, Acid value: 0.21 meq/g)

TABLE 1-continued

<Lithographic printing plate precursors (1) to (31)>

| Lithographic Printing Plate Precursor | Image-Recording Layer | (B) Polymerization Initiator | (E) Binder Polymer | (D) Low Molecular Weight Epoxy Compound | |
|---|---|---|---|---|---|
| | | | | Kind of Compound | Amount Added (g) |

Binder Polymer (4)

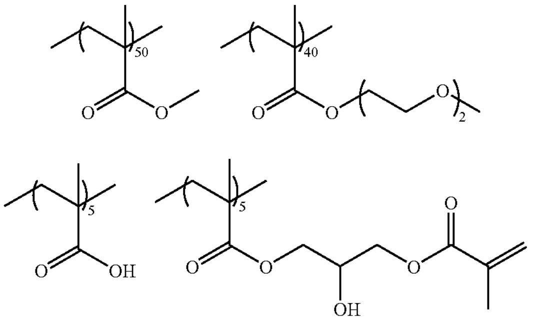

(Mw: 50,000, Acid value: 0.35 meq/g)

TABLE 2

<Examples 1 to 28 and Comparative Examples 1 to 3: Results of Printing Evaluation>

| | Lithographic Printing Plate Precursor | On-Press Development Property (sheets) Before Enforced Time-Lapse Test | On-Press Development Property (sheets) After Enforced Time-Lapse Test | Printing Durability ($\times 10^5$ sheets) |
|---|---|---|---|---|
| Example 1 | (1) | 8 | 15 | 7.0 |
| Example 2 | (2) | 10 | 15 | 7.0 |
| Example 3 | (3) | 10 | 12 | 7.0 |
| Example 4 | (4) | 10 | 18 | 7.0 |
| Example 5 | (5) | 10 | 15 | 7.0 |
| Example 6 | (6) | 10 | 12 | 7.0 |
| Example 7 | (7) | 10 | 10 | 7.0 |
| Example 8 | (8) | 10 | 10 | 7.0 |
| Example 9 | (9) | 12 | 10 | 6.5 |
| Example 10 | (10) | 15 | 8 | 6.0 |
| Example 11 | (11) | 18 | 8 | 5.0 |
| Example 12 | (12) | 10 | 10 | 7.0 |
| Example 13 | (13) | 10 | 10 | 7.0 |
| Example 14 | (14) | 8 | 15 | 7.0 |
| Example 15 | (15) | 8 | 15 | 7.0 |
| Example 16 | (16) | 10 | 15 | 7.0 |
| Example 17 | (17) | 10 | 10 | 7.0 |
| Example 18 | (18) | 8 | 12 | 7.0 |
| Example 19 | (19) | 8 | 12 | 7.0 |
| Example 20 | (20) | 10 | 18 | 7.0 |
| Example 21 | (21) | 10 | 18 | 7.0 |
| Example 22 | (22) | 10 | 15 | 7.0 |
| Example 23 | (23) | 12 | 18 | 7.0 |
| Example 24 | (24) | 15 | 20 | 7.0 |
| Example 25 | (25) | 12 | 18 | 5.0 |
| Example 26 | (26) | 15 | 15 | 5.0 |
| Example 27 | (27) | 15 | 15 | 5.0 |
| Example 28 | (28) | 12 | 18 | 5.0 |
| Comparative Example 1 | (29) | 10 | 50 | 7.0 |
| Comparative Example 2 | (30) | 15 | 80 | 7.5 |
| Comparative Example 3 | (31) | 15 | 100 | 5.0 |

As is apparent from the results shown in Table 2, the lithographic printing plate precursor which has good on-press development property even when preserved after the preparation thereof and exhibits good printing durability and the plate making method using the lithographic printing plate precursor can be provided according to the invention.

What is claimed is:

1. A lithographic printing plate precursor comprising:

a support; and an image-recording layer comprising (A) an infrared absorbing agent, (B) a radical polymerization initiator, (C) a polymerizable compound and (D) an epoxy compound having a molecular weight of 1,000 or less, and wherein the epoxy compound having a molecular weight of 1,000 or less is represented by the following formula (2):

(2)

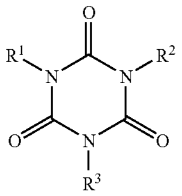

wherein at least one of $R^1$, $R^2$ and $R^3$ represents a group containing an epoxy group, and the remainder of $R^1$, $R^2$ and $R^3$ which does not contain an epoxy group represents a hydrogen atom, an alkyl group or alkenyl group having from 1 to 10 carbon atoms which may have a substituent, and wherein the radical polymerization initiator is a sulfonium salt or an iodonium salt.

2. The lithographic printing plate precursor as claimed in claim 1, wherein the image-recording layer further comprises (E) a binder polymer having an acid value of 0.3 meq/g or less.

3. The lithographic printing plate precursor as claimed in claim 1, wherein the image-recording layer further comprises a microcapsule or a microgel.

4. The lithographic printing plate precursor as claimed in claim 1, wherein an amount of the epoxy compound having a molecular weight of 1,000 or less is from 0.4 to 20% by weight based on a total solid content of the image-recording layer.

5. A plate making method of a lithographic printing plate precursor comprising:

exposing imagewise the lithographic printing plate precursor as claimed in claim 1; and removing an unexposed area of the image-recording layer of the lithographic printing plate precursor by supplying printing ink and dampening water to the exposed lithographic printing plate precursor on a printing machine to initiate printing without subjecting the exposed lithographic printing plate precursor to development processing.

* * * * *